United States Patent
Song

(10) Patent No.: US 12,106,819 B2
(45) Date of Patent: Oct. 1, 2024

(54) PROCESSING-IN-MEMORY (PIM) DEVICE

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 301 days.

(21) Appl. No.: 17/380,996

(22) Filed: Jul. 20, 2021

(65) Prior Publication Data

US 2021/0350837 A1     Nov. 11, 2021

Related U.S. Application Data

(63) Continuation-in-part of application No. 17/090,462, filed on Nov. 5, 2020, now Pat. No. 11,537,323.

(60) Provisional application No. 62/958,223, filed on Jan. 7, 2020.

(30) Foreign Application Priority Data

Jan. 17, 2020    (KR) ........................ 10-2020-0006902

(51) Int. Cl.
    *G11C 7/10*          (2006.01)
    *G06F 7/544*       (2006.01)
    *G11C 7/22*          (2006.01)

(52) U.S. Cl.
    CPC .......... *G11C 7/1039* (2013.01); *G06F 7/5443* (2013.01); *G11C 7/1063* (2013.01); *G11C 7/109* (2013.01); *G11C 7/22* (2013.01)

(58) Field of Classification Search
    CPC ..... G11C 7/1039; G11C 7/1063; G11C 7/109; G11C 7/22; G06F 3/0656; G06F 3/613; G06F 3/668
    See application file for complete search history.

(56) References Cited

U.S. PATENT DOCUMENTS

| | | | |
|---|---|---|---|
| 10,042,639 B2 | 8/2018 | Gopal et al. | |
| 2019/0096453 A1* | 3/2019 | Shin ..................... | G11C 7/1006 |
| 2019/0189221 A1* | 6/2019 | Kim ...................... | G11C 16/08 |
| 2020/0193277 A1 | 6/2020 | Kwon | |
| 2020/0294575 A1 | 9/2020 | O et al. | |
| 2021/0117500 A1* | 4/2021 | Qin ..................... | G11C 13/0028 |

FOREIGN PATENT DOCUMENTS

KR       101842937 B1      5/2018

\* cited by examiner

*Primary Examiner* — Kalpit Parikh
(74) *Attorney, Agent, or Firm* — WILLIAM PARK & ASSOCIATES LTD.

(57) ABSTRACT

A processing-in-memory (PIM) device including a data storage region, a global buffer and an arithmetic circuit. The data storage region configured to store vector data and weight data. The global buffer configured to store vector data read from the data storage region. The arithmetic circuit configured to generate a calculation result by performing a calculation on vector data read from the global buffer and weight data read from the data storage region.

27 Claims, 44 Drawing Sheets

PROCESSING-IN-MEMORY (PIM) DEVICE

CROSS-REFERENCE TO RELATED APPLICATIONS

This is a continuation-in-part of U.S. patent application Ser. No. 17/090,462 filed Nov. 5, 2020, which claims benefit of Provisional Application No. 62/958,223 filed Jan. 7, 2020 and Korean Patent Application No. 10-2020-0006902 filed Jan. 17, 2020, which are incorporated herein by reference in their entirety.

BACKGROUND

1. Technical Field

Various embodiments of the present disclosure relate to processing-in-memory (PIM) devices and, more particularly, to PIM devices performing a deterministic arithmetic operation.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. One cause of this widespread interest may be due to the improved performance of processors performing arithmetic operations. To improve the performance of artificial intelligence, it may be necessary to increase the number of layers constituting a neural network of the artificial intelligence to educate the artificial intelligence. This trend has continued in recent years, which has led to an exponential increase in the amount of computations required for hardware actually performing the computations. Moreover, if artificial intelligence employs a general hardware system including a memory and a processor which are separated from each other, the performance of the artificial intelligence may be degraded due to a limitation of the amount of data communication between the memory and the processor. In order to solve this problem, a PIM device in which a processor and memory are integrated in one semiconductor chip has been used as a neural network computing device. Because the PIM device directly performs arithmetic operations in the PIM device, a data processing speed in the neural network may be improved.

SUMMARY

In an embodiment, a processing-in-memory (PIM) device may include a data storage region, a global buffer, and an arithmetic circuit. The data storage region may be configured to store vector data and weight data. The global buffer may be configured to store vector data read from the data storage region. The arithmetic circuit may be configured to generate a calculation result by performing a calculation on vector data read from the global buffer and weight data read from the data storage region.

In an embodiment, a method for operating a processing-in-memory (PIM) device may include receiving a vector write command from an external device with the PIM device. The method may include reading vector data stored in a data storage region of the PIM device and writing the read vector data to a global buffer of the PIM device, based on the vector write command received by the PIM device. The method may include generating, with the PIM device, a calculation result by performing an arithmetic operation on vector data read from the global buffer and weight data read from the data storage region.

In an embodiment, a processing-in-memory (PIM) device may include a plurality of memory banks, a global buffer, a plurality of multiplication-accumulation (MAC) operators, and a control circuit. The plurality of memory banks may be configured to output vector data and weight data based on a memory read access control signal. The global buffer may be coupled to the plurality of memory banks, and may be configured to store the vector data output from the plurality of memory banks, based on a global buffer write signal. The plurality of multiplication-accumulation (MAC) operators may be coupled one-to-one to the plurality of memory banks, may be coupled to the global buffer, and may be configured to each generate a calculation result by performing an arithmetic operation on vector data received from the global buffer and weight data received from each of the plurality of memory banks. The control circuit may be configured to generate the memory read access control signal and the global buffer write signal based on a vector write command.

BRIEF DESCRIPTION OF THE DRAWINGS

Certain features of the disclosed technology are illustrated by various embodiments with reference to the attached drawings.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Various embodiments are directed to processing-in-memory (PIM) devices which are capable of performing a deterministic arithmetic operation at a high speed.

Figure 1:
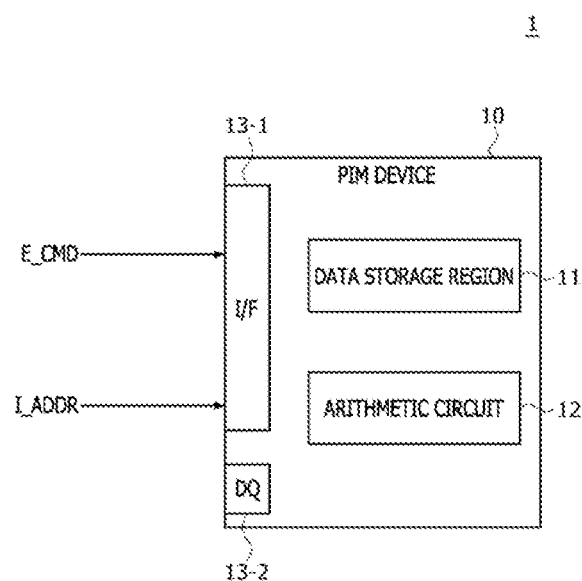
FIG. 1 is a block diagram illustrating a PIM device according to an embodiment of the present disclosure.

FIG. 1 is a block diagram illustrating a PIM device according to an embodiment of the present disclosure. As illustrated in FIG. 1, the PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2. In an embodiment, the arithmetic circuit 12 may perform additional operations, for example a bias addition operation and an active function operation, for a neural network calculation, for example, an arithmetic operation in a deep learning process. In another embodiment, the PIM device 10 may include a bias addition circuit and active function circuit separated from the arithmetic circuit 12.

The interface 13-1 of the PIM device 10 may receive an external command E_CMD and an input address I_ADDR from an external device. The external device may denote a host or a PIM controller coupled to the PIM device 10. Hereinafter, it may be assumed that the external command E_CMD transmitted to the PIM device 10 is a command requesting the MAC arithmetic operation. That is, the PIM device 10 may perform a MAC arithmetic operation in response to the external command E_CMD. The data I/O pad 13-2 of the PIM device 10 may function as a data communication terminal between a device external to the PIM device 10, for example the PIM controller or a host located outside the PIM system 1. Accordingly, data outputted from the host or the PIM controller may be inputted into the PIM device 10 through the data I/O pad 13-2. Also, data outputted from the PIM device 10 may be inputted to the host or the PIM controller through the data I/O pad 13-2.

In an embodiment, the PIM device 10 may operate in a memory mode or a MAC arithmetic mode. In the event that the PIM device 10 operates in the memory mode, the PIM device 10 may perform a data read operation or a data write operation for the data storage region 11. In the event that the PIM device 10 operates in the MAC arithmetic mode, the arithmetic circuit 12 of the PIM device 10 may receive first data and second data from the data storage region 11 to perform the MAC arithmetic operation. In the event that PIM device 10 operates in the MAC arithmetic mode, the PIM device 10 may also perform the data write operation for the data storage region 11 to execute the MAC arithmetic operation. The MAC arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 2:
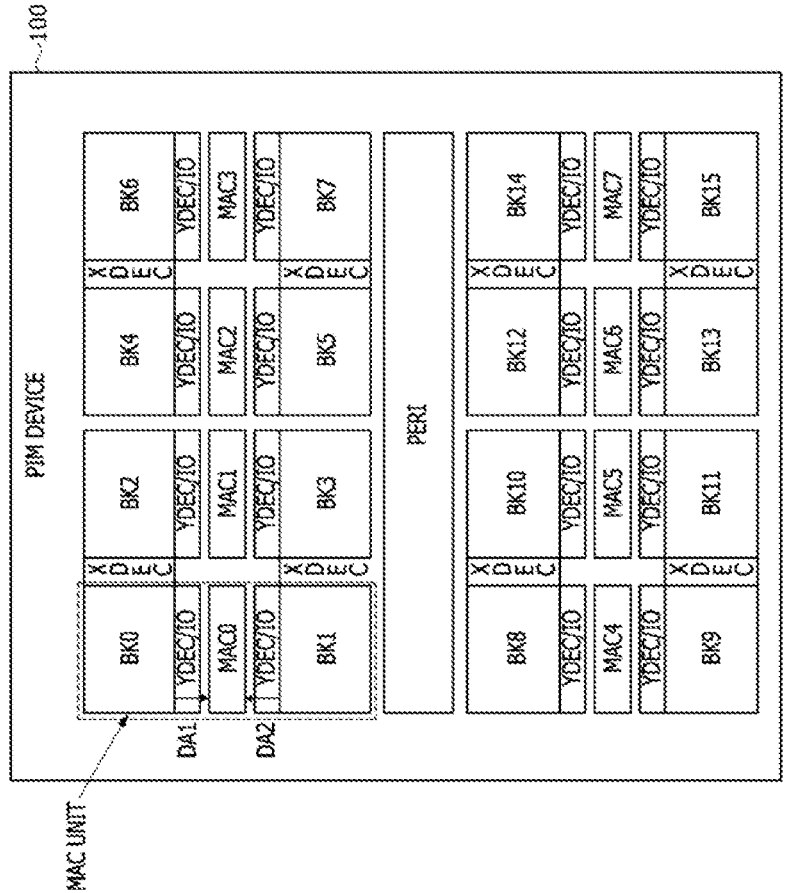
FIG. 2 is a schematic diagram illustrating an arrangement of memory banks and multiplication/accumulation (MAC) operators included in a PIM device according to a first embodiment of the present disclosure.

FIG. 2 illustrates a disposal structure indicating placement of memory banks BK0, . . . , and BK15 and MAC operators MAC0, . . . , and MAC7 included in a PIM device 100 according to an embodiment of the present disclosure. In an embodiment, the memory banks BK0, . . . , and BK15 and the MAC operators MAC0, . . . , and MAC7 may be included in the data storage region and the arithmetic circuit of the PIM device 10 of FIG. 1, respectively. Referring to FIG. 2, the PIM device 100 may include a data storage region and an arithmetic circuit. In an embodiment, the data storage region may include the memory banks BK0, . . . , and BK15. Although the present embodiment illustrates an example in which the data storage region includes the memory banks BK0, . . . , and BK15, the memory banks BK0, . . . , and BK15 are merely examples which are suitable for the data storage region. In some embodiments, the memory banks BK0, . . . , and BK15 may be a memory region corresponding to a volatile memory device, for example, a DRAM device. In an embodiment, each of the memory banks BK0, . . . , and BK15 may be a component unit which is independently activated and may be configured to have the same data bus width as data I/O lines in the PIM device 100. In an embodiment, the memory banks BK0, . . . , and BK15 may operate through interleaving such that an active operation of any one of the memory banks is performed in parallel while another memory bank is selected. Although the present embodiment illustrates an example in which the PIM device 100 includes the memory banks BK0, . . . , and BK15, the number of the memory banks is not limited to 16 and may be different in different embodiments. Each of the memory banks BK0, . . . , and BK15 may include at least one cell array which includes memory unit cells located at cross points of a plurality of rows and a plurality of columns. The memory banks BK0, . . . , and BK15 may include a first group of memory banks (e.g., odd-numbered memory banks BK0, BK2, . . . , and BK14) and a second group of memory banks (e.g., even-numbered memory banks BK1, BK3, . . . , and BK15).

A core circuit may be disposed to be adjacent to the memory banks BK0, . . . , and BK15. The core circuit may include X-decoders XDECs and Y-decoders/IO circuits YDEC/IOs. An X-decoder XDEC may also be referred to as a word line decoder or a row decoder. In an embodiment, two odd-numbered memory banks arrayed to be adjacent to each other in one row among the odd-numbered memory banks BK0, BK2, . . . , and BK14 may share one of the X-decoders XDECs with each other. For example, the first memory bank BK0 and the third memory bank BK2 adjacent to each other in a first row may share one of the X-decoders XDECs, and the fifth memory bank BK4 and the seventh memory bank BK6 adjacent to each other in the first row may also share one of the X-decoders XDECs. Similarly, two even-numbered memory banks arrayed to be adjacent to each other in one row among the even-numbered memory banks BK1, BK3, . . . , and BK15 may share one of the X-decoders XDECs with each other. For example, the second memory bank BK1 and the fourth memory bank BK3 adjacent to each other in a second row may share one of the X-decoders XDECs, and the sixth memory bank BK5 and the eighth memory bank BK7 adjacent to each other in the second row may also share one of the X-decoders XDECs. The X-decoder XDEC may receive a row address from an address latch included in a peripheral circuit PERI and may decode the row address to select and enable one of rows (i.e., word lines) coupled to the memory banks adjacent to the X-decoder XDEC.

The Y-decoders/IO circuits YDEC/IOs may be disposed to be allocated to the memory banks BK0, . . . , and BK15, respectively. For example, the first memory bank BK0 may be allocated to one of the Y-decoders/IO circuits YDEC/IOs, and the second memory bank BK1 may be allocated to another one of the Y-decoders/IO circuits YDEC/IOs. Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address from an address latch included in the peripheral circuit PERI and may decode the column address to select and enable at least one of columns (i.e., bit lines) coupled to the selected memory bank. Each of the I/O circuits may include an I/O sense amplifier for sensing and amplifying a level of a read datum outputted from the corresponding memory bank during a read operation and a write driver for driving a write datum during a write operation for the corresponding memory bank.

In an embodiment, the arithmetic circuit may include MAC operators MAC0, . . . , and MAC7. Although the present embodiment illustrates an example in which the MAC operators MAC0, . . . , and MAC7 are employed as the arithmetic circuit, the present embodiment may be merely an example of the present disclosure. For example, in some other embodiments, processors other than the MAC operators MAC0, . . . , and MAC7 may be employed as the arithmetic circuit. The MAC operators MAC0, . . . , and MAC7 may be disposed such that one of the odd-numbered memory banks BK0, BK2, . . . , and BK14 and one of the even-numbered memory banks BK1, BK3, . . . , and BK15 share any one of the MAC operators MAC0, . . . , and MAC7 with each other. Specifically, one odd-numbered memory bank and one even-numbered memory bank arrayed in one column to be adjacent to each other may constitute a pair of memory banks sharing one of the MAC operators MAC0, . . . , and MAC7 with each other. One of the MAC operators MAC0, . . . , and MAC7 and a pair of memory banks sharing the one MAC operator with each other will be referred to as 'a MAC unit' hereinafter.

In an embodiment, the number of the MAC operators MAC0, . . . , and MAC7 may be equal to the number of the odd-numbered memory banks BK0, BK2, . . . , and BK14 or the number of the even-numbered memory banks BK1, BK3, . . . , and BK15. The first memory bank BK0, the second memory bank BK1, and the first MAC operator MAC0 between the first memory bank BK0 and the second memory bank BK1 may constitute a first MAC unit. In addition, the third memory bank BK2, the fourth memory bank BK3, and the second MAC operator MAC1 between the third memory bank BK2 and the fourth memory bank BK3 may constitute a second MAC unit. The first MAC operator MAC0 included in the first MAC unit may receive first data DA1 outputted from the first memory bank BK0 included in the first MAC unit and second data DA2 outputted from the second memory bank BK1 included in the first MAC unit. In addition, the first MAC operator MAC0 may perform a MAC arithmetic operation of the first data DA1 and the second data DA2. In the event that the PIM device 100 performs a neural network calculation, for example, an arithmetic operation in a deep learning process, one of the first data DA1 and the second data DA2 may be weight data and the other may be vector data. A configuration of any one of the MAC operators MAC0~MAC7 will be described in more detail hereinafter.

In the PIM device 100, the peripheral circuit PERI may be disposed in a region other than an area in which the memory banks BK0, BK1, . . . , and BK15, the MAC operators MAC0, . . . , and MAC7, and the core circuit are disposed. The peripheral circuit PERI may include a control circuit and a transmission path for a command/address signal, a control circuit and a transmission path for input/output of data, and a power supply circuit. The control circuit for the command/address signal may include a command decoder for decoding a command included in the command/address signal to generate an internal command signal, an address latch for converting an input address into a row address and a column address, a control circuit for controlling various functions of row/column operations, and a control circuit for controlling a delay locked loop (DLL) circuit. The control circuit for the input/output of data in the peripheral circuit PERI may include a control circuit for controlling a read/write operation, a read/write buffer, and an output driver. The power supply circuit in the peripheral circuit PERI may include a reference power voltage generation circuit for generating an internal reference power voltage and an internal power voltage generation circuit for generating an internal power voltage from an external power voltage.

The PIM device 100 according to the present embodiment may operate in any one mode of a memory mode and a MAC arithmetic mode. In the memory mode, the PIM device 100 may operate to perform the same operations as general memory devices. The memory mode may include a memory read operation mode and a memory write operation mode. In the memory read operation mode, the PIM device 100 may perform a read operation for reading out data from the memory banks BK0, BK1, . . . , and BK15 to output the read data, in response to an external request. In the memory write operation mode, the PIM device 100 may perform a write operation for storing data provided by an external device into the memory banks BK0, BK1, . . . , and BK15, in response to an external request.

In the MAC arithmetic mode, the PIM device 100 may perform the MAC arithmetic operation using the MAC operators MAC0, . . . , and MAC7. Specifically, the PIM device 100 may perform the read operation of the first data DA1 for each of the odd-numbered memory banks BK0, BK2, . . . , and BK14 and the read operation of the second data DA2 for each of the even-numbered memory banks BK1, BK3, . . . , and BK15, for the MAC arithmetic operation in the MAC arithmetic mode. In addition, each of the MAC operators MAC0, . . . , and MAC7 may perform the MAC arithmetic operation of the first data DA1 and the second data DA2 which are read out of the memory banks to store a result of the MAC arithmetic operation into the memory bank or to output the result of the MAC arithmetic operation. In some cases, the PIM device 100 may perform a data write operation for storing data to be used for the MAC arithmetic operation into the memory banks before the data read operation for the MAC arithmetic operation is performed in the MAC arithmetic mode.

The operation mode of the PIM device 100 according to the present embodiment may be determined by a command which is transmitted from a host or a controller to the PIM device 100. In an embodiment, if a first external command requesting a read operation or a write operation for the memory banks BK0, BK1, . . . , and BK15 is inputted to the PIM device 100, the PIM device 100 may perform the data read operation or the data write operation in the memory mode. Meanwhile, if a second external command requesting a MAC calculation corresponding to the MAC arithmetic operation is inputted to the PIM device 100, the PIM device 100 may perform the MAC arithmetic operation.

The PIM device 100 may perform a deterministic MAC arithmetic operation. The term "deterministic MAC arithmetic operation" used in the present disclosure may be defined as the MAC arithmetic operation performed in the PIM device 100 during a predetermined fixed time. Thus, the host or the controller may always predict a point in time (or a clock) when the MAC arithmetic operation terminates in the PIM device 100 at a point in time when an external command requesting the MAC arithmetic operation is transmitted from the host or the controller to the PIM device 100. No operation for informing the host or the controller of a status of the MAC arithmetic operation is required while the PIM device 100 performs the deterministic MAC arithmetic operation. In an embodiment, a latency during which the MAC arithmetic operation is performed in the PIM device 100 may be fixed for the deterministic MAC arithmetic operation.

Figure 3:
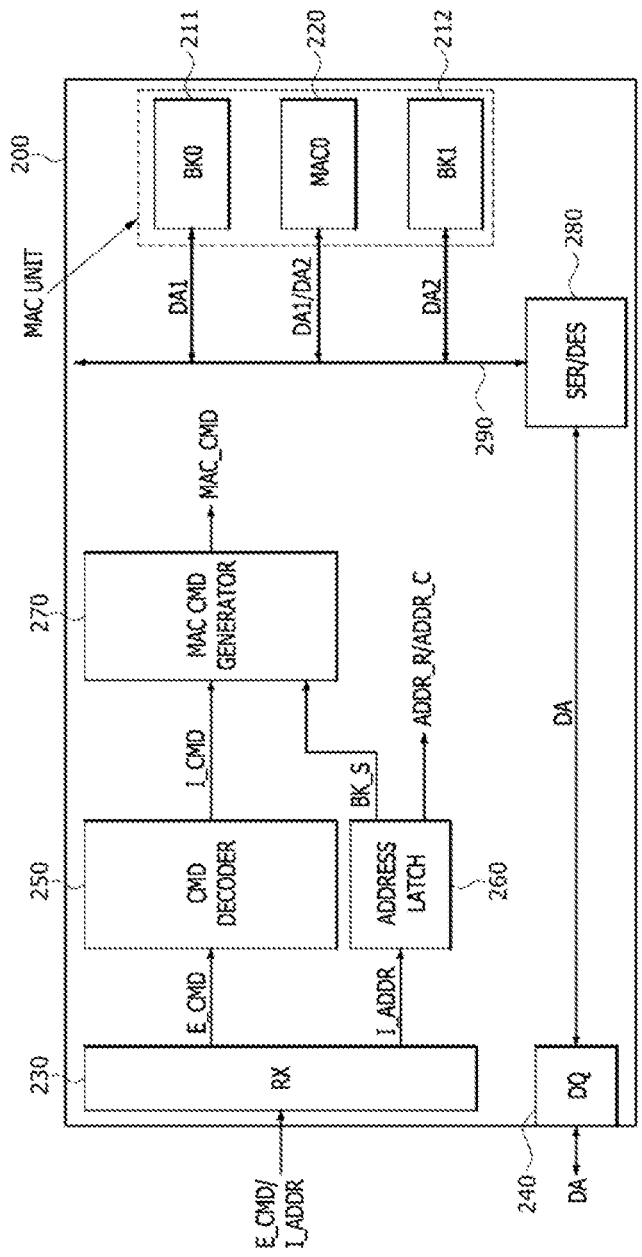
FIG. 3 is a block diagram illustrating a configuration of a PIM device according to the first embodiment of the present disclosure.
Figure 4:
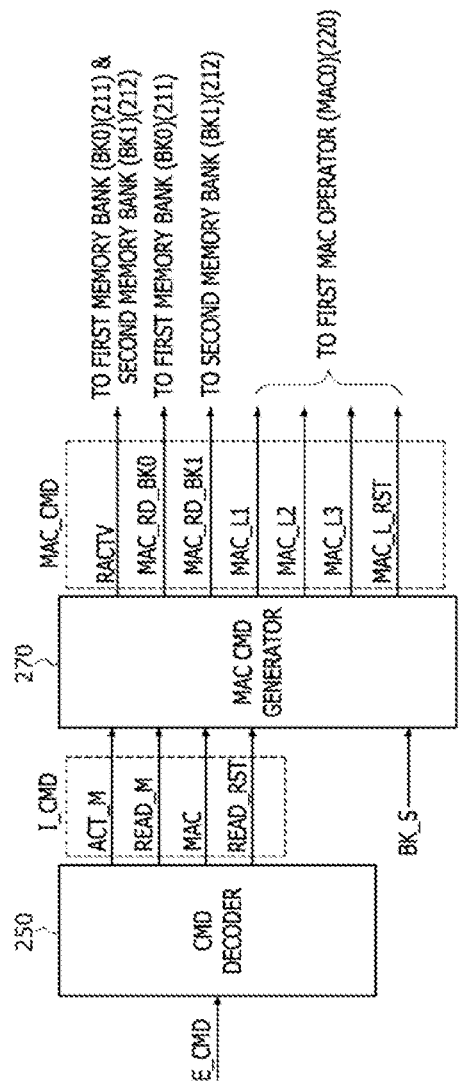
FIG. 4 illustrates internal command signals outputted from a command decoder and MAC command signals outputted from a MAC command generator in the PIM device of FIG. 3.

FIG. 3 is a block diagram illustrating a configuration of a PIM device 200 corresponding to the PIM device 100 illustrated in FIG. 3, and FIG. 4 illustrates an internal command signal I_CMD outputted from a command decoder 250 and a MAC command signal MAC_CMD outputted from a MAC command generator 270 included in the PIM device 200 of FIG. 3. FIG. 3 illustrates only the first memory bank (BK0) 211, the second memory bank (BK1) 212, and the first MAC operator (MAC0) 220 constituting the first MAC unit among the plurality of MAC units. However, FIG. 3 illustrates merely an example for simplification of the drawing. Accordingly, the following description for the first MAC unit may be equally applicable to the remaining MAC units. Referring to FIG. 3, the PIM device 200 may include a global I/O line (hereinafter, referred to as a 'GIO line') 290. The first memory bank (BK0) 211, the second memory bank (BK1) 212, and the first MAC operator (MAC0) 220 may communicate with each other through the GIO line 290. In an embodiment, the GIO line 290 may be disposed in the peripheral circuit PERI of FIG. 2.

The PIM device 200 may include a receiving driver (RX) 230, a data I/O circuit (DQ) 240, a command decoder 250, an address latch 260, a MAC command generator 270, and a serializer/deserializer (SER/DES) 280. The command decoder 250, the address latch 260, the MAC command generator 270, and the serializer/deserializer 280 may be disposed in the peripheral circuit PERI of the PIM device 100 illustrated in FIG. 2. The receiving driver 230 may receive an external command E_CMD and an input address I_ADDR from an external device. The external device may denote a host or a controller coupled to the PIM device 200. Hereinafter, it may be assumed that the external command E_CMD transmitted to the PIM device 200 is a command requesting the MAC arithmetic operation. That is, the PIM device 200 may perform the deterministic MAC arithmetic operation in response to the external command E_CMD. The data I/O circuit 240 may include an I/O pad. The data I/O circuit 240 may be coupled to data I/O line. The PIM device 200 may communicate with the external device through the data I/O circuit 240. The receiving driver 230 may separately output the external command E_CMD and the input address I_ADDR received from the external device. Data DA inputted to the PIM device 200 through the data I/O circuit 240 may be processed by the serializer/deserializer 280 and may be transmitted to the first memory bank (BK0) 211 and the second memory bank (BK1) 212 through the GIO line 290 of the PIM device 200. The data DA outputted from the first memory bank (BK0) 211, the second memory bank (BK1) 212, and the first MAC operator (MAC0) 220 through the GIO line 290 may be processed by the serializer/deserializer 280 and may be outputted to the external device through the data I/O circuit 240. The serializer/deserializer 280 may convert the data DA into parallel data if the data DA are serial data or may convert the data DA into serial data if the data DA are parallel data. For the data conversion, the serializer/deserializer 280 may include a serializer converting parallel data into serial data and a deserializer converting serial data into parallel data.

The command decoder 250 may decode the external command E_CMD outputted from the receiving driver 230 to generate and output the internal command signal I_CMD. As illustrated in FIG. 4, the internal command signal I_CMD outputted from the command decoder 250 may include first to fourth internal command signals. In an embodiment, the first internal command signal may be a memory active signal ACT_M, the second internal command signal may be a memory read signal READ_M, the third internal command signal may be a MAC arithmetic signal MAC, and the fourth internal command signal may be a result read signal READ_RST. The first to fourth internal command signals outputted from the command decoder 250 may be sequentially inputted to the MAC command generator 270.

In order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks). In an embodiment, the memory active signal ACT_M, the memory read signal READ_M, the MAC arithmetic signal MAC, and the result read signal READ_RST may have predetermined latencies, respectively. For example, the memory read signal READ_M may be generated after a first latency elapses from a point in time when the memory active signal ACT_M is generated, the MAC arithmetic signal MAC may be generated after a second latency elapses from a point in time when the memory read signal READ_M is generated, and the result read signal READ_RST may be generated after a third latency elapses from a point in time when the MAC arithmetic signal MAC is generated. No signal is generated by the command decoder 250 until a fourth latency elapses from a point in time when the result read signal READ_RST is generated. The first to fourth latencies may be predetermined and fixed. Thus, the host or the controller outputting the external command E_CMD may predict the points in time when the first to fourth internal command signals constituting the internal command signal I_CMD are generated by the command decoder 250 in advance at a point in time when the external command E_CMD is outputted from the host or the controller.

The address latch 260 may convert the input address I_ADDR outputted from the receiving driver 230 into a bank selection signal BK_S and a row/column address ADDR_R/ADDR_C to output the bank selection signal BK_S and the row/column address ADDR_R/ADDR_C. The bank selection signal BK_S may be inputted to the MAC command generator 270. The row/column address ADDR_R/ADDR_C may be transmitted to the first and second memory banks 211 and 212. One of the first and second memory banks 211 and 212 may be selected by the bank selection signal BK_S. One of rows included in the selected memory bank and one of columns included in the selected memory bank may be selected by the row/column address ADDR_R/ADDR_C. In an embodiment, a point in time when the bank selection signal BK_S is inputted to the MAC command generator 270 may be the same moment as a point in time when the row/column address ADDR_R/ADDR_C is inputted to the first and second memory banks 211 and 212. In an embodiment, the point in time when the bank selection signal BK_S is inputted to the MAC command generator 270 and the point in time when the row/column address ADDR_R/ADDR_C is inputted to the first and second memory banks 211 and 212 may be a point in time when the MAC command is generated to read out data from the first and second memory banks 211 and 212 for the MAC arithmetic operation.

The MAC command generator 270 may output the MAC command signal MAC_CMD in response to the internal command signal I_CMD outputted from the command decoder 250 and the bank selection signal BK_S outputted from the address latch 260. As illustrated in FIG. 4, the MAC command signal MAC_CMD outputted from the MAC command generator 270 may include first to seventh MAC command signals. In an embodiment, the first MAC command signal may be a MAC active signal RACTV, the second MAC command signal may be a first MAC read signal MAC_RD_BK0, the third MAC command signal may be a second MAC read signal MAC_RD_BK1, the fourth MAC command signal may be a first MAC input latch signal MAC_L1, the fifth MAC command signal may be a second MAC input latch signal MAC_L2, the sixth MAC command signal may be a MAC output latch signal MAC3, and the seventh MAC command signal may be a MAC result latch signal MAC_L_RST.

The MAC active signal RACTV may be generated based on the memory active signal ACT_M outputted from the command decoder 250. The first MAC read signal MAC_RD_BK0 may be generated in response to the memory read signal READ_M outputted from the command decoder 250 and the bank selection signal BK_S having a first level (e.g., a logic "low" level) outputted from the address latch 260. The first MAC input latch signal MAC_L1 may be generated at a point in time when a certain time elapses from a point in time when the first MAC read signal MAC_RD_BK0 is generated. For various embodiments, a certain time means a fixed time duration. The second MAC read signal MAC_RD_BK1 may be generated in response to the memory read signal READ_M outputted from the command decoder 250 and the bank selection signal BK_S having a second level (e.g., a logic "high" level) outputted from the address latch 260. The second MAC input latch signal MAC_L2 may be generated at a point in time when a certain time elapses from a point in time when the second MAC read signal MAC_RD_BK1 is generated. The MAC output latch signal MAC_L3 may be generated in response to the MAC arithmetic signal MAC outputted from the command decoder 250. Finally, the MAC result latch signal MAC_L_RST may be generated in response to the result read signal READ_RST outputted from the command decoder 250.

The MAC active signal RACTV outputted from the MAC command generator 270 may control an activation operation for the first and second memory banks 211 and 212. The first MAC read signal MAC_RD_BK0 outputted from the MAC command generator 270 may control a data read operation for the first memory bank 211. The second MAC read signal MAC_RD_BK1 outputted from the MAC command generator 270 may control a data read operation for the second memory bank 212. The first MAC input latch signal MAC_L1 and the second MAC input latch signal MAC_L2 outputted from the MAC command generator 270 may control an input data latch operation of the first MAC operator (MAC0) 220. The MAC output latch signal MAC_L3 outputted from the MAC command generator 270 may control an output data latch operation of the first MAC operator (MAC0) 220. The MAC result latch signal MAC_L_RST outputted from the MAC command generator 270 may control a reset operation of the first MAC operator (MAC0) 220.

As described above, in order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks), respectively. Thus, the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST may also be generated and outputted from the MAC command generator 270 at predetermined points in time after the external command E_CMD is inputted to the PIM device 200, respectively. That is, a time period from a point in time when the first and second memory banks 211 and 212 are activated by the MAC active signal RACTV until a point in time when the first MAC operator (MAC0) 220 is reset by the MAC result latch signal MAC_L_RST may be predetermined, and thus the PIM device 200 may perform the deterministic MAC arithmetic operation.

Figure 5:
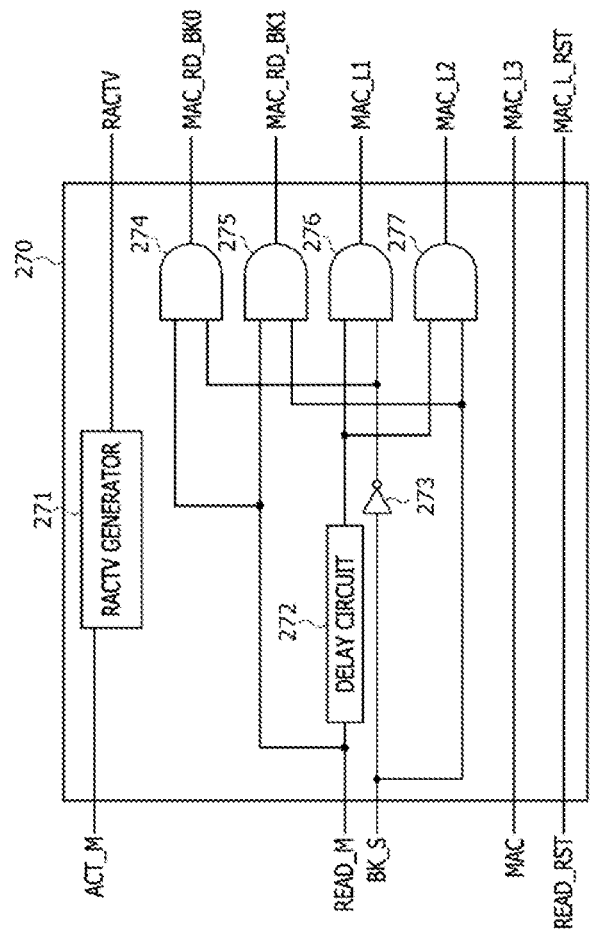
FIG. 5 illustrates an example of a configuration of a MAC command generator included in the PIM device of FIG. 3.

FIG. 5 illustrates an example of a configuration of the MAC command generator 270 included in the PIM device 200 illustrated in FIG. 3. Referring to FIG. 5, the MAC command generator 270 may sequentially receive the memory active signal ACT_M, the memory read signal READ_M, the MAC arithmetic signal MAC, and the result read signal READ_RST from the command decoder 250. In addition, the MAC command generator 270 may also receive the bank selection signal BK_S from the address latch 260. The MAC command generator 270 may output the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST in series with certain time intervals. For an embodiment, a certain time interval is a time interval having a fixed duration.

In an embodiment, the MAC command generator 270 may be configured to include an active signal generator 271, a delay circuit 272, an inverter 273, and first to fourth AND gates 274, 275, 276, and 277. The active signal generator 271 may receive the memory active signal ACT_M to generate and output the MAC active signal RACTV. The MAC active signal RACTV outputted from the active signal generator 271 may be transmitted to the first and second memory banks 211 and 212 to activate the first and second memory banks 211 and 212. The delay circuit 272 may receive the memory read signal READ_M and may delay the memory read signal READ_M by a delay time DELAY_T to output the delayed signal of the memory read signal READ_M. The inverter 273 may receive the bank selection signal BK_S and may invert a logic level of the bank selection signal BK_S to output the inverted signal of the bank selection signal BK_S.

The first AND gate 274 may receive the memory read signal READ_M and an output signal of the inverter 273 and may perform a logical AND operation of the memory read signal READ_M and an output signal of the inverter 273 to generate and output the first MAC read signal MAC_RD_BK0. The second AND gate 275 may receive the memory read signal READ_M and the bank selection signal BK_S and may perform a logical AND operation of the memory read signal READ_M and the bank selection signal BK_S to generate and output the second MAC read signal MAC_RD_BK1. The third AND gate 276 may receive an output signal of the delay circuit 272 and an output signal of the inverter 273 and may perform a logical AND operation of the output signals of the delay circuit 272 and the inverter 273 to generate and output the first MAC input latch signal MAC_L1. The fourth AND gate 277 may receive an output signal of the delay circuit 272 and the bank selection signal BK_S and may perform a logical AND operation of the output signal of the delay circuit 272 and the bank selection signal BK_S to generate and output the second MAC input latch signal MAC_L2.

It may be assumed that the memory read signal READ_M inputted to the MAC command generator 270 has a logic "high" level and the bank selection signal BK_S inputted to the MAC command generator 270 has a logic "low" level. A level of the bank selection signal BK_S may change from a logic "low" level into a logic "high" level after a certain time elapses. When the memory read signal READ_M has a logic "high" level and the bank selection signal BK_S has a logic "low" level, the first AND gate 274 may output the first MAC read signal MAC_RD_BK0 having a logic "high" level and the second AND gate 275 may output the second MAC read signal MAC_RD_BK1 having a logic "low" level. The first memory bank 211 may transmit the first data DA1 to the first MAC operator 220 according to a control operation based on the first MAC read signal MAC_RD_BK0 having a logic "high" level. If a level transition of the bank selection signal BK_S occurs so that both of the memory read signal READ_M and the bank selection signal BK_S have a logic "high" level, the first AND gate 274 may output the first MAC read signal MAC_RD_BK0 having a logic "low" level and the second AND gate 275 may output the second MAC read signal MAC_RD_BK1 having a logic "high" level. The second memory bank 212 may transmit the second data DA2 to the first MAC operator 220 according to a control operation based on the second MAC read signal MAC_RD_BK1 having a logic "high" level.

Due to the delay time of the delay circuit 272, the output signals of the third and fourth AND gates 276 and 277 may be generated after the first and second MAC read signals MAC_RD_BK0 and MAC_RD_BK1 are generated. Thus, after the second MAC read signal MAC_RD_BK1 is generated, the third AND gate 276 may output the first MAC input latch signal MAC_L1 having a logic "high" level. The first MAC operator 220 may latch the first data DA1 in response to the first MAC input latch signal MAC_L1 having a logic "high" level. After a certain time elapses from a point in time when the first data DA1 are latched by the first MAC operator 220, the fourth AND gate 277 may output the second MAC input latch signal MAC_L2 having a logic "high" level. The first MAC operator 220 may latch the second data DA2 in response to the second MAC input latch signal MAC_L2 having a logic "high" level. The first MAC operator 220 may start to perform the MAC arithmetic operation after the first and second data DA1 and DA2 are latched.

The MAC command generator 270 may generate the MAC output latch signal MAC_L3 in response to the MAC arithmetic signal MAC outputted from the command decoder 250. The MAC output latch signal MAC_L3 may have the same logic level as the MAC arithmetic signal MAC. For example, if the MAC arithmetic signal MAC having a logic "high" level is inputted to the MAC command generator 270, the MAC command generator 270 may generate the MAC output latch signal MAC_L3 having a logic "high" level. The MAC command generator 270 may generate the MAC result latch signal MAC_L_RST in response to the result read signal READ_RST outputted from the command decoder 250. The MAC result latch signal MAC_L_RST may have the same logic level as the result read signal READ_RST. For example, if the result read signal READ_RST having a logic "high" level is inputted to the MAC command generator 270, the MAC command generator 270 may generate the MAC result latch signal MAC_L_RST having a logic "high" level.

Figure 6:
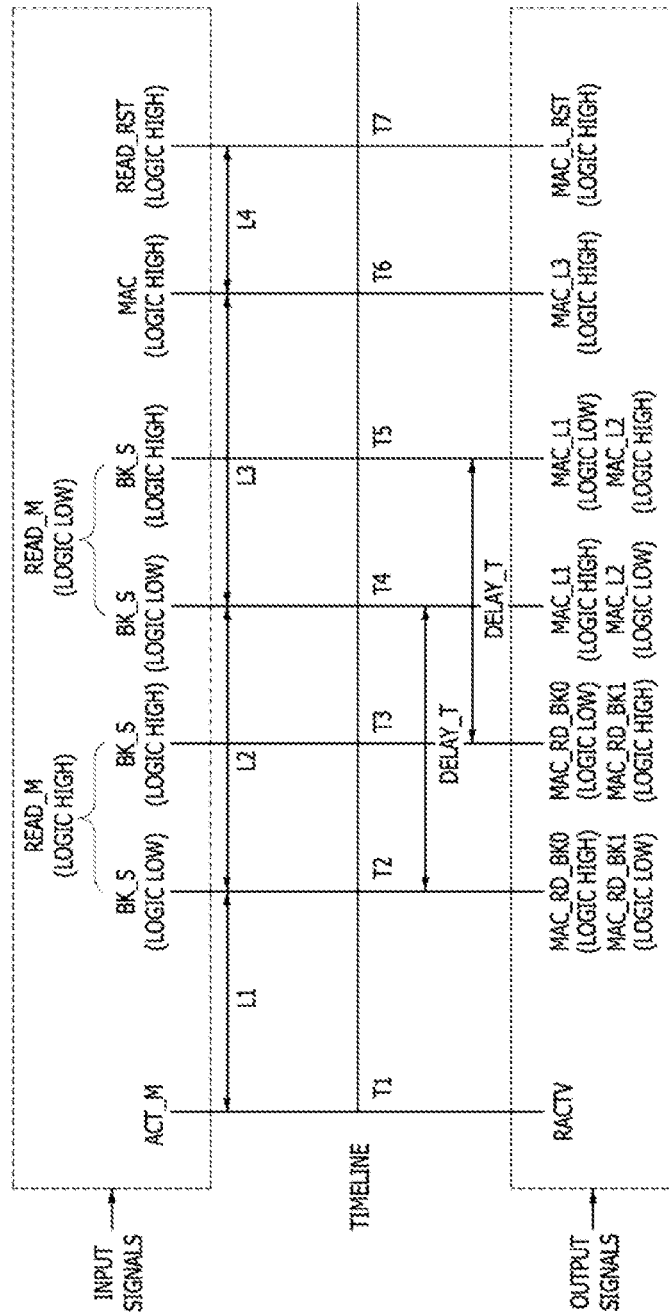
FIG. 6 illustrates input signals and output signals of the MAC command generator illustrated in FIG. 5 with a timeline.

FIG. 6 illustrates input signals and output signals of the MAC command generator 270 illustrated in FIG. 5 along a timeline. In FIG. 6, signals transmitted from the command decoder 250 to the MAC command generator 270 are illustrated in an upper dotted line box, and signals outputted from the MAC command generator 270 are illustrated in a lower dotted line box. Referring to FIGS. 5 and 6 at a first point in time "T1" of the timeline, the memory active signal ACT_M may be inputted to the MAC command generator 270 and the MAC command generator 270 may output the MAC active signal RACTV. At a second point in time "T2" when a certain time, for example, a first latency L1 elapses from the first point in time "T1", the memory read signal READ_M having a logic "high" level and the bank selection signal BK_S having a logic "low" level may be inputted to the MAC command generator 270. In response to the memory read signal READ_M having a logic "high" level and the bank selection signal BK_S having a logic "low" level, the MAC command generator 270 may output the first MAC read signal MAC_RD_BK0 having a logic "high" level and the second MAC read signal MAC_RD_BK1 having a logic "low" level in response to the memory read signal READ_M having a logic "high" level and the bank selection signal BK_S having a logic "low" level, as described with reference to FIG. 5. At a third point in time "T3" when a certain time elapses from the second point in time "T2", a logic level of the bank selection signal BK_S may change from a logic "low" level into a logic "high" level. In such a case, the MAC command generator 270 may output the first MAC read signal MAC_RD_BK0 having a logic "low" level and the second MAC read signal MAC_RD_BK1 having a logic "high" level, as described with reference to FIG. 5.

At a fourth point in time "T4" when the delay time DELAY_T elapses from the second point in time "T2", the MAC command generator 270 may output the first MAC input latch signal MAC_L1 having a logic "high" level and the second MAC input latch signal MAC_L2 having a logic "low" level. The delay time DELAY_T may be set by the delay circuit 272. The delay time DELAY_T may bet to be different according a logic design scheme of the delay circuit 272 and may be fixed once the logic design scheme of the delay circuit 272 is determined. In an embodiment, the delay time DELAY_T may be set to be equal to or greater than a second latency L2. At a fifth point in time "T5" when a certain time elapses from the fourth point in time "T4", the MAC command generator 270 may output the first MAC input latch signal MAC_L1 having a logic "low" level and the second MAC input latch signal MAC_L2 having a logic "high" level. The fifth point in time "T5" may be a moment when the delay time DELAY_T elapses from the third point in time "T3".

At a sixth point in time "T6" when a certain time, for example, a third latency L3 elapses from the fourth point in time "T4", the MAC arithmetic signal MAC having a logic "high" level may be inputted to the MAC command generator 270. In response to the MAC arithmetic signal MAC having a logic "high" level, the MAC command generator 270 may output the MAC output latch signal MAC_L3 having a logic "high" level, as described with reference to FIG. 5. Subsequently, at a seventh point in time "T7" when a certain time, for example, a fourth latency L4 elapses from the sixth point in time "T6", the result read signal READ_RST having a logic "high" level may be inputted to the MAC command generator 270. In response to the result read signal READ_RST having a logic "high" level, the MAC command generator 270 may output the MAC result latch signal MAC_L_RST having a logic "high" level, as described with reference to FIG. 5.

In order to perform the deterministic MAC arithmetic operation, moments when the internal command signals ACT_M, READ_M, MAC, and READ_RST generated by the command decoder 250 are inputted to the MAC command generator 270 may be fixed and moments when the MAC command signals RACTV, MAC_RD_BK0, MAC_RD_BK1, MAC_L1, MAC_L2, MAC_L3, and MAC_L_RST are outputted from the MAC command generator 270 in response to the internal command signals ACT_M, READ_M, MAC, and READ_RST may also be fixed. Thus, all of the first latency L1 between the first point in time "T1" and the second point in time "T2", the second latency L2 between the second point in time "T2" and the fourth point in time "T4", the third latency L3 between the fourth point in time "T4" and the sixth point in time "T6", and the fourth latency L4 between the sixth point in time "T6" and the seventh point in time "T7" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks BK0 and BK1 based on the first and second MAC read signals MAC_RD_BK0 and MAC_RD_BK1 and to input the first and second data DA1 and DA2 into the first MAC operator (MAC0) 220. The third latency L3 may be defined as a time it takes to latch the first and second data DA1 and DA2 in the first MAC operator (MAC0) 220 based on the first and second MAC input latch signals MAC_L1 and MAC_L2 and it takes the first MAC operator (MAC0) 220 to perform the MAC arithmetic operation of the first and second data. The fourth latency L4 may be defined as a time it takes to latch the output data in the first MAC operator (MAC0) 220 based on the MAC output latch signal MAC_L3.

Figure 7:
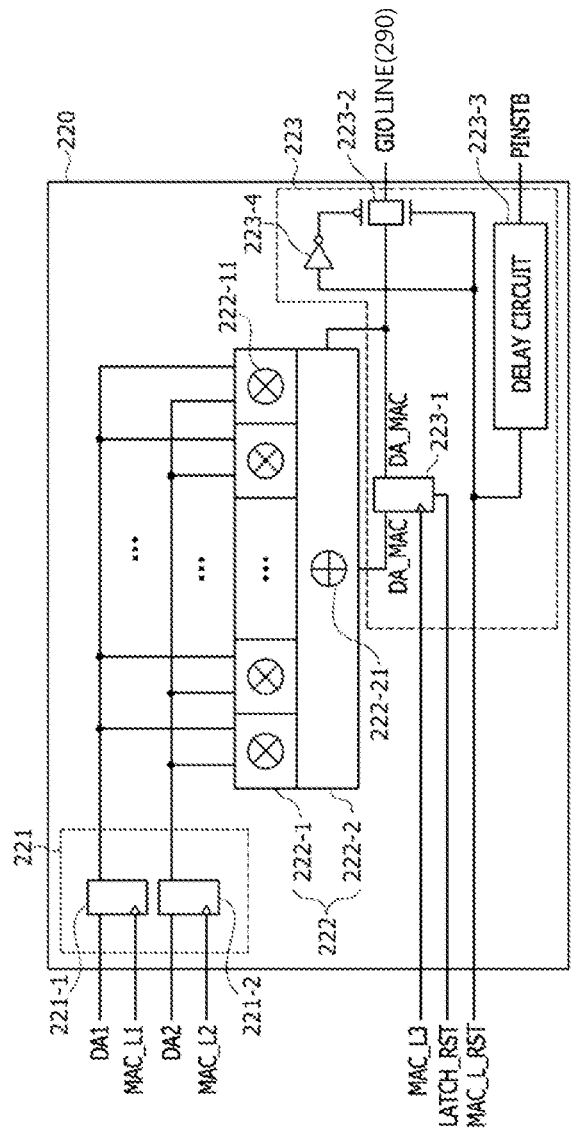
FIG. 7 illustrates an example of a configuration of a MAC operator included in the PIM device of FIG. 3.
Figure 8:
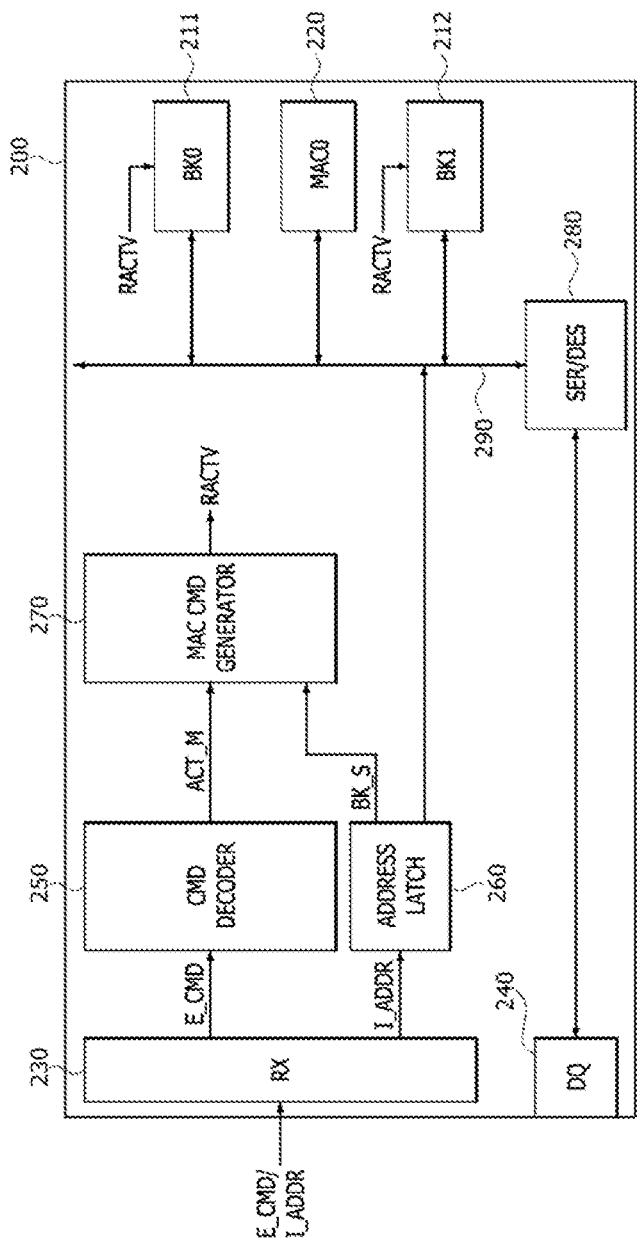
FIGS. 8 to 14 are block diagrams illustrating operations of the PIM device illustrated in FIG. 3.

FIG. 7 illustrates an example of a configuration of the first MAC operator (MAC0) 220 included in the PIM device 200 illustrated in FIG. 3. Referring to FIG. 7, the first MAC operator (MAC0) 220 may be configured to include a data input circuit 221, a MAC circuit 222, and a data output circuit 223. The data input circuit 221 may be configured to include a first input latch 221-1 and a second input latch 221-2. The MAC circuit 222 may be configured to include a multiplication logic circuit 222-1 and an addition logic circuit 222-2. The data output circuit 223 may be configured to include an output latch 223-1, a transfer gate 223-2, a delay circuit 223-3, and an inverter 223-4. In an embodiment, the first input latch 221-1, the second input latch 221-2, and the output latch 223-1 may be realized using flip-flops.

The data input circuit 221 of the first MAC operator (MAC0) 220 may be synchronized with the first and second MAC input latch signals MAC_L1 and MAC_L2 to receive and output the first and second data DA1 and DA2 inputted through the GIO line 290 to the MAC circuit 222. Specifically, the first data DA1 may be transmitted from the first memory bank BK0 (211 of FIG. 3) to the first input latch 221-1 of the data input circuit 221 through the GIO line 290, in response to the first MAC read signal MAC_RD_BK0 having a logic "high" level outputted from the MAC command generator (270 of FIG. 3). The second data DA2 may be transmitted from the second memory bank BK1 (212 of FIG. 2) to the second input latch 221-2 of the data input circuit 221 through the GIO line 290, in response to the second MAC read signal MAC_RD_BK1 having a logic "high" level outputted from the MAC command generator 270. The first input latch 221-1 may output the first data DA1 to the MAC circuit 222 in synchronization with the first MAC input latch signal MAC_L1 having a logic "high" level outputted from the MAC command generator 270 (270 of FIG. 3). The second input latch 221-2 may output the second data DA2 to the MAC circuit 222 in synchronization with the second MAC input latch signal MAC_L2 having a logic "high" level outputted from the MAC command generator (270 of FIG. 3). As described with reference to FIG. 5, the second MAC input latch signal MAC_L2 may be generated at a moment (corresponding to the fifth point in time "T5" of FIG. 6) when a certain time elapses from a moment (corresponding to the fourth point in time "T4" of FIG. 6) when the first MAC input latch signal MAC_L1 is generated. Thus, after the first data DA1 is inputted to the MAC circuit 222, the second data DA2 may then be inputted to the MAC circuit 222.

The MAC circuit 222 may perform a multiplying calculation and an accumulative adding calculation for the first and second data DA1 and DA2. The multiplication logic circuit 222-1 of the MAC circuit 222 may include a plurality of multipliers 222-11. Each of the plurality of multipliers 222-11 may perform a multiplying calculation of the first data DA1 outputted from the first input latch 221-1 and the second data DA2 outputted from the second input latch 221-2 and may output the result of the multiplying calculation. Bit values constituting the first data DA1 may be separately inputted to the multipliers 222-11. Similarly, bit values constituting the second data DA2 may also be separately inputted to the multipliers 222-11. For example, if each of the first and second data DA1 and DA2 is comprised of an 'N'-bit binary stream and the number of the multipliers 222-11 is 'M', the first data DA1 having 'N/M' bits and the second data DA2 having 'N/M' bits may be inputted to each of the multipliers 222-11. That is, each of the multipliers 222-11 may be configured to perform a multiplying calculation of first 'N/M'-bit data and second 'N/M'-bit data. Multiplication result data outputted from each of the multipliers 222-11 may have '2N/M' bits.

The addition logic circuit 222-2 of the MAC circuit 222 may include a plurality of adders 222-21. Although not shown in the drawings, the plurality of adders 222-21 may be disposed to provide a tree structure including a plurality of stages. Each of the adders 222-21 disposed at a first stage may receive two sets of multiplication result data from two of the multipliers 222-11 included in the multiplication logic circuit 222-1 and may perform an adding calculation of the two sets of multiplication result data to output addition result data. Each of the adders 222-21 disposed at a second stage may receive two sets of addition result data from two of the adders 222-21 disposed at the first stage and may perform an adding calculation of the two sets of addition result data to output addition result data. The adders 222-21 disposed at a last stage may receive two sets of addition result data from two adders 222-21 disposed at the previous stage and may perform an adding calculation of the two sets of addition result data to output the addition result data. The adders 222-21 constituting the addition logic circuit 222-2 may include an adder for performing an accumulative adding calculation of the addition result data outputted from the adder 222-21 disposed at the last stage and previous MAC result data stored in the output latch 223-1 of the data output circuit 223.

The data output circuit 223 may output MAC result data DA_MAC outputted from the MAC circuit 222 to the GIO line 290. Specifically, the output latch 223-1 of the data output circuit 223 may latch the MAC result data DA_MAC outputted from the MAC circuit 222 and may output the latched data of the MAC result data DA_MAC in synchronization with the MAC output latch signal MAC_L3 having a logic "high" level outputted from the MAC command generator (270 of FIG. 3). The MAC result data DA_MAC outputted from the output latch 223-1 may be fed back to the MAC circuit 222 for the accumulative adding calculation. In addition, the MAC result data DA_MAC may be inputted to the transfer gate 223-2, and the transfer gate 223-2 may output the MAC result data DA_MAC to the GIO line 290. The output latch 223-1 may be initialized if a latch reset signal LATCH_RST is inputted to the output latch 223-1. In such a case, all of data latched by the output latch 223-1 may be removed. In an embodiment, the latch reset signal LATCH_RST may be activated by generation of the MAC result latch signal MAC_L_RST having a logic "high" level and may be inputted to the output latch 223-1.

The MAC result latch signal MAC_L_RST outputted from the MAC command generator 270 may be inputted to the transfer gate 223-2, the delay circuit 223-3, and the inverter 223-4. The inverter 223-4 may inversely buffer the MAC result latch signal MAC_L_RST to output the inversely buffered signal of the MAC result latch signal MAC_L_RST to the transfer gate 223-2. The transfer gate 223-2 may transfer the MAC result data DA_MAC from the output latch 223-1 to the GIO line 290 in response to the MAC result latch signal MAC_L_RST having a logic "high" level. The delay circuit 223-3 may delay the MAC result latch signal MAC_L_RST by a certain time to generate and output a latch control signal PINSTB.

FIGS. 8 to 14 are block diagrams illustrating operations of the PIM device 200 illustrated in FIG. 3. In FIGS. 8 to 14, the same reference numerals or the same reference symbols as used in FIG. 3 denote the same elements. First, referring to FIG. 8, if the external command E_CMD requesting the MAC arithmetic operation and the input address I_ADDR are transmitted from an external device to the receiving driver 230, the receiving driver 230 may output the external command E_CMD and the input address I_ADDR to the command decoder 250 and the address latch 260, respectively. The command decoder 250 may decode the external command E_CMD to generate and transmit the memory active signal ACT_M to the MAC command generator 270. The address latch 260 receiving the input address I_ADDR may generate and transmit the bank selection signal BK_S to the MAC command generator 270. The MAC command generator 270 may generate and output the MAC active signal RACTV in response to the memory active signal ACT_M and the bank selection signal BK_S. The MAC active signal RACTV may be transmitted to the first memory bank (BK0) 211 and the second memory bank (BK1) 212. The first memory bank (BK0) 211 and the second memory bank (BK1) 212 may be activated by the MAC active signal RACTV.

Figure 9:
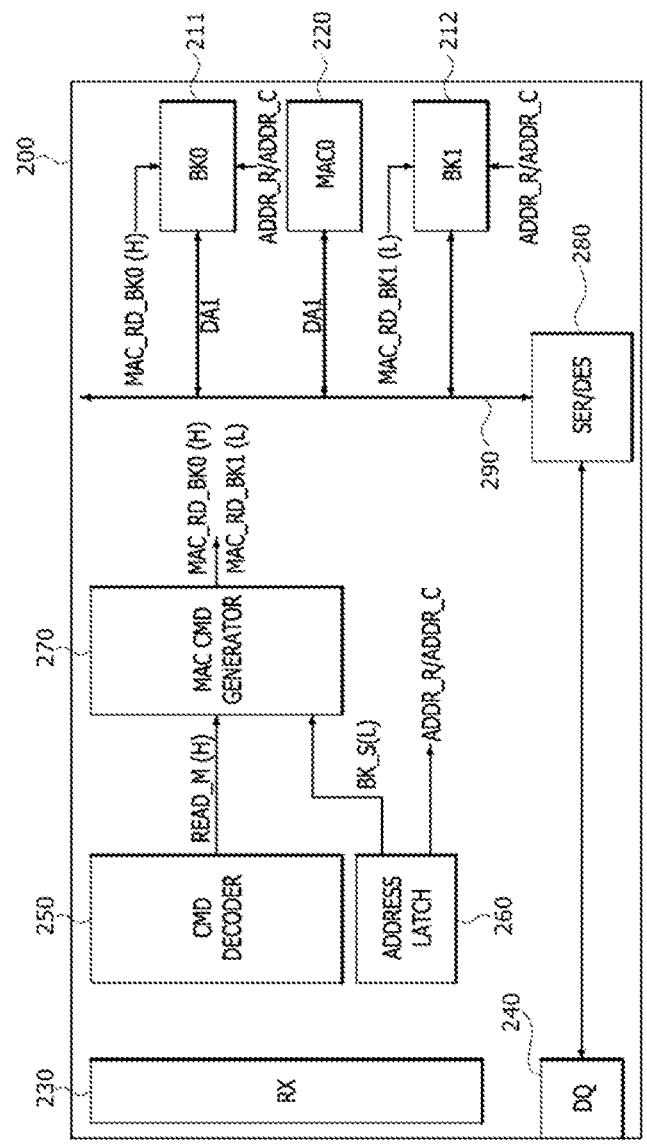

Next, referring to FIG. 9, the command decoder 250 may generate and output the memory read signal READ_M having a logic "high(H)" level to the MAC command generator 270. In addition, the address latch 260 may generate and output the bank selection signal BK_S having a logic "low(L)" level to the MAC command generator 270.

In response to the memory read signal READ_M having a logic "high(H)" level and the bank selection signal BK_S having a logic "low(L)" level, the MAC command generator 270 may generate and output the first MAC read signal MAC_RD_BK0 having a logic "high(H)" level and the second MAC read signal MAC_RD_BK1 having a logic "low(L)" level, as described with reference to FIG. 4. The first MAC read signal MAC_RD_BK0 having a logic "high (H)" level, together with the row/column address ADDR_R/ADDR_C, may be transmitted to the first memory bank (BK0) 211. The second MAC read signal MAC_RD_BK1 having a logic "low(L)" level, together with the row/column address ADDR_R/ADDR_C, may be transmitted to the second memory bank (BK1) 212. The first data DA1 may be read out of the first memory bank (BK0) 211 by the first MAC read signal MAC_RD_BK0 having a logic "high(H)" level and may be transmitted to the first MAC operator (MAC0) 220 through the GIO line 290.

Figure 10:
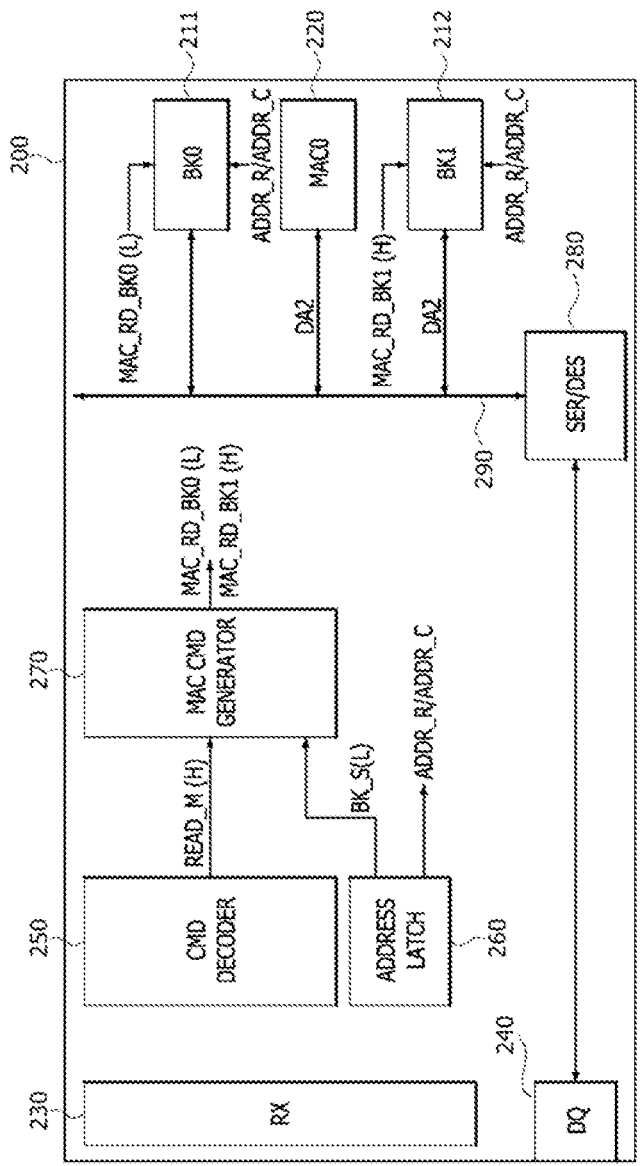

Next, referring to FIG. 10, a logic level of the bank selection signal BK_S may change from a logic "low(L)" level into a logic "high(H)" level while the memory read signal READ_M maintains a logic "high(H)" level. In such a case, as described with reference to FIG. 5, the MAC command generator 270 may generate and output the first MAC read signal MAC_RD_BK0 having a logic "low(L)" level and the second MAC read signal MAC_RD_BK1 having a logic "high(H)" level. The first MAC read signal MAC_RD_BK0 having a logic "low(L)" level, together with the row/column address ADDR_R/ADDR_C, may be transmitted to the first memory bank (BK0) 211. The second MAC read signal MAC_RD_BK1 having a logic "high(H)" level, together with the row/column address ADDR_R/ADDR_C, may be transmitted to the second memory bank (BK1) 212. The second data DA2 may be read out of the second memory bank (BK1) 212 by the second MAC read signal MAC_RD_BK1 having a logic "high(H)" level and may be transmitted to the first MAC operator (MAC0) 220 through the GIO line 290.

Figure 11:
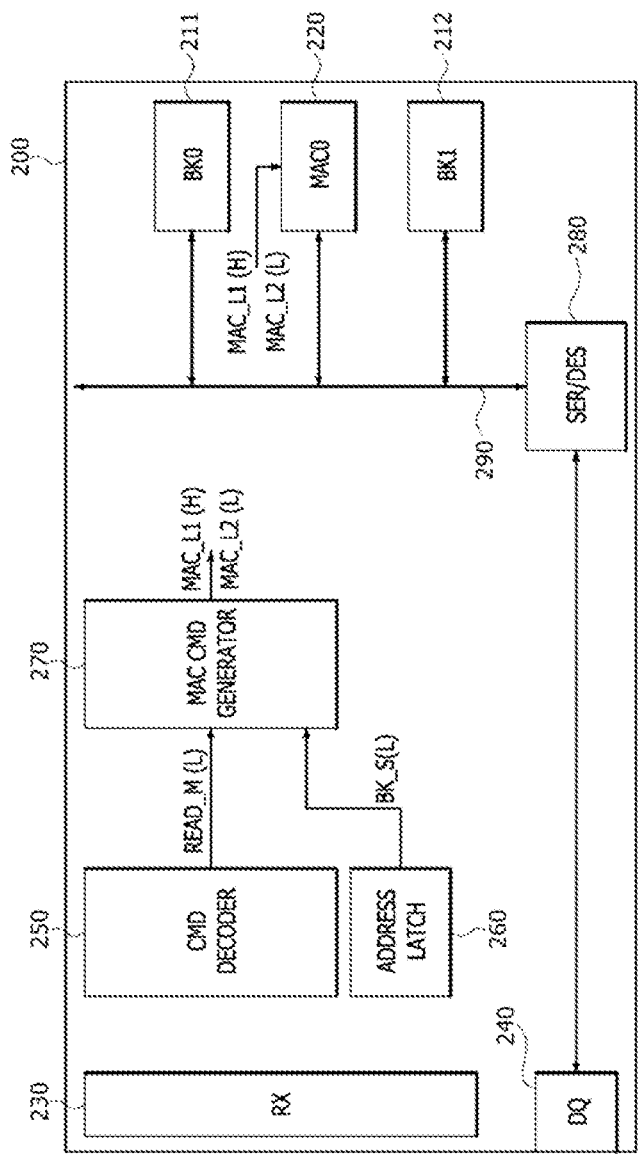

Next, referring to FIG. 11, a logic level of the memory read signal READ_M transmitted from the command decoder 250 to the MAC command generator 270 may change from a logic "high(H)" level into a logic "low(L)" level. In addition, a logic level of the bank selection signal BK_S transmitted from the address latch 260 to the MAC command generator 270 may change from a logic "high(H)" level into a logic "low(L)" level. In such a case, the MAC command generator 270 may generate and output the first MAC input latch signal MAC_L1 having a logic "high(H)" level and the second MAC input latch signal MAC_L2 having a logic "low(L)" level. A point in time when the first MAC input latch signal MAC_L1 having a logic "high(H)" level and the second MAC input latch signal MAC_L2 having a logic "low(L)" level are outputted from the MAC command generator 270 may be determined by a delay time of the delay circuit (271 of FIG. 4), as described with reference to FIG. 5. The first MAC input latch signal MAC_L1 having a logic "high(H)" level and the second MAC input latch signal MAC_L2 having a logic "low(L)" level outputted from the MAC command generator 270 may be transmitted to the first MAC operator (MAC0) 220. As described with reference to FIG. 7, the first MAC operator (MAC0) 220 may perform a latch operation of the first data DA1.

Figure 12:
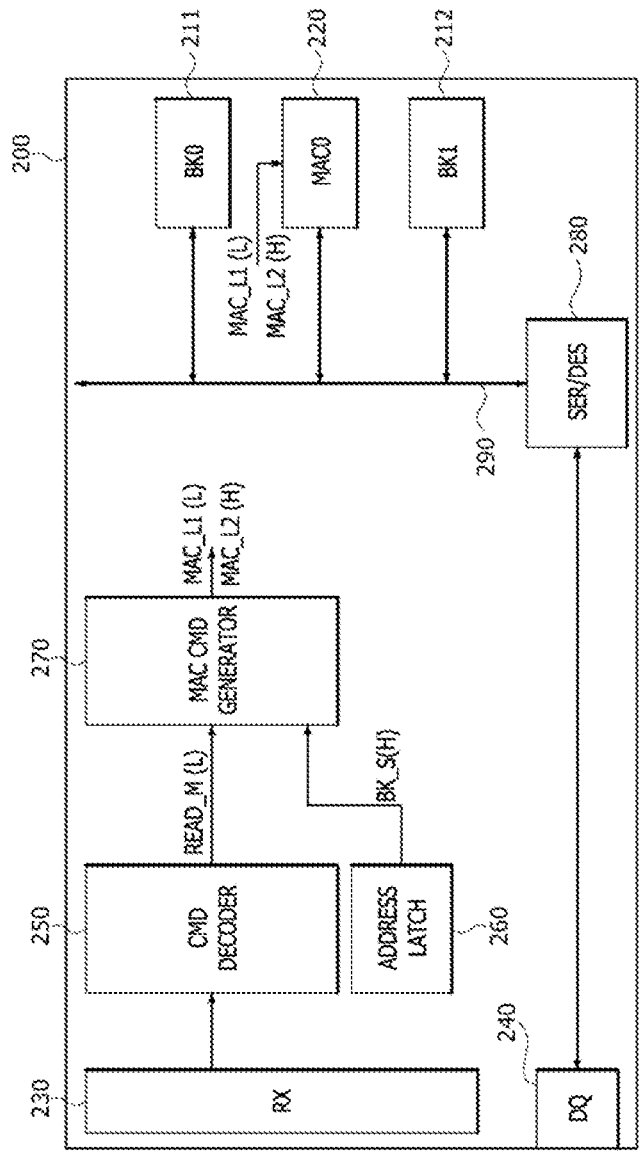

Next, referring to FIG. 12, a logic level of the bank selection signal BK_S transmitted from the address latch 260 to the MAC command generator 270 may change from a logic "low(L)" level into a logic "high(H)" level while the memory read signal READ_M maintains a logic "low(L)" level. In such a case, the MAC command generator 270 may generate and output the first MAC input latch signal MAC_L1 having a logic "low(L)" level and the second MAC input latch signal MAC_L2 having a logic "high(H)" level. A point in time when the first MAC input latch signal MAC_L1 having a logic "low(L)" level and the second MAC input latch signal MAC_L2 having a logic "high(H)" level are outputted from the MAC command generator 270 may be determined by a delay time of the delay circuit (271 of FIG. 5), as described with reference to FIG. 5. The first MAC input latch signal MAC_L1 having a logic "low(L)" level and the second MAC input latch signal MAC_L2 having a logic "high(H)" level outputted from the MAC command generator 270 may be transmitted to the first MAC operator (MAC0) 220. As described with reference to FIG. 7, the first MAC operator (MAC0) 220 may perform a latch operation of the second data DA2. After the latch operations of the first and second data DA1 and DA2 terminate, the first MAC operator (MAC0) 220 may perform the MAC arithmetic operation and may generate the MAC result data DA_MAC. The MAC result data DA_MAC generated by the first MAC operator (MAC0) 220 may be inputted to the output latch 223-1 included in the first MAC operator (MAC0) 220.

Figure 13:
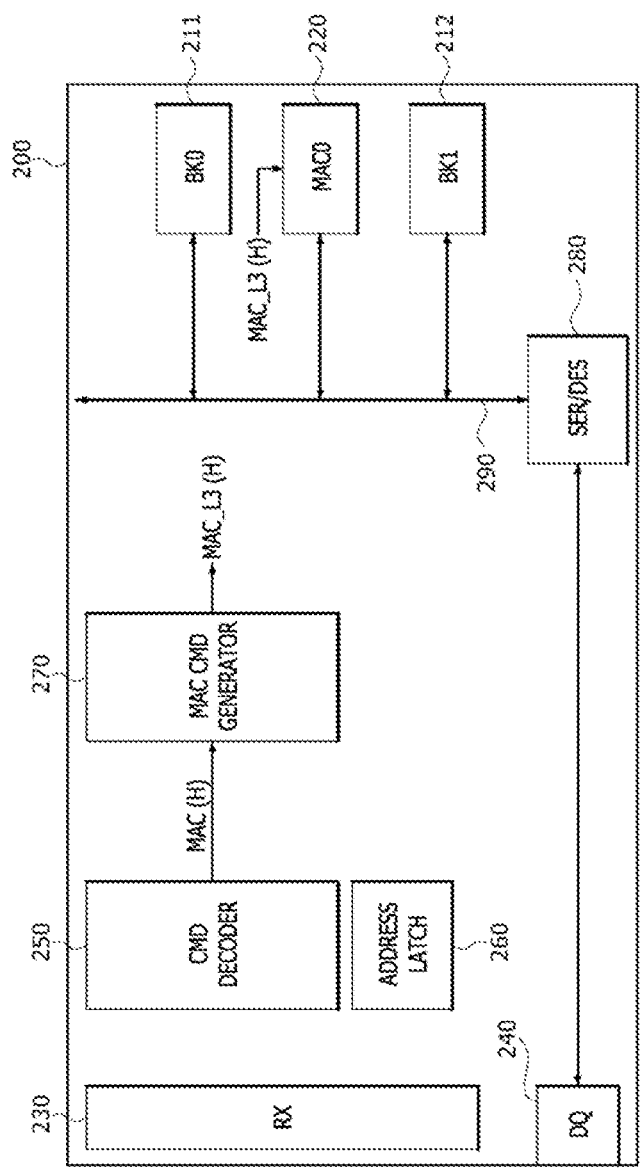

Next, referring to FIG. 13, the command decoder 250 may output and transmit the MAC arithmetic signal MAC having a logic "high(H)" level to the MAC command generator 270. The MAC command generator 270 may generate and output the MAC output latch signal MAC_L3 having a logic "high" level in response to the MAC arithmetic signal MAC having a logic "high(H)" level. The MAC output latch signal MAC_L3 having a logic "high" level may be transmitted to the first MAC operator (MAC0) 220. As described with reference to FIG. 7, the output latch (223-1 of FIG. 7) of the first MAC operator (MAC0) 220 may be synchronized with the MAC output latch signal MAC_L3 having a logic "high" level to transfer the MAC result data DA_MAC outputted from the MAC circuit 222 of the first MAC operator (MAC0) 220 to the transfer gate (233-2 of FIG. 7) of the first MAC operator (MAC0) 220. The MAC result data DA_MAC outputted from the output latch (223-1 of FIG. 7) may be fed back to the addition logic circuit (222-2 of FIG. 7) for the accumulative adding calculation.

Figure 14:
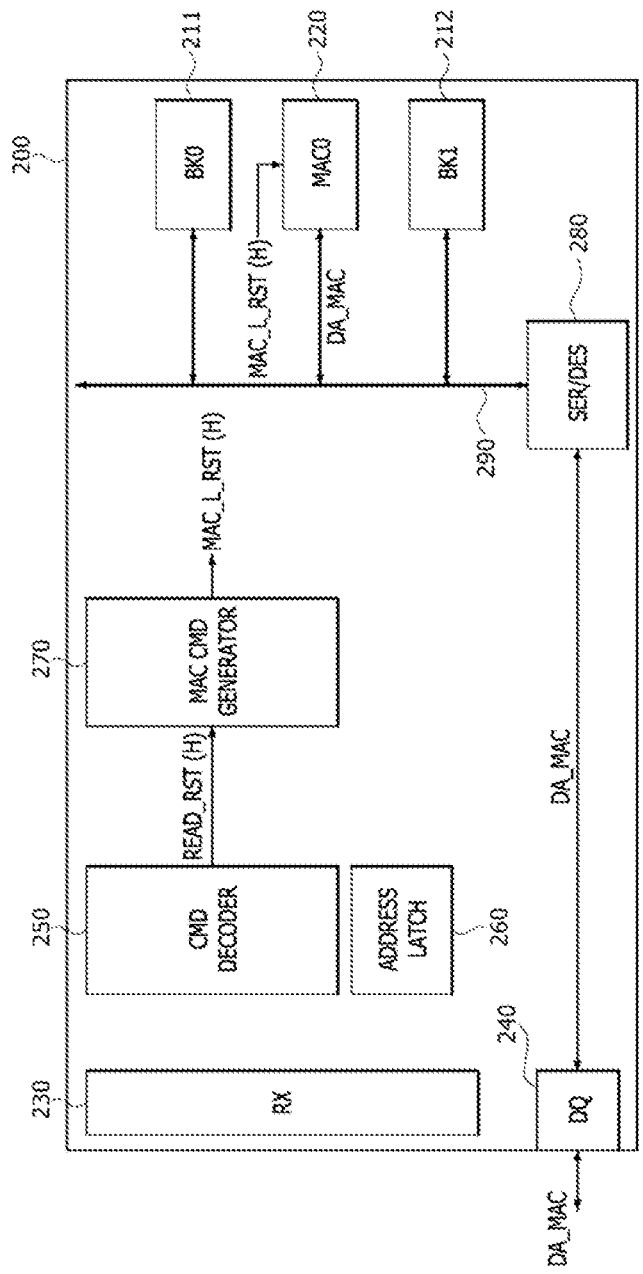

Next, referring to FIG. 14, the command decoder 250 may output and transmit the result read signal READ_RST having a logic "high(H)" level to the MAC command generator 270. The MAC command generator 270 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 220. As described with reference to FIG. 7, the first MAC operator (MAC0) 220 may output the MAC result data DA_MAC to the GIO line 290 in response to the MAC result latch signal MAC_L_RST having a logic "high" level and may also reset the output latch (223-1 of FIG. 6) included in the first MAC operator (MAC0) 220 in response to the MAC result latch signal MAC_L_RST having a logic "high" level. The MAC result data DA_MAC transmitted to the GIO line 290 may be outputted to an external device through the serializer/deserializer 280 and the data I/O circuit 240.

Figure 15:
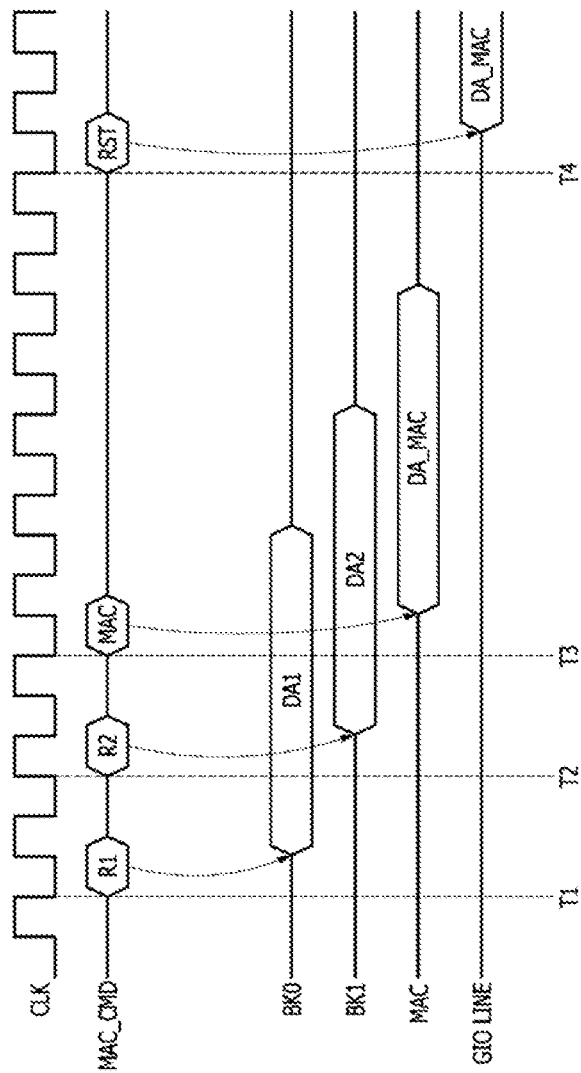
FIG. 15 is a timing diagram illustrating an operation of the PIM device illustrated in FIG. 3.

FIG. 15 is a timing diagram illustrating an operation of the PIM device 200 illustrate in FIG. 3. Referring to FIG. 15, at a first point in time "T1", the MAC command generator 270 may be synchronized with a falling edge of a clock signal CLK to generate and output the first MAC read signal MAC_RD_BK0 (R1) having a logic "high(H)" level. The first memory bank (BK0) 211 may be selected by the first MAC read signal MAC_RD_BK0 (R1) having a logic "high(H)" level so that the first data DA1 are read out of the first memory bank (BK0) 211. At a second point in time "T2", the MAC command generator 270 may be synchronized with a falling edge of the clock signal CLK to generate and output the second MAC read signal MAC_RD_BK1 (R2) having a logic "high(H)" level. The second memory bank (BK1) 212 may be selected by the second MAC read signal MAC_RD_BK1 (R2) having a logic "high(H)" level so that the second data DA2 are read out of the second memory bank (BK1) 212. At a third point in time "T3", the MAC command generator 270 may be synchronized with a falling edge of the clock signal CLK to generate and output the MAC arithmetic signal MAC having a logic "high(H)" level. The first MAC operator (MAC0) 220 may perform the multiplying calculations and the adding calculations of the first and second data DA1 and DA2 to generate the MAC result data DA_MAC, in response to the MAC arithmetic signal MAC having a logic "high(H)" level. At a fourth point in time "T4", the MAC command generator 270 may be synchronized with a falling edge of the clock signal CLK to generate and output the MAC result latch signal MAC_L_RST (RST) having a logic "high" level. The MAC result data DA_MAC generated by the first MAC operator (MAC0) 220 may be transmitted to the GIO line 290 by the MAC result latch signal MAC_L_RST (RST) having a logic "high" level.

Figure 16:
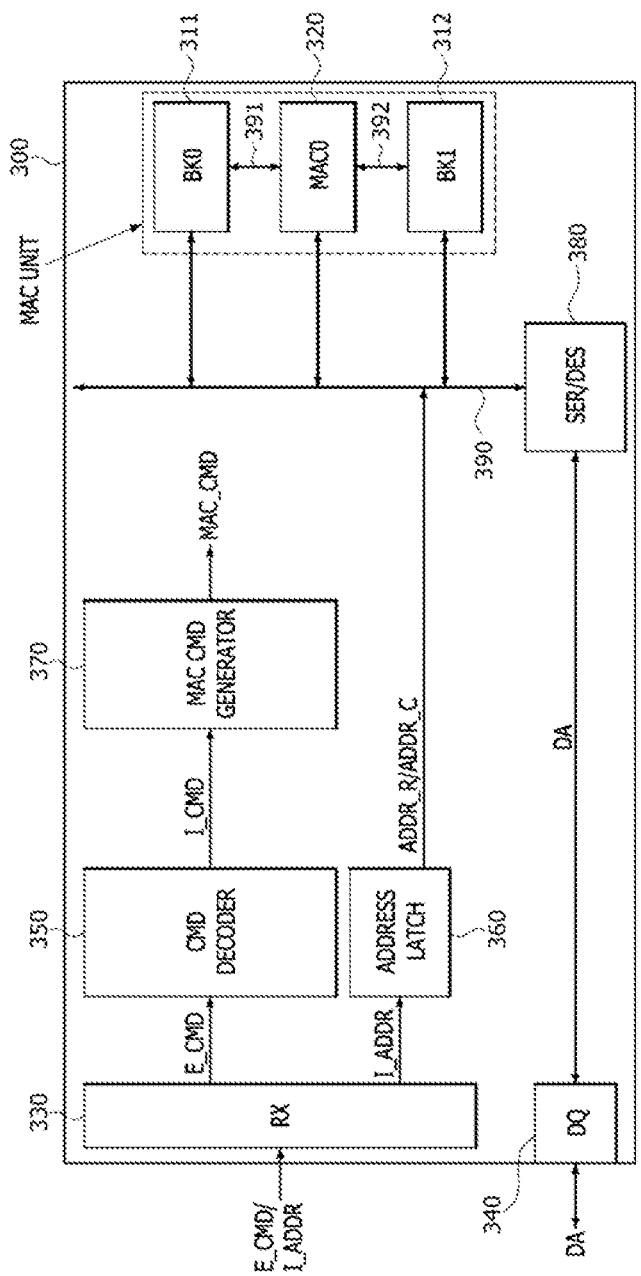
FIG. 16 is a block diagram illustrating another configuration of a PIM device according to the first embodiment of the present disclosure.
Figure 17:
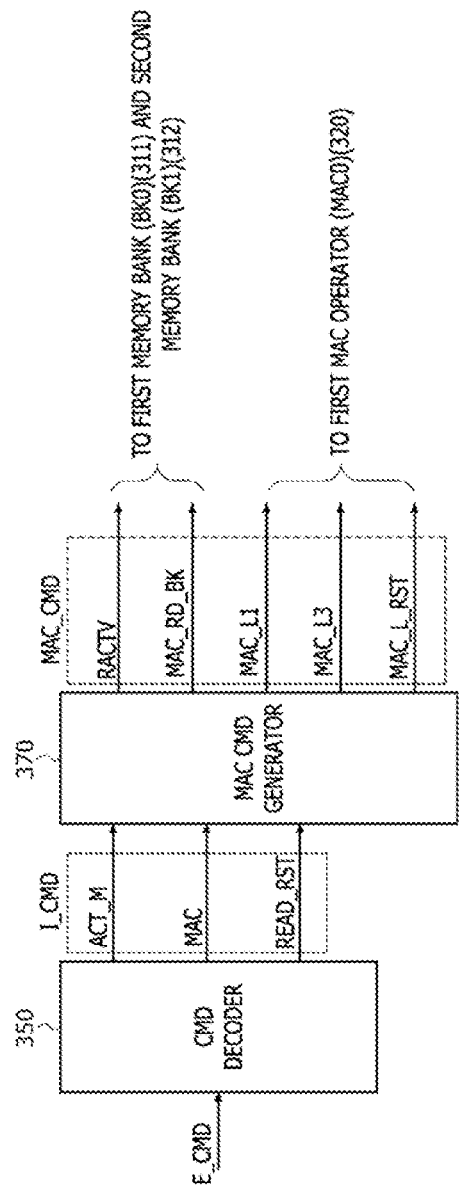
FIG. 17 illustrates internal command signals outputted from a command decoder and MAC command signals outputted from a MAC command generator in the PIM device of FIG. 16.

FIG. 16 is a block diagram illustrating another configuration of a PIM device 300 according to an embodiment of the present disclosure, and FIG. 17 illustrates an internal command signal I_CMD outputted from a command decoder 350 of the PIM device 300 and a MAC command signal MAC_CMD outputted from a MAC command generator 370 of the PIM device 300. FIG. 16 illustrates only a first memory bank (BK0) 311, a second memory bank (BK1) 312, and a first MAC operator (MAC0) 320 constituting a first MAC unit among the plurality of MAC units. However, FIG. 16 illustrates merely an example for simplification of the drawing. Accordingly, the following description for the first MAC unit may be equally applicable to the remaining MAC units.

Referring to FIG. 16, the PIM device 300 may be configured to include the first memory bank (BK0) 311, the second memory bank (BK1) 312, and the first MAC operator (MAC0) 320. The PIM device 300 according to the present embodiment may include a GIO line 390, a first bank input/output (BIO) line 391, and a second BIO line 392 acting as data transmission lines. Data communication of the first memory bank (BK0) 311, the second memory bank (BK1) 312, and the first MAC operator (MAC0) 320 may be achieved through the GIO line 390. Only the data transmission between the first memory bank (BK0) 311 and the first MAC operator (MAC0) 320 may be achieved through the first BIO line 391, and only the data transmission between the second memory bank (BK1) 312 and the first MAC operator (MAC0) 320 may be achieved through the second BIO line 392. Thus, the first MAC operator (MAC0) 320 may directly receive first data and second data from the first and second memory banks (BK0 and BK1) 311 and 312 through the first BIO line 391 and the second BIO line 392 without using the GIO line 390.

The PIM device 300 may further include a receiving driver (RX) 330, a data I/O circuit (DQ) 340, the command decoder 350, an address latch 360, the MAC command generator 370, and a serializer/deserializer (SER/DES) 380. The command decoder 350, the address latch 360, the MAC command generator 370, and the serializer/deserializer 380 may be disposed in the peripheral circuit PERI of the PIM device 100 illustrated in FIG. 2. The receiving driver 330 may receive an external command E_CMD and an input address I_ADDR from an external device. The external device may denote a host or a controller coupled to the PIM device 300. Hereinafter, it may be assumed that the external command E_CMD transmitted to the PIM device 300 is a command requesting the MAC arithmetic operation. That is, the PIM device 300 may perform the deterministic MAC arithmetic operation in response to the external command E_CMD. The data I/O circuit 340 may include a data I/O pad. The data I/O pad may be coupled with an data I/O line. The PIM device 300 communicates with the external device through the data I/O circuit 340.

The receiving driver 330 may separately output the external command E_CMD and the input address I_ADDR received from the external device. Data DA inputted to the PIM device 300 through the data I/O circuit 340 may be processed by the serializer/deserializer 380 and may be transmitted to the first memory bank (BK0) 311 and the second memory bank (BK1) 312 through the GIO line 390 of the PIM device 300. The data DA outputted from the first memory bank (BK0) 311, the second memory bank (BK1) 312, and the first MAC operator (MAC0) 320 through the GIO line 390 may be processed by the serializer/deserializer 380 and may be outputted to the external device through the data I/O circuit 340. The serializer/deserializer 380 may convert the data DA into parallel data if the data DA are serial data or may convert the data DA into serial data if the data DA are parallel data. For the data conversion, the serializer/deserializer 380 may include a serializer for converting parallel data into serial data and a deserializer for converting serial data into parallel data.

The command decoder 350 may decode the external command E_CMD outputted from the receiving driver 330 to generate and output the internal command signal I_CMD. As illustrated in FIG. 17, the internal command signal I_CMD outputted from the command decoder 350 may include first to third internal command signals. In an embodiment, the first internal command signal may be a memory active signal ACT_M, the second internal command signal may be a MAC arithmetic signal MAC, and the third internal command signal may be a result read signal READ_RST. The first to third internal command signals outputted from the command decoder 350 may be sequentially inputted to the MAC command generator 370.

In order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks). In an embodiment, the memory active signal ACT_M, the MAC arithmetic signal MAC, and the result read signal READ_RST may have predetermined latencies, respectively. For example, the MAC arithmetic signal MAC may be generated after a first latency elapses from a point in time when the memory active signal ACT_M is generated, and the result read signal READ_RST may be generated after a third latency elapses from a point in time when the MAC arithmetic signal MAC is generated. No signal is generated by the command decoder 350 until a fourth latency elapses from a point in time when the result read signal READ_RST is generated. The first to fourth latencies may be predetermined and fixed. Thus, the host or the controller outputting the external command E_CMD may predict the points in time when the first to third internal command signals constituting the internal command signal I_CMD are generated by the command decoder 350 in advance at a point in time when the external command E_CMD is outputted from the host or the controller. That is, the host or the controller may predict a point in time (or a clock) when the MAC arithmetic operation terminates in the PIM device 300 after the external command E_CMD requesting the MAC arithmetic operation is transmitted from the host or the controller to the PIM device 300, even without receiving any signals from the PIM device 300.

The address latch 360 may convert the input address I_ADDR outputted from the receiving driver 330 into a row/column address ADDR_R/ADDR_C to output the row/column address ADDR_R/ADDR_C. The row/column address ADDR_R/ADDR_C outputted from the address latch 360 may be transmitted to the first and second memory banks 311 and 312. According to the present embodiment, the first data and the second data to be used for the MAC arithmetic operation may be simultaneously read out of the first and second memory banks (BK0 and BK1) 311 and 312, respectively. Thus, it may be unnecessary to generate a bank selection signal for selecting any one of the first and second memory banks 311 and 312. In an embodiment, a point in time when the row/column address ADDR_R/ADDR_C is inputted to the first and second memory banks 311 and 312 may be a point in time when a MAC command (i.e., the MAC arithmetic signal MAC) requesting a data read operation for the first and second memory banks 311 and 312 for the MAC arithmetic operation is generated.

The MAC command generator 370 may output the MAC command signal MAC_CMD in response to the internal command signal I_CMD outputted from the command decoder 350. As illustrated in FIG. 16, the MAC command signal MAC_CMD outputted from the MAC command generator 370 may include first to fifth MAC command signals. In an embodiment, the first MAC command signal may be a MAC active signal RACTV, the second MAC command signal may be a MAC read signal MAC_RD_BK, the third MAC command signal may be a MAC input latch signal MAC_L1, the fourth MAC command signal may be a MAC output latch signal MAC_L3, and the fifth MAC command signal may be a MAC result latch signal MAC_L_RST.

The MAC active signal RACTV may be generated based on the memory active signal ACT_M outputted from the command decoder 350. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 350. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 350.

The MAC active signal RACTV outputted from the MAC command generator 370 may control an activation operation for the first and second memory banks 311 and 312. The MAC read signal MAC_RD_BK outputted from the MAC command generator 370 may control a data read operation for the first and second memory banks 311 and 312. The MAC input latch signal MAC_L1 outputted from the MAC command generator 370 may control an input data latch operation of the first MAC operator (MAC0) 320. The MAC output latch signal MAC_L3 outputted from the MAC command generator 370 may control an output data latch operation of the first MAC operator (MAC0) 320. The MAC result latch signal MAC_L_RST outputted from the MAC command generator 370 may control an output operation of MAC result data of the first MAC operator (MAC0) 320 and a reset operation of the first MAC operator (MAC0) 320.

As described above, in order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 370 at predetermined points in time after the external command E_CMD is inputted to the PIM device 300, respectively. That is, a time period from a point in time when the first and second memory banks 311 and 312 are activated by the MAC active signal RACTV until a point in time when the first MAC operator (MAC0) 320 is reset by the MAC result latch signal MAC_L_RST may be predetermined.

Figure 18:
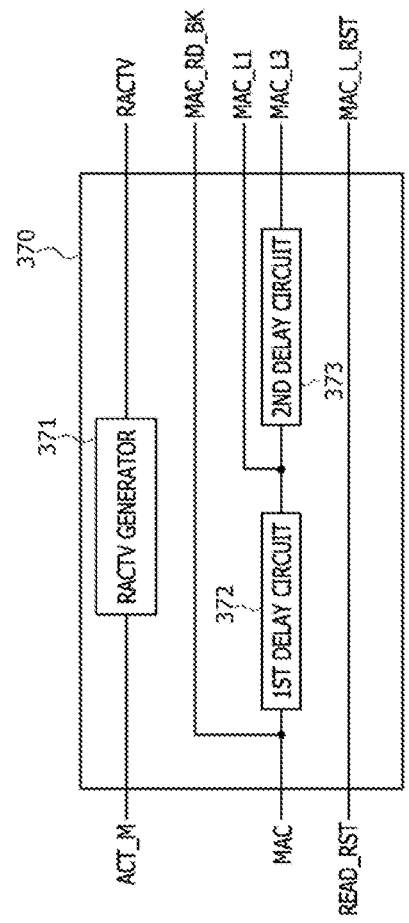
FIG. 18 illustrates an example of a configuration of a MAC command generator included in the PIM device of FIG. 16.

FIG. 18 illustrates an example of a configuration of the MAC command generator 370 included in the PIM device 300 illustrated in FIG. 16. Referring to FIG. 18, the MAC command generator 370 may sequentially receive the memory active signal ACT_M, the MAC arithmetic signal MAC, and the result read signal READ_RST from the command decoder 350. In addition, the MAC command generator 370 may sequentially generate and output the MAC active signal RACTV, the MAC read signal MAC_RD_BK, the MAC input latch signal MAC_L1, the MAC output latch signal MAC_L3, and the MAC result latch signal MAC_L_RST. The MAC active signal RACTV, the MAC read signal MAC_RD_BK, the MAC input latch signal MAC_L1, the MAC output latch signal MAC_L3, and the MAC result latch signal MAC_L_RST may be outputted in series with certain time intervals.

In an embodiment, the MAC command generator 370 may be configured to include an active signal generator 371, a first delay circuit 372, and a second delay circuit 373. The active signal generator 371 may receive the memory active signal ACT_M to generate and output the MAC active signal RACTV. The MAC active signal RACTV outputted from the active signal generator 371 may be transmitted to the first and second memory banks 311 and 312 to activate the first and second memory banks 311 and 312. The MAC command generator 370 may receive the MAC arithmetic signal MAC outputted from the command decoder 350 to output the MAC arithmetic signal MAC as the MAC read signal MAC_RD_BK. The first delay circuit 372 may receive the MAC arithmetic signal MAC and may delay the MAC arithmetic signal MAC by a first delay time DELAY_T1 to generate and output the MAC input latch signal MAC_L1. The second delay circuit 373 may receive an output signal of the first delay circuit 372 and may delay the output signal of the first delay circuit 372 by a second delay time DELAY_T2 to generate and output the MAC output latch signal MAC_L3. The MAC command generator 370 may generate the MAC result latch signal MAC_L_RST in response to the result read signal READ_RST outputted from the command decoder 350.

The MAC command generator 370 may generate and output the MAC active signal RACTV in response to the memory active signal ACT_M outputted from the command decoder 350. Subsequently, the MAC command generator 370 may generate and output the MAC read signal MAC_RD_BK in response to the MAC arithmetic signal MAC outputted from the command decoder 350. The MAC arithmetic signal MAC may be inputted to the first delay circuit 372. The MAC command generator 370 may delay the MAC arithmetic signal MAC by a certain time determined by the first delay circuit 372 to generate and output an output signal of the first delay circuit 372 as the MAC input latch signal MAC_L1. The output signal of the first delay circuit 372 may be inputted to the second delay circuit 373. The MAC command generator 370 may delay the MAC input latch signal MAC_L1 by a certain time determined by the second delay circuit 373 to generate and output an output signal of the second delay circuit 373 as the MAC output latch signal MAC_L3. Subsequently, the MAC command generator 370 may generate and output the MAC result latch signal MAC_L_RST in response to the result read signal READ_RST outputted from the command decoder 350.

Figure 19:
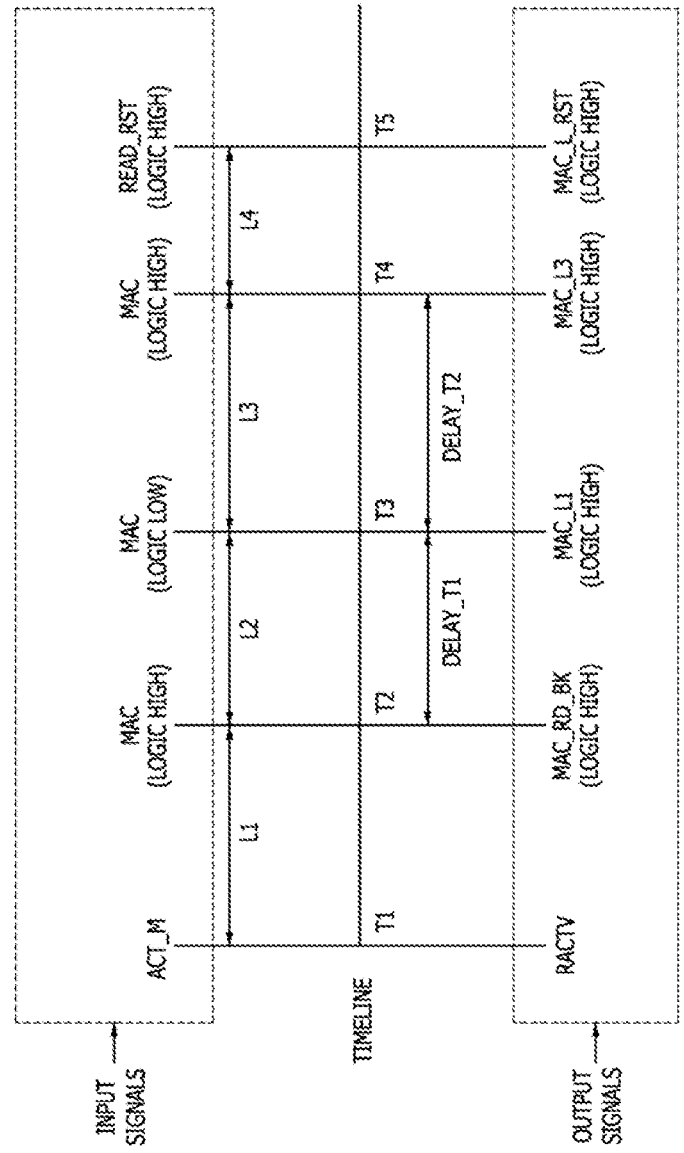
FIG. 19 illustrates input signals and output signals of the MAC command generator illustrated in FIG. 18 with a timeline.

FIG. 19 illustrates input signals and output signals of the MAC command generator 370 illustrated in FIG. 18 with a timeline. In FIG. 19, signals transmitted from the command decoder 350 to the MAC command generator 370 are illustrated in an upper dotted line box, and signals outputted from the MAC command generator 370 are illustrated in a lower dotted line box. Referring to FIGS. 18 and 19, at a first point in time "T1" of the timeline, the memory active signal ACT_M may be inputted to the MAC command generator 370 and the MAC command generator 370 may output the MAC active signal RACTV. At a second point in time "T2" when a certain time, for example, a first latency L1 elapses from the first point in time "T1", the MAC arithmetic signal MAC having a logic "high" level may be inputted to the MAC command generator 370. In response to the MAC arithmetic signal MAC having a logic "high" level, the MAC command generator 370 may output the MAC read signal MAC_RD_BK having a logic "high" level. At a third point in time "T3" when a certain time elapses from the second point in time "T2", a logic level of the MAC arithmetic signal MAC may change from a logic "high" level into a logic "low" level.

At the third point in time "T3" when the first delay time DELAY_T1 elapses from the second point in time "T2", the MAC command generator 370 may output the MAC input latch signal MAC_L1 having a logic "high" level. The first delay time DELAY_T1 may correspond to a delay time determined by the first delay circuit 372 illustrated in FIG. 18. The first delay time DELAY_T1 may be set to be different according to a logic design scheme of the first delay circuit 372. In an embodiment, the first delay time DELAY_T1 may be set to be equal to or greater than a second latency L2. At a fourth point in time "T4" when a certain time elapses from the third point in time "T3", the MAC command generator 370 may output the MAC output latch signal MAC_L3 having a logic "high" level. The fourth point in time "T4" may be a moment when the second delay time DELAY_T2 elapses from the third point in time "T3". The second delay time DELAY_T2 may correspond to a delay time determined by the second delay circuit 373 illustrated in FIG. 18. The second delay time DELAY_T2 may be set to be different according to a logic design scheme of the second delay circuit 373. In an embodiment, the second delay time DELAY_T2 may be set to be equal to or greater than a third latency L3. At a fifth point in time "T5" when a certain time, for example, a fourth L4 elapses from the fourth point in time "T4", the result read signal READ_RST having a logic "high" level may be inputted to the MAC command generator 370. In response to the result read signal READ_RST having a logic "high" level, the MAC command generator 370 may output the MAC result latch signal MAC_L_RST having a logic "high" level, as described with reference to FIG. 18.

In order to perform the deterministic MAC arithmetic operation, moments when the internal command signals ACT_M, MAC, and READ_RST generated by the command decoder 350 are inputted to the MAC command generator 370 may be fixed and moments when the MAC command signals RACTV, MAC_RD_BK, MAC_L1, MAC_L3, and MAC_L_RST are outputted from the MAC command generator 370 in response to the internal command signals ACT_M, MAC, and READ_RST may also be fixed. Thus, all of the first latency L1 between the first point in time "T1" and the second point in time "T2", the second latency L2 between the second point in time "T2" and the third point in time "T3", the third latency L3 between the third point in time "T3" and the fourth point in time "T4", and the fourth latency L4 between the fourth point in time "T4" and the fifth point in time "T5" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks (BK0 and BK1) 311 and 312 based on the MAC read signals MAC_RD_BK and to input the first and second data DA1 and DA2 into the first MAC operator (MAC0) 320. The third latency L3 may be defined as a time it takes to latch the first and second data DA1 and DA2 in the first MAC operator (MAC0) 320 based on the MAC input latch signals MAC_L1 and it takes the first MAC operator (MAC0) 320 to perform the MAC arithmetic operation of the first and second data. The fourth latency L4 may be defined as a time it takes to latch the output data in the first MAC operator (MAC0) 320 based on the MAC output latch signal MAC_L3.

Figure 20:
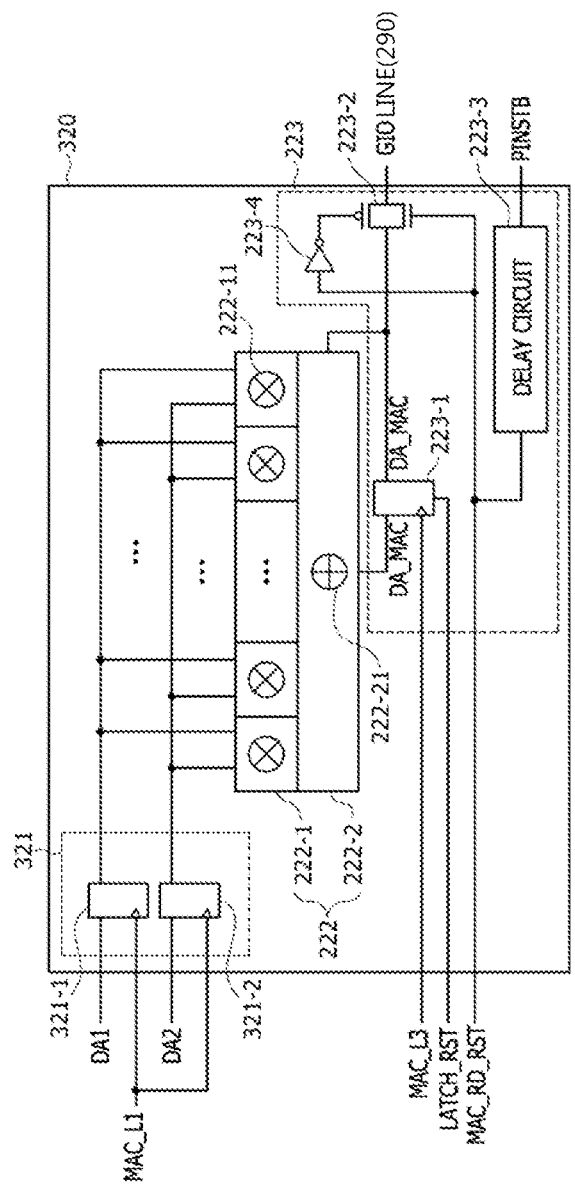
FIG. 20 illustrates an example of a configuration of a MAC operator included in the PIM device of FIG. 16.
Figure 21:
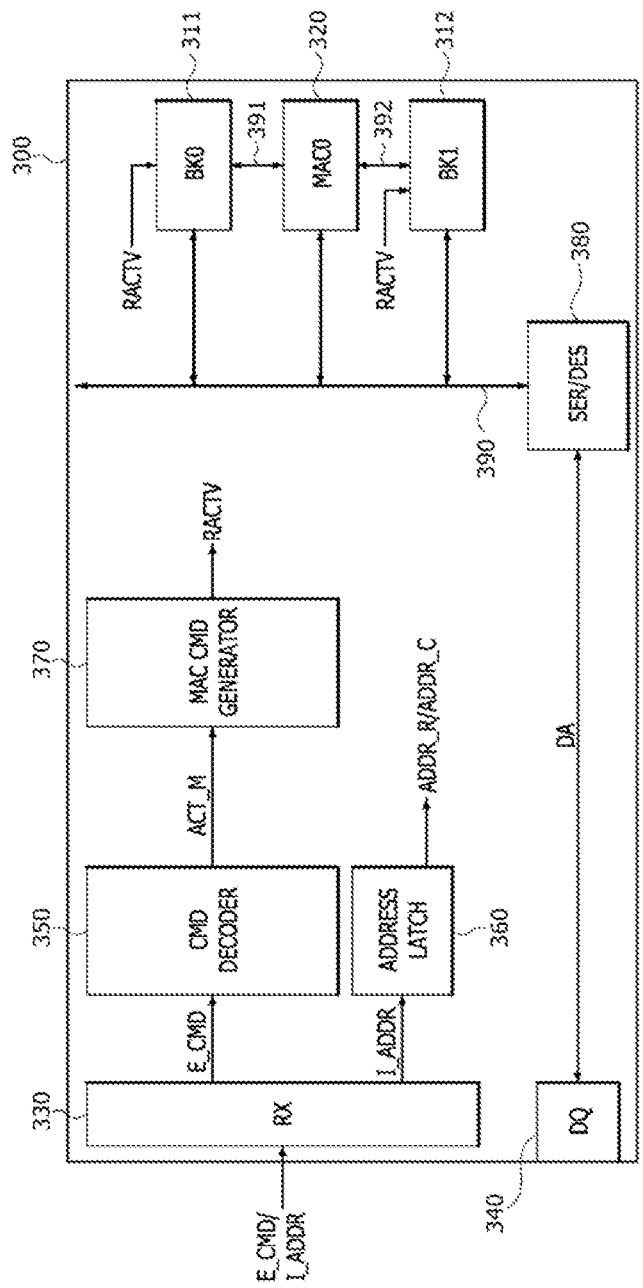
FIGS. 21 to 25 are block diagrams illustrating operations of the PIM device illustrated in FIG. 16.

FIG. 20 illustrates an example of a configuration of the first MAC operator (MAC0) 320 included in the PIM device 300 of FIG. 16. The first MAC operator (MAC0) 320 included in the PIM device 300 may have the same configuration as the first MAC operator (MAC0) 220 described with reference to FIG. 7 except for a signal applied to clock terminals of first and second input latches 321-1 and 321-2 constituting a data input circuit 321. Thus, in FIG. 20, the same reference numerals or the same reference symbols as used in FIG. 7 denote the same elements, and descriptions of the same elements as set forth with reference to FIG. 7 will be omitted hereinafter.

Describing in detail the differences between the first MAC operator (MAC0) 220 and the first MAC operator (MAC0) 320, in case of the first MAC operator (MAC0) 220 illustrated in FIG. 7, the first input latch (221-1 of FIG. 7) and the second input latch (221-2 of FIG. 7) of the data input circuit (221 of FIG. 7) may be synchronized with the first and second MAC input latch signals MAC_L1 and MAC_L2, respectively, sequentially generated with a certain time interval to output the first data DA1 and the second data DA2. In contrast, in case of the first MAC operator (MAC0) 320, the MAC input latch signal MAC_L1 may be inputted to both of the clock terminals of the first and second input latches 321-1 and 321-2 constituting a data input circuit 321. Thus, both of the first and second input latches 321-1 and 321-2 may be synchronized with the MAC input latch signal MAC_L1 to output the first data DA1 and the second data DA2, respectively. Accordingly, the first MAC operator (MAC0) 320 may transmit the first and second data DA1 and DA2 to the MAC circuit 222 in parallel without any time interval between the first and second data DA1 and DA2. As a result, the MAC arithmetic operation of the MAC circuit 222 may be quickly performed without any delay of data input time.

FIGS. 21 to 25 are block diagrams illustrating operations of the PIM device 300 illustrated in FIG. 16. In FIGS. 21 to 25, the same reference numerals or the same reference symbols as used in FIG. 16 denote the same elements. First, referring to FIG. 21, if the external command E_CMD requesting the MAC arithmetic operation and the input address I_ADDR are transmitted from an external device to the receiving driver 330, the receiving driver 330 may output the external command E_CMD and the input address I_ADDR to the command decoder 350 and the address latch 360, respectively. The command decoder 350 may decode the external command E_CMD to generate and transmit the memory active signal ACT_M to the MAC command generator 370. The MAC command generator 370 may generate and output the MAC active signal RACTV in response to the memory active signal ACT_M. The MAC active signal RACTV may be transmitted to the first memory bank (BK0) 311 and the second memory bank (BK1) 312. Both of the first memory bank (BK0) 311 and the second memory bank (BK1) 312 may be activated by the MAC active signal RACTV.

Figure 22:
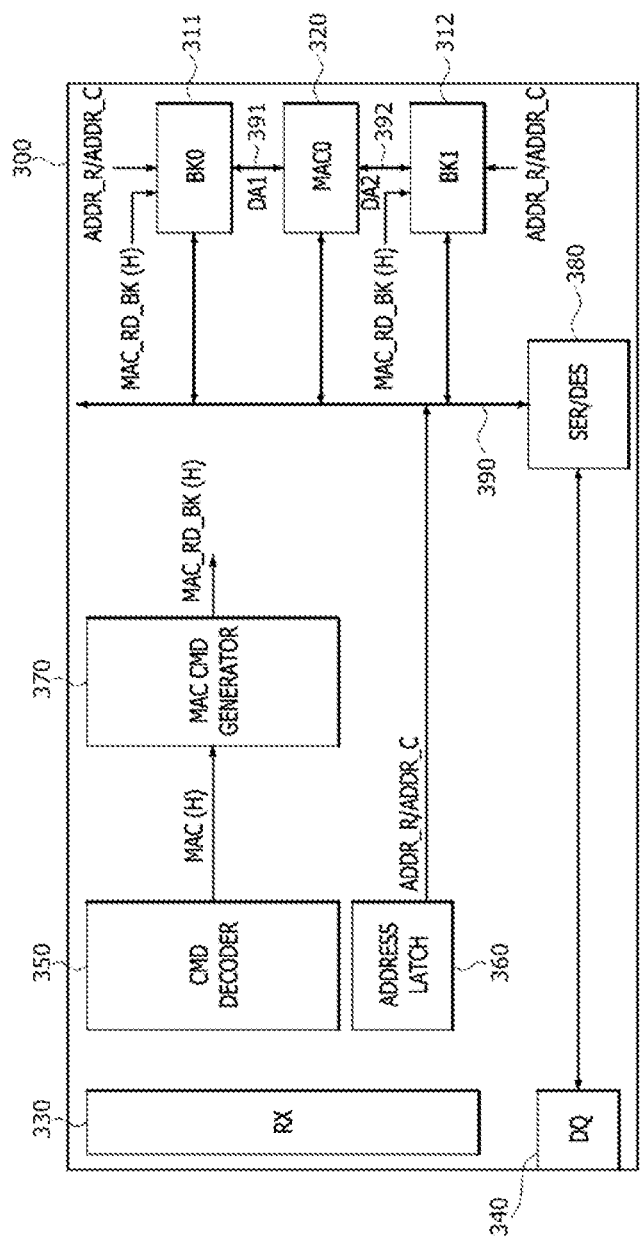

Next, referring to FIG. 22, the command decoder 350 may generate and output the MAC arithmetic signal MAC having a logic "high(H)" level to the MAC command generator 370. In response to the MAC arithmetic signal MAC having a logic "high(H)" level, the MAC command generator 370 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 311 and the second memory bank (BK1) 312. The first data DA1 may be read out of the first memory bank (BK0) 311 by the MAC read signal MAC_RD_BK having a logic "high(H)" level and may be transmitted to the first MAC operator (MAC0) 320 through the first BIO line 391. In addition, the second data DA2 may be read out of the second memory bank (BK1) 312 by the MAC read signal MAC_RD_BK having a logic "high(H)" level and may be transmitted to the first MAC operator (MAC0) 320 through the second BIO line 392.

Figure 23:
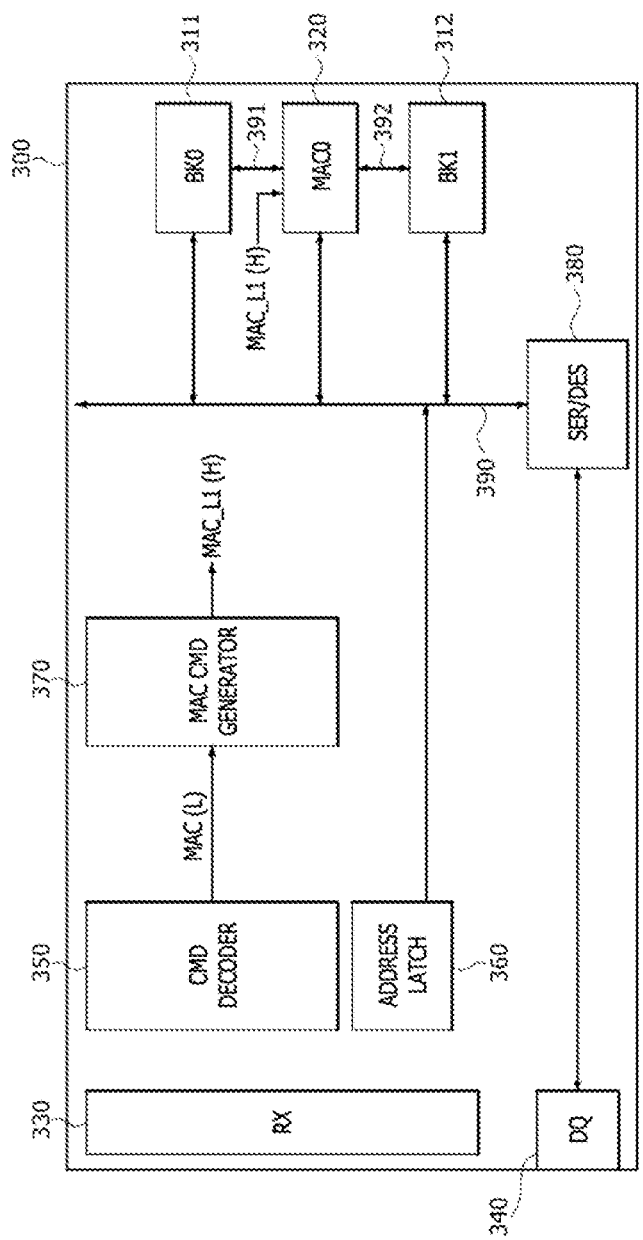

Next, referring to FIG. 23, a logic level of the MAC arithmetic signal MAC outputted from the command decoder 350 may change from a logic "high(H)" level into a logic "low(L)" level at a point in time when the first delay time DELAY_T1 determined by the first delay circuit (372 of FIG. 18) elapses from a point in time when the MAC read signal MAC_RD_BK is outputted from the MAC command generator 370. The MAC command generator 370 may generate and output the MAC input latch signal MAC_L1 having a logic "high(H)" level in response to the MAC arithmetic signal MAC having a logic "low(L)" level. The MAC input latch signal MAC_L1 having a logic "high(H)" level may be transmitted to the first MAC operator (MAC0) 320. The first MAC operator (MAC0) 320 may be synchronized with the MAC input latch signal MAC_L1 having a logic "high(H)" level to perform a latch operation of the first and second data DA1 and DA2 outputted from the first and second memory banks (BK0 and BK1) 311 and 312. If the latch operation of the first and second data DA1 and DA2 terminates, the first MAC operator (MAC0) 320 may perform the MAC arithmetic operation and may generate the MAC result data DA_MAC. The MAC result data DA_MAC generated by the first MAC operator (MAC0) 320 may be inputted to the output latch (223-1 of FIG. 20) included in the first MAC operator (MAC0) 320.

Figure 24:
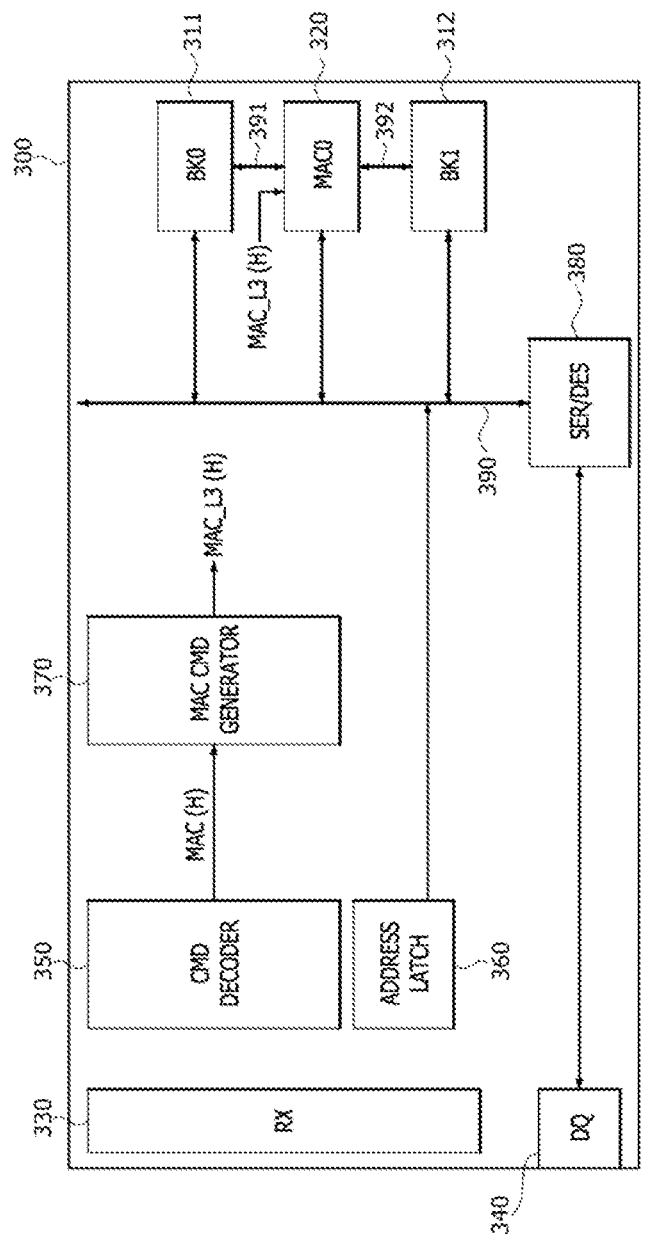

Next, referring to FIG. 24, a logic level of the MAC arithmetic signal MAC outputted from the command decoder 350 may change from a logic "low(L)" level into a logic "high(H)" level at a point in time when the second delay time DELAY_T2 determined by the second delay circuit (373 of FIG. 18) elapses from a point in time when the MAC input latch signal MAC_L1 having a logic "high (H)" level is outputted from the MAC command generator 370. The MAC command generator 370 may generate and output the MAC output latch signal MAC_L3 having a logic "high(H)" level in response to the MAC arithmetic signal MAC having a logic "high(H)" level. The MAC output latch signal MAC_L3 having a logic "high(H)" level may be transmitted to the first MAC operator (MAC0) 320. The output latch (223-1 of FIG. 20) included in the first MAC operator (MAC0) 320 may be synchronized with the MAC output latch signal MAC_L3 having a logic "high(H)" level to transfer the MAC result data DA_MAC generated by the MAC circuit (222 of FIG. 20) to the transfer gate (223-2 of FIG. 20) included in the first MAC operator (MAC0) 320. The MAC result data DA_MAC outputted from the output latch (223-1 of FIG. 20) may be fed back to the addition logic circuit (222-2 of FIG. 20) for the accumulative adding calculation executed by the MAC circuit (222 of FIG. 20).

Figure 25:
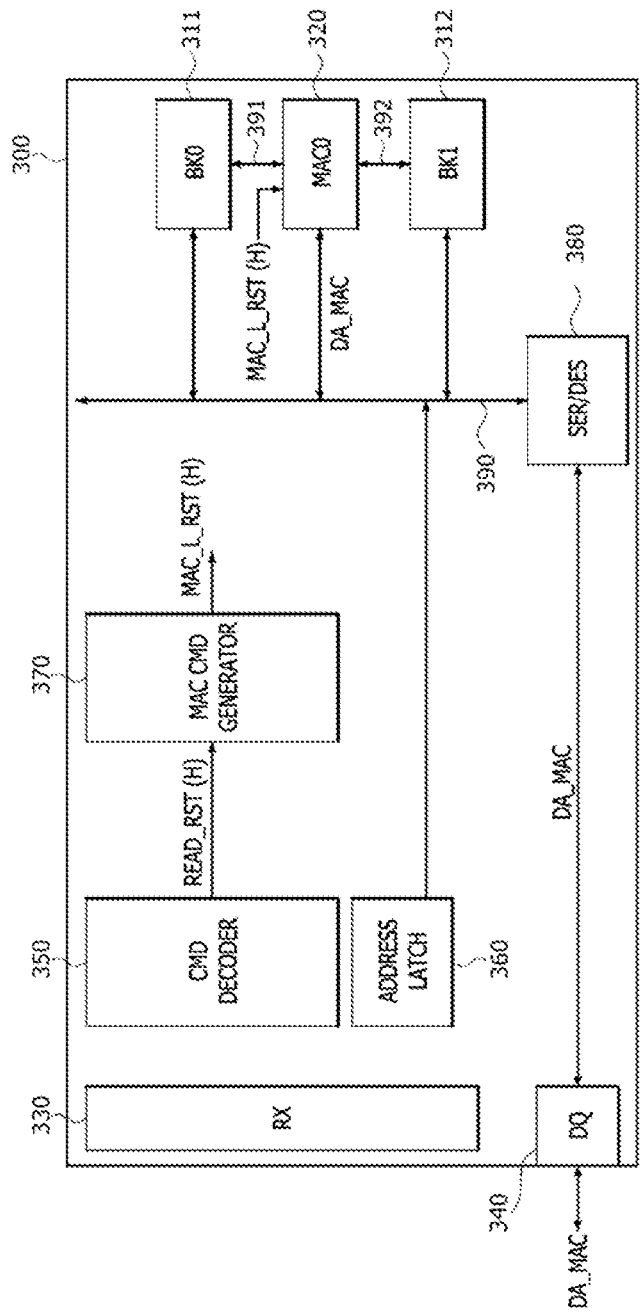

Next, referring to FIG. 25, the command decoder 350 may output and transmit the result read signal READ_RST having a logic "high(H)" level to the MAC command generator 370. The MAC command generator 370 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 320. As described with reference to FIG. 20, the first MAC operator (MAC0) 320 may output the MAC result data DA_MAC to the GIO line 390 in response to the MAC result latch signal MAC_L_RST having a logic "high" level and may also reset the output latch (223-1 of FIG. 20) included in the first MAC operator (MAC0) 320 in response to the MAC result latch signal MAC_L_RST having a logic "high" level. The MAC result data DA_MAC transmitted to the GIO line 390 may be outputted to an external device through the serializer/deserializer 380 and the data I/O line 340. Although not shown in the drawings, the MAC result data DA_MAC outputted from the first MAC operator (MAC0) 320 may be written into the first memory bank (BK0) 311 through the first BIO line 391 without using the GIO line 390 or may be written into the second memory bank (BK1) 312 through the second BIO line 392 without using the GIO line 390.

Figure 26:
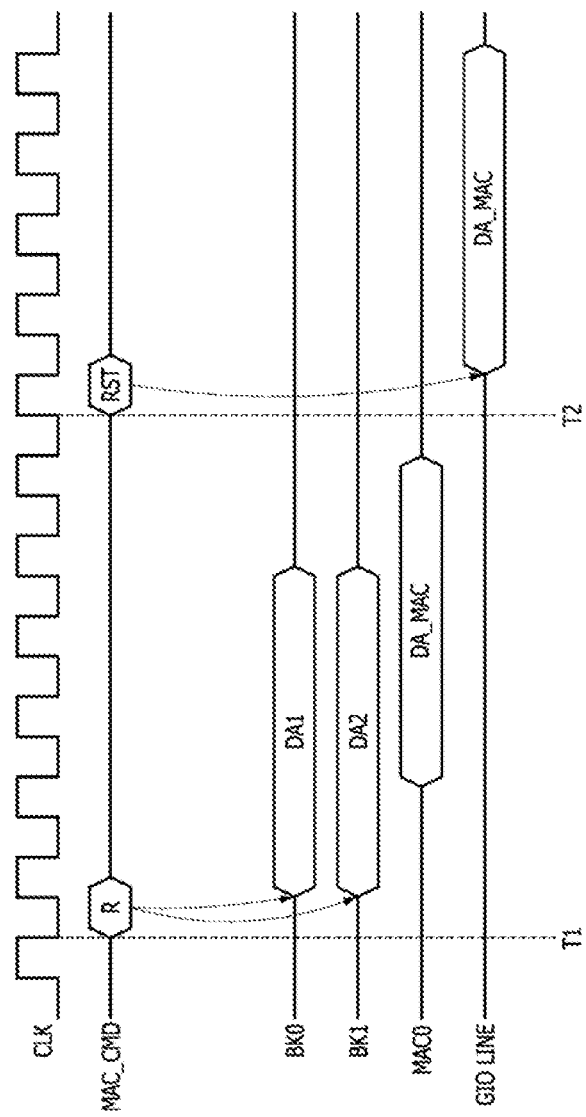
FIG. 26 is a timing diagram an operation of the PIM device illustrated in FIG. 16.

FIG. 26 is a timing diagram illustrating an operation of the PIM device 300 illustrated in FIG. 16. Referring to FIG. 26, at a first point in time "T1", the MAC command generator 370 may be synchronized with a falling edge of a clock signal CLK to generate and output the MAC read signal MAC_RD_BK (R) having a logic "high(H)" level. The first and second memory banks (BK0 and BK1) 311 and 312 may be selected by the MAC read signal MAC_RD_BK (R) having a logic "high(H)" level so that the first data DA1 and the second data DA2 are read out of the first and second memory banks (BK0 and BK1) 311 and 312. If a certain time elapses from a point in time when first data DA1 and the second data DA2 are read out, the first MAC operator (MAC0) 320 may perform the MAC arithmetic operation of the first and second data DA1 and DA2 to generate the MAC result data DA_MAC. At a second point in time "T2", the MAC command generator 370 may be synchronized with a falling edge of the clock signal CLK to generate and output the MAC result latch signal MAC_L_RST (RST) having a logic "high" level. The MAC result data DA_MAC may be transmitted to the GIO line 390 by the MAC result latch signal MAC_L_RST (RST) having a logic "high" level.

Figure 27:
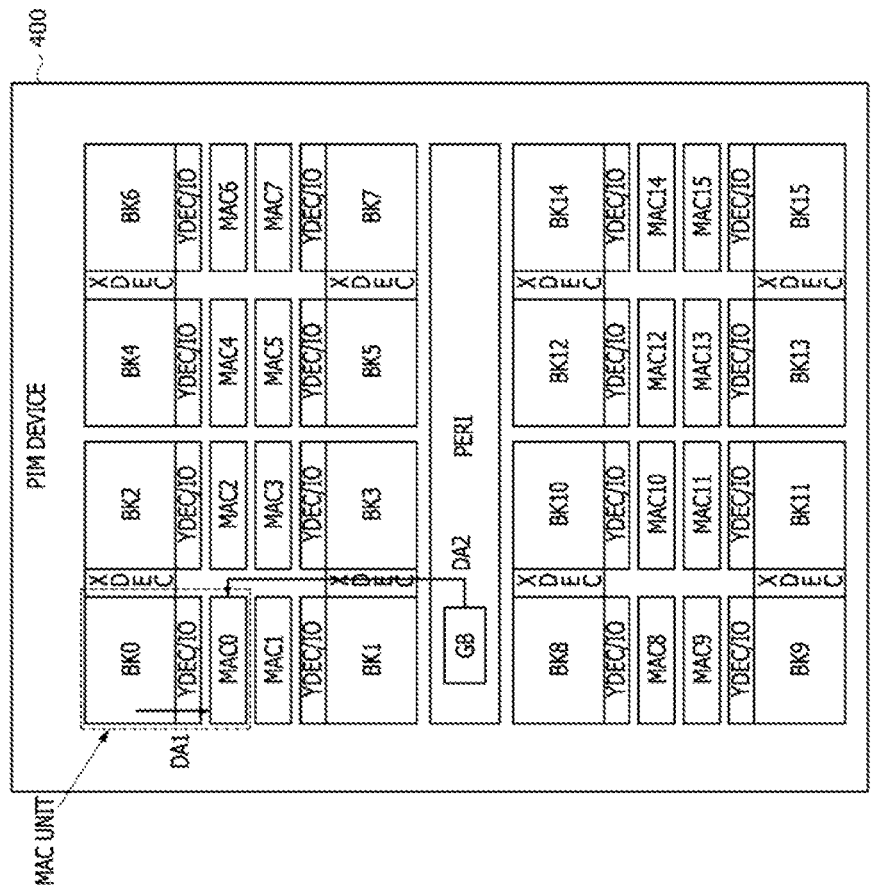
FIG. 27 is a schematic diagram illustrating an arrangement of memory banks and multiplication/accumulation (MAC) operators included in a PIM device according to a second embodiment of the present disclosure.

FIG. 27 illustrates a disposal structure indicating placement of memory banks and MAC operators included in a PIM device 400 according to another embodiment of the present disclosure. Referring to FIG. 27, the PIM device 400 may include memory devices such as a plurality of memory banks (e.g., first to sixteenth memory banks BK0, ..., and BK15), processing devices such as a plurality of MAC operators (e.g., first to sixteenth MAC operators MAC0, ..., and MAC15), and a global buffer GB. A core circuit may be disposed to be adjacent to the memory banks BK0, ..., and BK15. The core circuit may include X-decoders XDECs and Y-decoders/IO circuits YDEC/IOs. The memory banks BK0, ..., and BK15 and the core circuit may have the same configuration as described with reference to FIG. 2. Thus, descriptions of the memory banks BK0, ..., and BK15 and the core circuit will be omitted hereinafter. The MAC operators MAC0, ..., and MAC15 may be disposed to be allocated to the memory banks BK0, ..., and BK15, respectively. That is, in the PIM device 400, two or more memory banks do not share one MAC operator with each other. Thus, the number of the MAC operators MAC0, ..., and MAC15 included in the PIM device 400 may be equal to the number of the memory banks BK0, ..., and BK15 included in the PIM device 400. One of the memory banks BK0, ..., and BK15 together with one of the MAC operators MAC0, ..., and MAC15 may constitute one MAC unit. For example, the first memory bank BK0 and the first MAC operator MAC0 may constitute a first MAC unit, and the second memory bank BK1 and the second MAC operator MAC1 may constitute a second MAC unit. Similarly, the sixteenth memory bank BK15 and the sixteenth MAC operator MAC15 may constitute a sixteenth MAC unit. In each of the first to sixteenth MAC units, the MAC operator may receive first data DA1 to be used for the MAC arithmetic operation from the respective memory bank.

The PIM device 400 may further include a peripheral circuit PERI. The peripheral circuit PERI may be disposed in a region other than an area in which the memory banks BK0, BK1, ..., and BK15; the MAC operators MAC0, ..., and MAC15; and the core circuit are disposed. The peripheral circuit PERI may be configured to include a control circuit relating to a command/address signal, a control circuit relating to input/output of data, and a power supply circuit. The peripheral circuit PERI of the PIM device 400 may have substantially the same configuration as the peripheral circuit PERI of the PIM device 100 illustrated in FIG. 2. A difference between the peripheral circuit PERI of the PIM device 400 and the peripheral circuit PERI of the PIM device 100 is that the global buffer GB is disposed in the peripheral circuit PERI of the PIM device 400. The global buffer GB may receive second data DA2 to be used for the MAC operation from an external device and may store the second data DA2. The global buffer GB may output the second data DA2 to each of the MAC operators MAC0, . . . , and MAC15 through a GIO line. In the event that the PIM device 400 performs neural network calculation, for example, an arithmetic operation in a deep learning process, the first data DA1 may be weight data and the second data DA2 may be vector data.

The PIM device 400 according to the present embodiment may operate in a memory mode or a MAC arithmetic mode. In the memory mode, the PIM device 400 may operate to perform the same operations as general memory devices. The memory mode may include a memory read operation mode and a memory write operation mode. In the memory read operation mode, the PIM device 400 may perform a read operation for reading out data from the memory banks BK0, BK1, . . . , and BK15 to output the read data, in response to an external request. In the memory write operation mode, the PIM device 400 may perform a write operation for storing data provided by an external device into the memory banks BK0, BK1, . . . , and BK15, in response to an external request. In the MAC arithmetic mode, the PIM device 400 may perform the MAC arithmetic operation using the MAC operators MAC0, . . . , and MAC15. In the PIM device 400, the MAC arithmetic operation may be performed in a deterministic way, and the deterministic MAC arithmetic operation of the PIM device 400 will be described more fully hereinafter. Specifically, the PIM device 400 may perform the read operation of the first data DA1 for each of the memory banks BK0, . . . , and BK15 and the read operation of the second data DA2 for the global buffer GB, for the MAC arithmetic operation in the MAC arithmetic mode. In addition, each of the MAC operators MAC0, . . . , and MAC15 may perform the MAC arithmetic operation of the first data DA1 and the second data DA2 to store a result of the MAC arithmetic operation into the memory bank or to output the result of the MAC arithmetic operation to an external device. In some cases, the PIM device 400 may perform a data write operation for storing data to be used for the MAC arithmetic operation into the memory banks before the data read operation for the MAC arithmetic operation is performed in the MAC arithmetic mode.

The operation mode of the PIM device 400 according to the present embodiment may be determined by a command which is transmitted from a host or a controller to the PIM device 400. In an embodiment, if a first external command requesting a read operation or a write operation for the memory banks BK0, BK1, . . . , and BK15 is transmitted from the host or the controller to the PIM device 400, the PIM device 400 may perform the data read operation or the data write operation in the memory mode. Alternatively, if a second external command requesting the MAC arithmetic operation is transmitted from the host or the controller to the PIM device 400, the PIM device 400 may perform the data read operation and the MAC arithmetic operation.

The PIM device 400 may perform the deterministic MAC arithmetic operation. Thus, the host or the controller may always predict a point in time (or a clock) when the MAC arithmetic operation terminates in the PIM device 400 from a point in time when an external command requesting the MAC arithmetic operation is transmitted from the host or the controller to the PIM device 400. Because the timing is predictable, no operation for informing the host or the controller of a status of the MAC arithmetic operation is required while the PIM device 400 performs the deterministic MAC arithmetic operation. In an embodiment, a latency during which the MAC arithmetic operation is performed in the PIM device 400 may be set to a fixed value for the deterministic MAC arithmetic operation.

Figure 28:
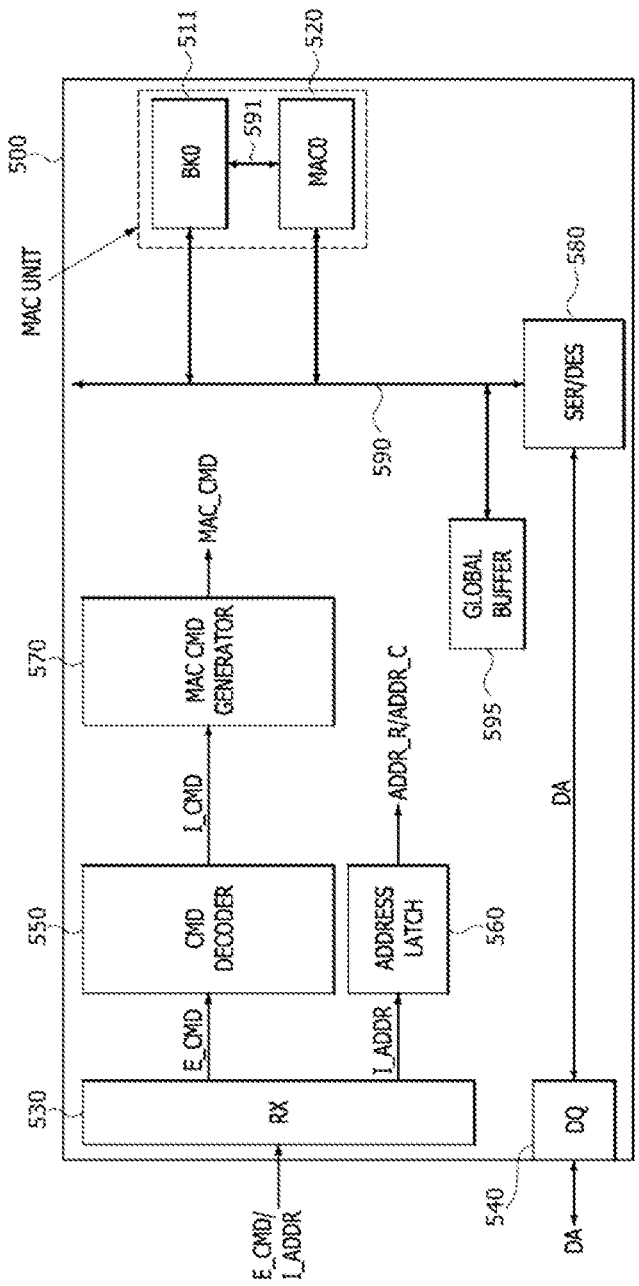
FIG. 28 is a block diagram illustrating a configuration of a PIM device according to the second embodiment of the present disclosure.

FIG. 28 is a block diagram illustrating an example of a detailed configuration of a PIM device 500 corresponding to the PIM device 400 illustrated in FIG. 27. FIG. 28 illustrates only a first memory bank (BK0) 511 and a first MAC operator (MAC0) 520 constituting a first MAC unit among a plurality of MAC units. However, FIG. 28 illustrates merely an example for simplification of the drawing. Accordingly, the following description for the first MAC unit may be equally applicable to the remaining MAC units. Referring to FIG. 28, the PIM device 500 may be configured to include the first memory bank (BK0) 511 and the first MAC operator (MAC0) 520 constituting the first MAC unit as well as a global buffer 595. The PIM device 500 may further include a GIO line 590 and a BIO line 591 used as data transmission lines. The first memory bank (BK0) 511 and the first MAC operator (MAC0) 520 may communicate with the global buffer 595 through the GIO line 590. Only the data transmission between the first memory bank (BK0) 511 and the first MAC operator (MAC0) 520 may be achieved through the BIO line 591. The BIO line 591 is dedicated specifically for data transmission between the first memory bank (BK0) 511 and the first MAC operator (MAC0) 520. Thus, the first MAC operator (MAC0) 520 may receive the first data DA1 to be used for the MAC arithmetic operation from the first memory bank (BK0) 511 through the BIO line 591 and may receive the second data DA2 to be used for the MAC arithmetic operation from the global buffer 595 through the GIO line 590.

The PIM device 500 may include a receiving driver (RX) 530, a data I/O circuit (DQ) 540, a command decoder 550, an address latch 560, a MAC command generator 570, and a serializer/deserializer (SER/DES) 580. The command decoder 550, the address latch 560, the MAC command generator 570, and the serializer/deserializer 580 may be disposed in the peripheral circuit PERI of the PIM device 400 illustrated in FIG. 27. The receiving driver 530 may receive an external command E_CMD and an input address I_ADDR from an external device. The external device may denote a host or a controller coupled to the PIM device 500. Hereinafter, it may be assumed that the external command E_CMD transmitted to the PIM device 500 is a command requesting the MAC arithmetic operation. That is, the PIM device 500 may perform the deterministic MAC arithmetic operation in response to the external command E_CMD. The data I/O circuit 540 may provide a means through which the PIM device 500 communicates with the external device.

The receiving driver 530 may separately output the external command E_CMD and the input address I_ADDR received from the external device. Data DA inputted to the PIM device 500 through the data I/O circuit 540 may be processed by the serializer/deserializer 580 and may be transmitted to the first memory bank (BK0) 511 and the global buffer 595 through the GIO line 590 of the PIM device 500. The data DA outputted from the first memory bank (BK0) 511 and the first MAC operator (MAC0) 520 through the GIO line 590 may be processed by the serializer/deserializer 580 and may be outputted to the external device through the data I/O circuit 540. The serializer/deserializer 580 may convert the data DA into parallel data if the data DA are serial data or may convert the data DA into serial data if the data DA are parallel data. For the data conversion, the serializer/deserializer 580 may include a serializer converting parallel data into serial data and a deserializer converting serial data into parallel data.

The command decoder 550 may decode the external command E_CMD outputted from the receiving driver 530 to generate and output the internal command signal I_CMD. The internal command signal I_CMD outputted from the command decoder 550 may be the same as the internal command signal I_CMD described with reference to FIG. 17. That is, the internal command signal I_CMD may include a first internal command signal corresponding to the memory active signal ACT_M, a second internal command signal corresponding to the MAC arithmetic signal MAC, and a third internal command signal corresponding to the result read signal READ_RST. The first to third internal command signals outputted from the command decoder 550 may be sequentially inputted to the MAC command generator 570. As described with reference to FIG. 17, the memory active signal ACT_M, the MAC arithmetic signal MAC, and the result read signal READ_RST outputted from the command decoder 550 may be sequentially generated at predetermined points in time (or clocks) in order to perform the deterministic MAC arithmetic operation of the PIM device 500. Thus, the host or the controller outputting the external command E_CMD may predict the points in time when the first to third internal command signals constituting the internal command signal I_CMD are generated by the command decoder 550 in advance at a point in time when the external command E_CMD is outputted from the host or the controller. That is, the host or the controller may predict a point in time (or a clock) when the MAC arithmetic operation terminates in the PIM device 500 after the external command E_CMD requesting the MAC arithmetic operation is transmitted from the host or the controller to the PIM device 500, even without receiving any signals from the PIM device 500.

The address latch 560 may convert the input address I_ADDR outputted from the receiving driver 530 into a row/column address ADDR_R/ADDR_C to output the row/column address ADDR_R/ADDR_C. The row/column address ADDR_R/ADDR_C outputted from the address latch 560 may be transmitted to the first memory bank (BK0) 511. According to the present embodiment, the first data and the second data to be used for the MAC arithmetic operation may be simultaneously read out of the first memory bank (BK0) 511 and the global buffer 595, respectively. Thus, it may be unnecessary to generate a bank selection signal for selecting the first memory bank 511. A point in time when the row/column address ADDR_R/ADDR_C is inputted to the first memory bank 511 may be a point in time when a MAC command (i.e., the MAC arithmetic signal MAC) requesting a data read operation for the first memory bank 511 for the MAC arithmetic operation is generated.

The MAC command generator 570 may output the MAC command signal MAC_CMD in response to the internal command signal I_CMD outputted from the command decoder 550. The MAC command signal MAC_CMD outputted from the MAC command generator 570 may be the same as the MAC command signal MAC_CMD described with reference to FIG. 17. That is, the MAC command signal MAC_CMD outputted from the MAC command generator 570 may include the MAC active signal RACTV corresponding to the first MAC command signal, the MAC read signal MAC_RD_BK corresponding to the second MAC command signal, the MAC input latch signal MAC_L1 corresponding to the third MAC command signal, the MAC output latch signal MAC_L3 corresponding to the fourth MAC command signal, and the MAC result latch signal MAC_L_RST corresponding to the fifth MAC command signal.

The MAC active signal RACTV may be generated based on the memory active signal ACT_M outputted from the command decoder 550. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 550. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 550.

The MAC active signal RACTV outputted from the MAC command generator 570 may control an activation operation for the first memory bank 511. The MAC read signal MAC_RD_BK outputted from the MAC command generator 570 may control a data read operation for the first memory bank 511 and the global buffer 595. The MAC input latch signal MAC_L1 outputted from the MAC command generator 570 may control an input data latch operation of the first MAC operator (MAC0) 520. The MAC output latch signal MAC_L3 outputted from the MAC command generator 570 may control an output data latch operation of the first MAC operator (MAC0) 520. The MAC result latch signal MAC_L_RST outputted from the MAC command generator 570 may control an output operation of MAC result data of the first MAC operator (MAC0) 520 and a reset operation of the first MAC operator (MAC0) 520.

As described above, in order to perform the deterministic MAC arithmetic operation of the PIM device 500, the memory active signal ACT_M, the MAC arithmetic signal MAC, and the result read signal READ_RST outputted from the command decoder 550 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 570 at predetermined points in time after the external command E_CMD is inputted to the PIM device 500, respectively. That is, a time period from a point in time when the first and second memory banks 511 is activated by the MAC active signal RACTV until a point in time when the first MAC operator (MAC0) 520 is reset by the MAC result latch signal MAC_L_RST may be predetermined.

The MAC command generator 570 of the PIM device 500 according to the present embodiment may have the same configuration as described with reference to FIG. 18. In addition, the input signals and the output signals of the MAC command generator 570 may be inputted to and outputted from the MAC command generator 570 at the same points in time as described with reference to FIG. 19. As described with reference to FIGS. 18 and 19, the MAC command generator 570 may sequentially receive the memory active signal ACT_M, the MAC arithmetic signal MAC, and the result read signal READ_RST from the command decoder 550. In addition, the MAC command generator 570 may sequentially generate and output the MAC active signal RACTV, the MAC read signal MAC_RD_BK, the MAC input latch signal MAC_L1, the MAC output latch signal MAC_L3, and the MAC result latch signal MAC_L_RST.

The MAC active signal RACTV, the MAC read signal MAC_RD_BK, the MAC input latch signal MAC_L1, the MAC output latch signal MAC_L3, and the MAC result latch signal MAC_L_RST may be outputted from the MAC command generator 570 in series with certain time intervals.

The MAC command generator 570 may generate and output the MAC active signal RACTV in response to the memory active signal ACT_M outputted from the command decoder 550. Subsequently, the MAC command generator 570 may generate and output the MAC read signal MAC_RD_BK in response to the MAC arithmetic signal MAC outputted from the command decoder 550. The MAC command generator 570 may delay the MAC arithmetic signal MAC by a certain time determined by the first delay circuit (372 of FIG. 18) to generate and output the MAC input latch signal MAC_L1. The MAC command generator 570 may delay the MAC input latch signal MAC_L1 by a certain time determined by the second delay circuit (373 of FIG. 18) to generate and output the MAC output latch signal MAC_L3. Subsequently, the MAC command generator 570 may generate and output the MAC result latch signal MAC_L_RST in response to the result read signal READ_RST outputted from the command decoder 550.

Figure 29:
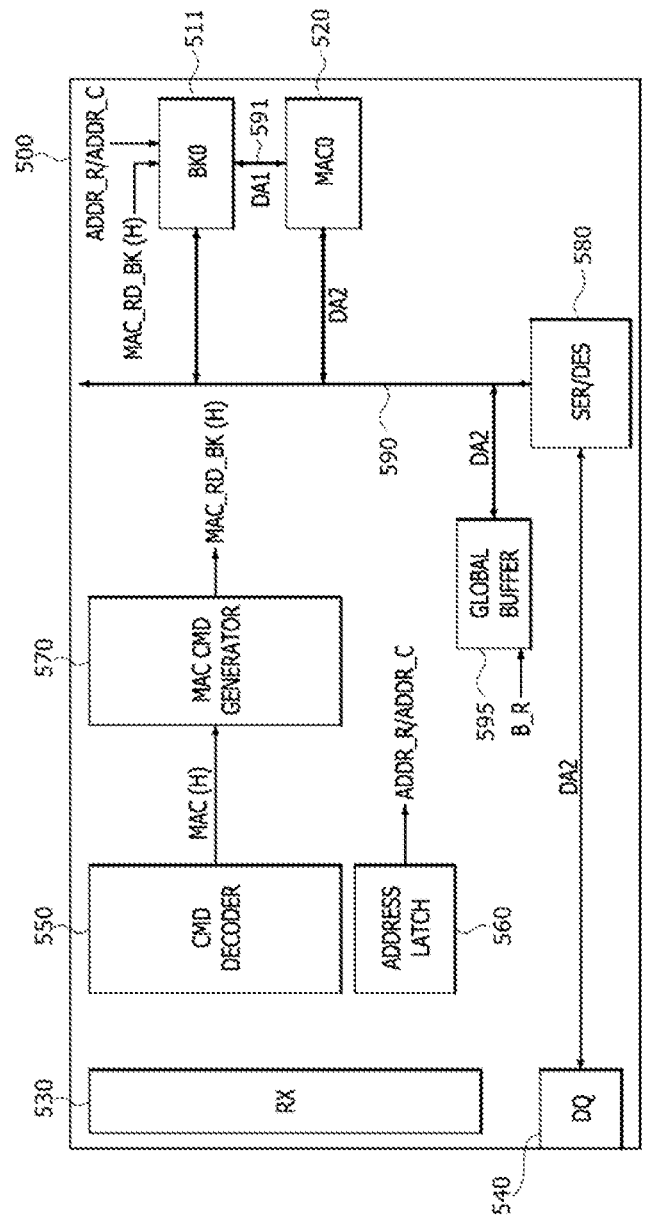
FIG. 29 is a block diagram illustrating an operation of the PIM device illustrated in FIG. 28.

FIG. 29 is a block diagram illustrating an operation of the PIM device 500 illustrated in FIG. 28. In FIG. 29, the same reference numerals or the same reference symbols as used in FIG. 16 denote the same elements. The operation of the PIM device 500 according to the present embodiment may be similar to the operation of the PIM device 300 described with reference to FIG. 16 except a transmission process of the first and second data DA1 and DA2 inputted to the first MAC operator (MAC0) 520. Thus, the operation of the PIM device 500 executed before the first and second data DA1 and DA2 are transmitted to the first MAC operator (MAC0) 520 may be the same as the operation of the PIM device 300 described with reference to FIG. 21. As illustrated in FIG. 29, when the MAC arithmetic signal MAC having a logic "high(H)" level is transmitted from the command decoder 550 to the MAC command generator 570, the MAC command generator 570 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 511. In such a case, a global buffer read signal B_R may also be transmitted to the global buffer 595. The first data DA1 may be read out of the first memory bank (BK0) 511 by the MAC read signal MAC_RD_BK having a logic "high(H)" level and may be transmitted to the first MAC operator (MAC0) 520 through the BIO line 591. In addition, the second data DA2 may be read out of the global buffer 595 by the global buffer read signal B_R and may be transmitted to the first MAC operator (MAC0) 520 through the GIO line 590. The operation of the PIM device 500 executed after the first and second data DA1 and DA2 are transmitted to the first MAC operator (MAC0) 520 may be the same as the operation of the PIM device 300 described with reference to FIGS. 23 to 25.

Figure 30:
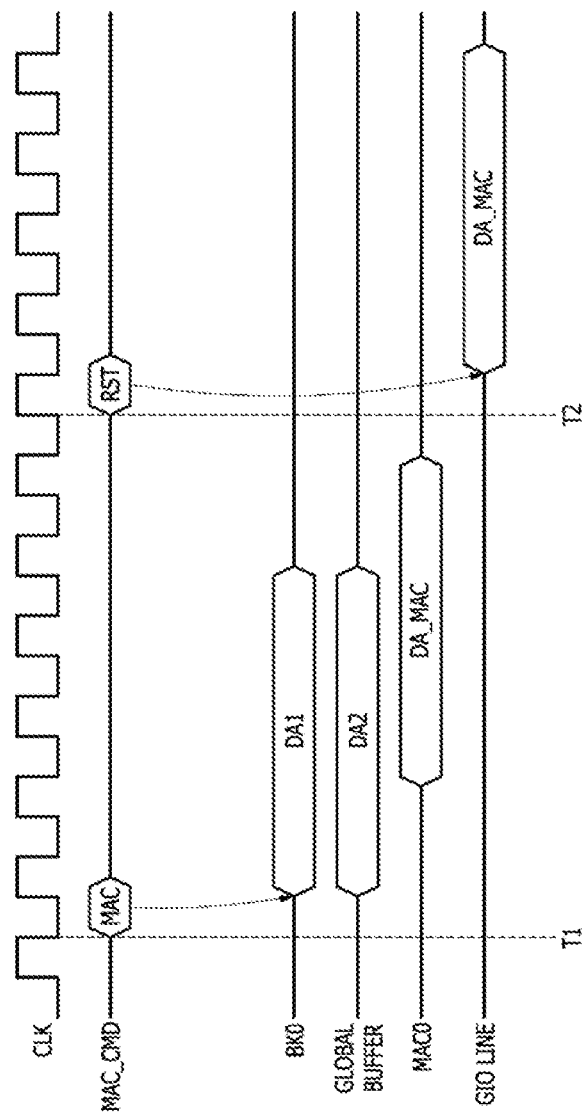
FIG. 30 is a timing diagram illustrating an operation of the PIM device illustrated in FIG. 28.

FIG. 30 is a timing diagram illustrating an operation of the PIM device 500 illustrate in FIG. 28. Referring to FIG. 30, at a first point in time "T1", the MAC command generator 570 may be synchronized with a falling edge of a clock signal CLK to generate and output the MAC read signal MAC_RD_BK (R) having a logic "high(H)" level. The first memory bank (BK0) 511 may be selected by the MAC read signal MAC_RD_BK (R) having a logic "high(H)" level so that the first data DA1 are read out of the first memory bank (BK0) 511. In addition, the second data DA2 may be read out of the global buffer 595. If a certain time elapses from a point in time when the first and second data DA1 and DA2 are read out of the first memory bank (BK0) 511 and the global buffer 595, the first MAC operator (MAC0) 520 may perform the MAC arithmetic operation of the first and second data DA1 and DA2 to generate the MAC result data DA_MAC. At a second point in time "T2", the MAC command generator 570 may be synchronized with a falling edge of the clock signal CLK to generate and output the MAC result latch signal MAC_L_RST (RST). The MAC result data DA_MAC may be transmitted to an external device through the GIO line 590 or to the first memory bank (BK0) 511 through the BIO line 591, by the MAC result latch signal MAC_L_RST (RST).

Figure 31:
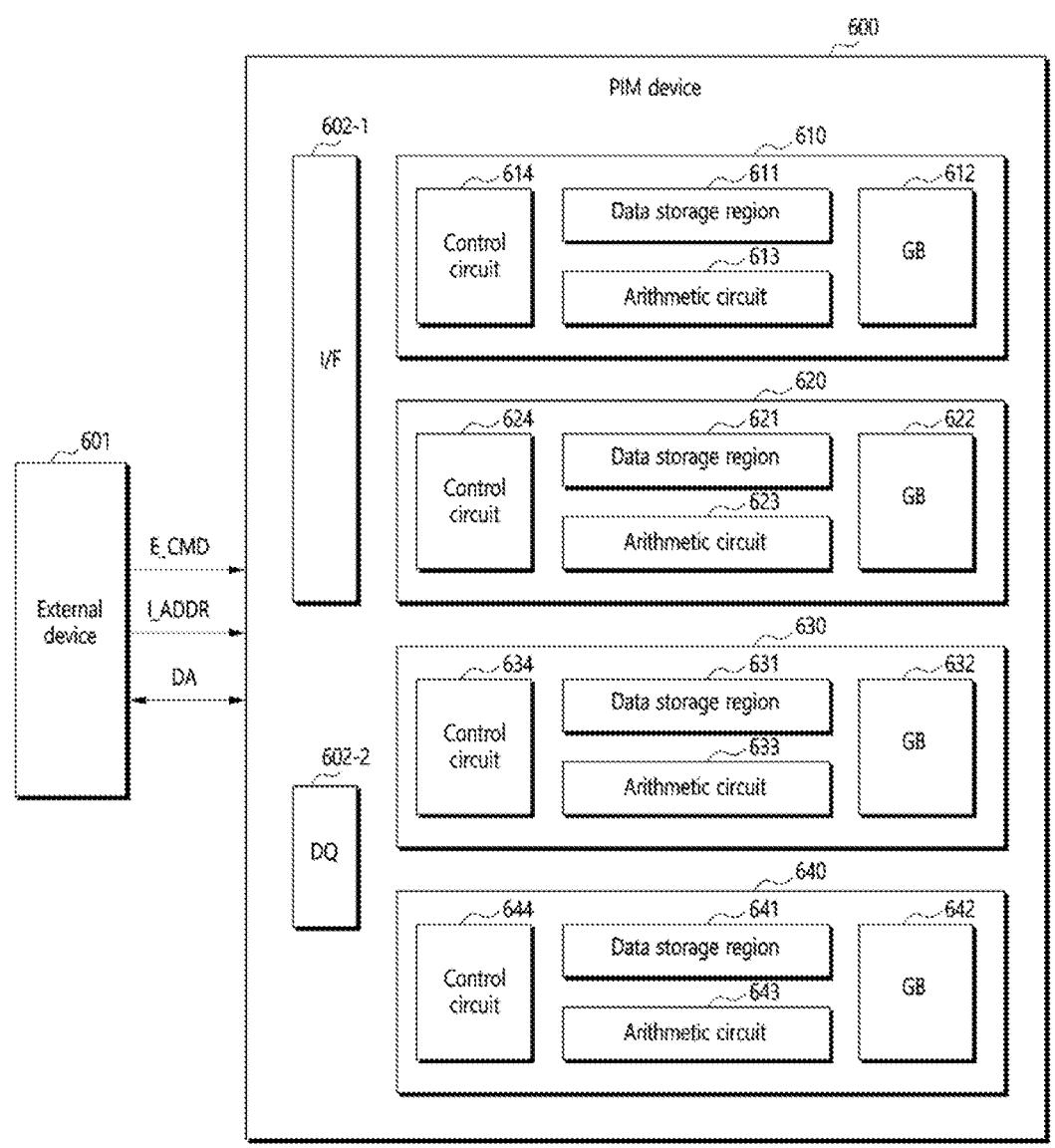
FIG. 31 is a diagram illustrating a configuration of a PIM device in accordance with an embodiment of the present disclosure and an external device coupled to the PIM device.

FIG. 31 is a diagram illustrating a configuration of a PIM device 600 in accordance with an embodiment of the present disclosure and an external device 601 coupled to the PIM device 600. Referring to FIG. 31, the PIM device 600 may perform various operations by being coupled to the external device 601. The PIM device 600 may perform an arithmetic operation by being controlled by the external device 601. The external device 601 may include a host or a PIM controller which controls the operation of the PIM device 600 by being coupled to the PIM device 600. The PIM device 600 may receive an external command E_CMD, an input address I_ADDR and data DA from the external device 601, and may perform an arithmetic operation on the received data DA based on the external command E_CMD and the input address I_ADDR. The data DA provided to the PIM device 600 from the external device 601 may include vector data and weight data. Data DA provided to the external device 601 from the PIM device 600 may include a calculation result generated as the PIM device 600 performs the arithmetic operation.

The PIM device 600 may include a plurality of arithmetic devices 610, 620, 630, and 640, an interface (I/F) 602-1 and a data input/output (I/O) pad (DQ) 602-2. Each of the plurality of arithmetic devices 610, 620, 630, and 640 may be a unit arithmetic device, and one arithmetic device may form one channel of the PIM device 600. While FIG. 31 illustrates that the PIM device 600 includes four arithmetic devices and/or channels, the number of arithmetic devices and/or channels included in the PIM device 600 may be less than four or greater than four. The PIM device 600 may include first to fourth arithmetic devices 610, 620, 630, and 640. The first to fourth arithmetic devices 610, 620, 630, and 640 may have substantially the same configuration. The first to fourth arithmetic devices 610, 620, 630 and 640 may independently perform the same type of or different types of arithmetic operations, or may divisionally perform one arithmetic operation. For example, the first to fourth arithmetic devices 610, 620, 630 and 640 may independently perform calculations on different vector data, or may divisionally perform an arithmetic operation on one vector data.

The interface 602-1 may receive the external command E_CMD and the input address I_ADDR from the external device 601. The interface 602-1 may provide the external command E_CMD and the input address I_ADDR to the first to fourth arithmetic devices 610, 620, 630 and 640. The interface 602-1 may provide the external command E_CMD and the input address I_ADDR in common to the first to fourth arithmetic devices 610, 620, 630, and 640. The interface 602-1 may simultaneously provide the external command E_CMD and the input address I_ADDR to the first to fourth arithmetic devices 610, 620, 630, and 640, or may select a specific arithmetic device among the first to fourth arithmetic devices 610, 620, 630, and 640 and provide the external command E_CMD and the input address I_ADDR to only the selected arithmetic device. The interface 602-1 may be coupled in common to the first to fourth arithmetic devices 610, 620, 630, and 640, or may include a plurality of unit interfaces which are coupled one-to-one to the first to fourth arithmetic devices 610, 620, 630, and 640.

The data I/O pad 602-2 may function as a data communication terminal between the PIM device 600 and the external device 601. The data DA transmitted from the external device 601 may be input to the PIM device 600 through the I/O pad 602-2, and the data DA output from the PIM device 600 may be transmitted to the external device 601 through the I/O pad 602-2. For example, data transmitted from the external device 601 to the PIM device 600 may include vector data and weight data. Data transmitted from the PIM device 600 to the external device 601 may include a calculation result. The I/O pad 602-2 may be coupled in common to the first to fourth arithmetic devices 610, 620, 630, and 640, or may include a plurality of unit I/O pads which are coupled one-to-one to the first to fourth arithmetic devices 610, 620, 630, and 640.

The first to fourth arithmetic devices 610, 620, 630, and 640 may include the same components. The first arithmetic device 610 may include a data storage region 611, a global buffer (GB) 612, an arithmetic circuit 613 and a control circuit 614. The second arithmetic device 620 may include a data storage region 621, a global buffer 622, an arithmetic circuit 623 and a control circuit 624. The third arithmetic device 630 may include a data storage region 631, a global buffer 632, an arithmetic circuit 633 and a control circuit 634. The fourth arithmetic device 640 may include a data storage region 641, a global buffer 642, an arithmetic circuit 643 and a control circuit 644. Hereinafter, the components of the first arithmetic device 610 will be representatively described. The data storage region 611 may store vector data and weight data used in an arithmetic operation and a calculation result generated by performing the arithmetic operation. The data storage region 611 may include a plurality of unit storage regions. For example, the data storage region 611 may include a plurality of memory banks. The global buffer 612 may temporarily store data required for a calculation. The global buffer 612 may be coupled to the data storage region 611. For example, the global buffer 612 may temporarily store vector data among data required for the arithmetic operation. In the embodiment of the present disclosure, before the arithmetic operation is performed, the vector data and the weight data may be stored in the data storage region 611, and the vector data stored in the data storage region 611 may be transferred to and stored in the global buffer 612. The first arithmetic device 610 may read the vector data stored in the data storage region 611 and write the read vector data to the global buffer 612. The global buffer 612 may include any one among a latch, a register and an SRAM.

The arithmetic circuit 613 may be coupled to the data storage region 611 and the global buffer 612. The arithmetic circuit 613 may receive data required for an arithmetic operation, from the data storage region 611 and the global buffer 612. For example, the arithmetic circuit 613 may receive weight data from the data storage region 611 and receive vector data from the global buffer 612. The arithmetic circuit 613 may perform an arithmetic operation on the vector data and the weight data. The arithmetic circuit 613 may perform a multiplication-accumulation operation. The arithmetic circuit 613 may generate a calculation result by multiplying the vector data by the weight data and accumulating a multiplied result. The arithmetic circuit 613 may output the calculation result. The calculation result may be stored in the data storage region 611 or may be output to the external device 601. In an embodiment, the arithmetic circuit 613 may be modified to perform only multiplication or only addition. The arithmetic circuit 613 may include a plurality of multiplication-accumulation (MAC) operators which perform the multiplication-accumulation operation.

The control circuit 614 may receive the external command E_CMD and the input address I_ADDR received through the interface 602-1, and may control the data storage region 611, the global buffer 612 and the arithmetic circuit 613 so that the first arithmetic device 610 may perform an arithmetic operation based on the external command E_CMD and the input address I_ADDR. The control circuit 614 may generate various types of internal command signals and internal address signals to control the data storage region 611, the global buffer 612 and the arithmetic circuit 613. The control circuit 614 may control the data storage region 611 so that the vector data and the weight data received through the data I/O pad 602-2 are stored in the data storage region 611. The control circuit 614 may control the data storage region 611 and the global buffer 612 so that the vector data stored in the data storage region 611 is transferred to and stored in the global buffer 612. The control circuit 614 may control the arithmetic circuit 613 so that the arithmetic circuit 613 performs a calculation on the vector data and the weight data and a calculation result generated by the arithmetic circuit 613 is stored in the data storage region 611 or is output to the external device 601 through the data I/O pad 602-2. The control circuit 614 may control the arithmetic circuit 613 and the data storage region 611 so that the calculation result generated by the arithmetic circuit 613 is stored in the data storage region 611 to be used as vector data for a next arithmetic operation.

Figure 32:
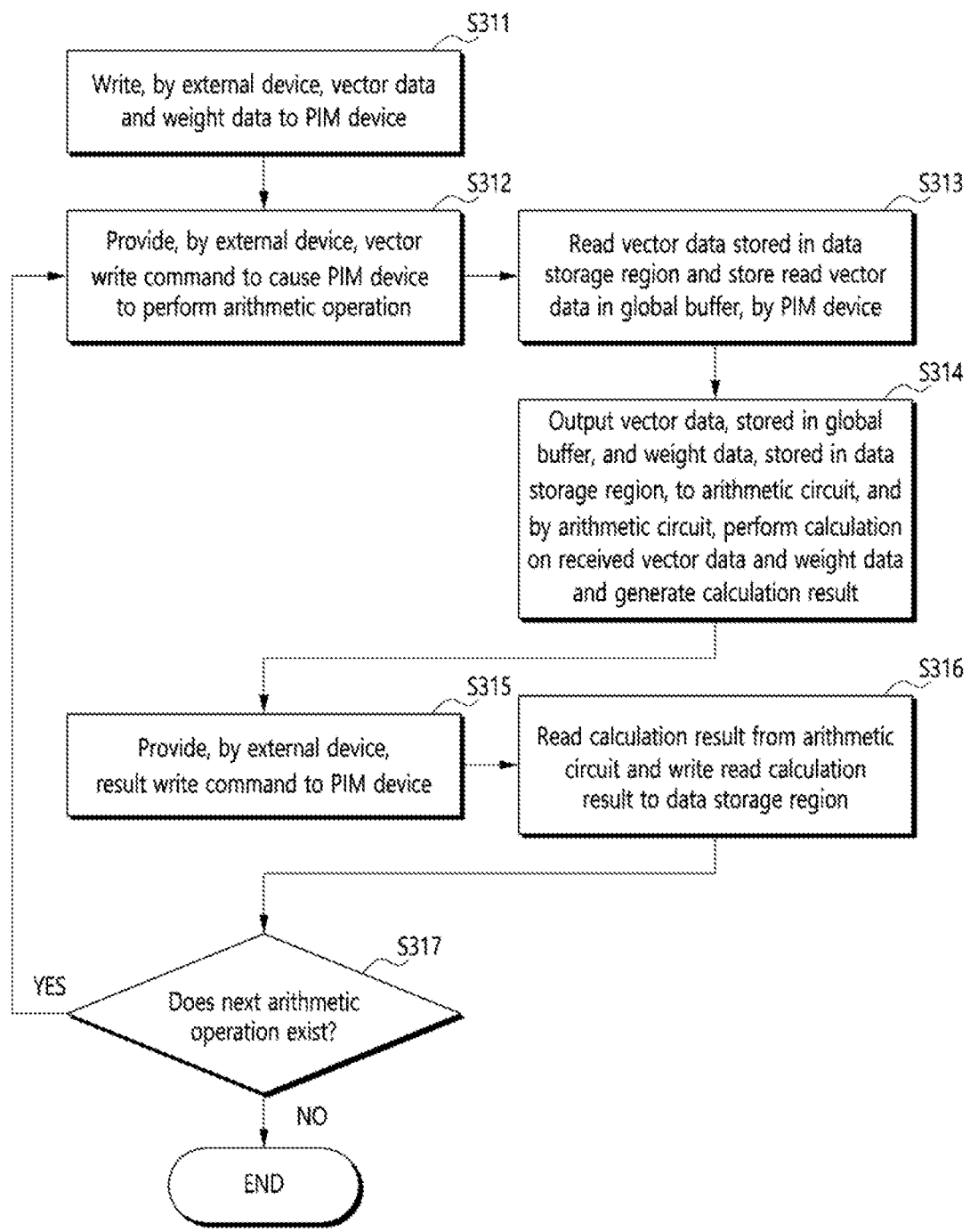
FIG. 32 is a diagram illustrating a method for operating a PIM device in accordance with an embodiment of the present disclosure.

FIG. 32 is a diagram illustrating a method for operating a PIM device in accordance with an embodiment of the present disclosure. FIG. 32 may show a method for operating the PIM device 600 when one arithmetic device independently performs an arithmetic operation. Hereunder, one arithmetic device is exemplified as the first arithmetic device 610 of the PIM device 600. Referring to FIGS. 31 and 32, at step S311, before an arithmetic operation of the PIM device 600 is performed, the external device 601 may write vector data and weight data to the first arithmetic device 610 of the PIM device 600. The external device 601 may provide the external command E_CMD and the input address I_ADDR to the PIM device 600, and may provide the data DA as vector data and weight data to the PIM device 600. The control circuit 614 may write the vector data and the weight data to the data storage region 611 based on the external command E_CMD and the input address I_ADDR. When a unit access size of one arithmetic device is smaller than a size of the vector data, the step S311 may be repeatedly performed until the entire vector data is written to the data storage region 611. For example, when a unit access size of the first arithmetic device 610 is 256 bits and a size of the vector data is 1 KB, the step S311 may be repeatedly performed 32 times.

At step S312, the external device 601 may provide a vector write command as the external command E_CMD so that the PIM device 600 may perform an arithmetic operation. The vector write command may be a single external command instructing an operation in which the PIM device 600 reads the vector data stored in the data storage region 611 and writes the read vector data to the global buffer 612. At step S313, based on the vector write command, the PIM device 600 may read the vector data stored in the data storage region 611 and write the read vector data to the global buffer 612. Based on the vector write command, the control circuit 614 may generate control signals for transferring and storing the vector data, stored in the data storage region 611, to and in the global buffer 612, and based on the control signals, the vector data stored in the data storage region 611 may be transferred and stored from a memory bank to and in the global buffer 612. The step S313 may be repeatedly performed until the entire vector data is transferred and stored from the data storage region 611 to and in the global buffer 612.

After the vector data read from the data storage region 611 is stored in the global buffer 612, step S314 may be performed. The global buffer 612 may output the vector data to the arithmetic circuit 613, and the data storage region 611 may output the weight data to the arithmetic circuit 613. The arithmetic circuit 613 may receive the vector data and the weight data, and may generate a calculation result by performing an arithmetic operation on the received vector data and weight data. The step S314 may be repeatedly performed until the entire vector data is read from the global buffer 612 and an arithmetic operation on the entire vector data is performed. Before the step S314, the external device 601 may provide the external command E_CMD as a calculation command to the PIM device 600. Based on the calculation command, the control circuit 614 may generate a control signal for reading the vector data from the global buffer 612, a control signal for reading the weight data from the data storage region 611 and a control signal for performing an arithmetic operation of the arithmetic circuit 613. In an embodiment, the PIM device 600 might not receive the calculation command from the external device 601. The control signals generated by the calculation command may be generated by the control circuit 614 after the step S313 is ended based on the vector write command.

After the step S314 is performed, step S315 may be performed. At the step S315, the external device 601 may provide the external command E_CMD as a result write command to the PIM device 600. The result write command may be a single external command instructing an operation of reading the calculation result generated by the arithmetic circuit 613 and writing the read calculation result to the data storage region 611. At step S316, based on the result write command, the PIM device 600 may read the calculation result from the arithmetic circuit 613 and write the read calculation result to the data storage region 611. Based on the result write command, the control circuit 614 may generate a control signal for reading the calculation result stored in the arithmetic circuit 613 and a control signal for writing the read calculation result to the data storage region 611. When the PIM device 600 performs a matrix calculation, a calculation may be performed on a plurality of vector data. The plurality of vector data may be stored in different spaces of the data storage region 611 at the steps S312 and S313. The PIM device 600 may repeatedly perform the steps S314, S315, and S316 until the calculation on the plurality of vector data is performed.

At step S317, it may be determined whether a next arithmetic operation exists. When a next arithmetic operation exists (Yes of the step S317), the calculation result written to the data storage region 611 at the step S316 may be used as vector data for the next arithmetic operation. When a next arithmetic operation exists, the steps S312, S313, S314, S315, and S316 may be repeatedly performed. When a next arithmetic operation does not exist at the step S317 (No of the step S317), the operation of the PIM device 600 may be ended.

Figure 33:
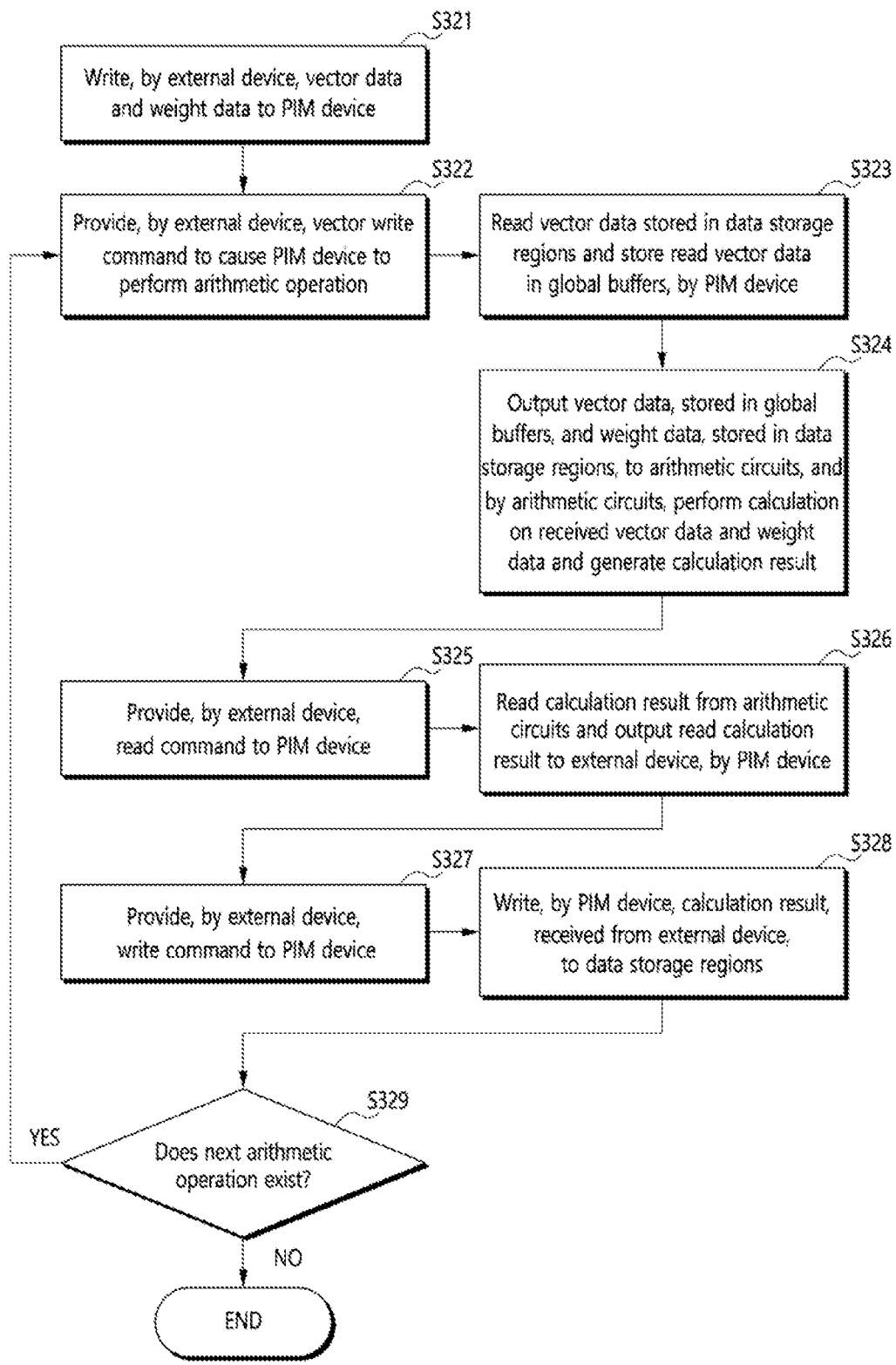
FIG. 33 is a diagram illustrating a method for operating a PIM device in accordance with another embodiment of the present disclosure.

FIG. 33 is a diagram illustrating a method for operating a PIM device in accordance with another embodiment of the present disclosure. FIG. 33 may show a method for operating the PIM device 600 when a plurality of arithmetic devices perform together one arithmetic operation. Referring to FIGS. 31 and 33, at step S321, before an arithmetic operation of the PIM device 600 is performed, the external device 601 may write vector data and weight data to the PIM device 600. The external device 601 may provide the external command E_CMD and the input address I_ADDR to the PIM device 600, and may provide the data DA as the vector data and the weight data to the PIM device 600. Based on the external command E_CMD and the input address I_ADDR, the control circuits 614, 624, 634, and 644 of the first to fourth arithmetic devices 610, 620, 630, and 640 may write the vector data and the weight data to the data storage regions 611, 621, 631 and 641 of the first to fourth arithmetic devices 610, 620, 630, and 640. When a unit access size of the plurality of arithmetic devices is smaller than a size of the vector data, the step S321 may be repeatedly performed until the entire vector data is written to the data storage regions 611, 621, 631, and 641 of the first to fourth arithmetic devices 610, 620, 630, and 640. For example, when a unit access size of one arithmetic device is 256 bits and a size of the vector data is 1 KB, the step S321 may be repeatedly performed 8 times.

At step S322, the external device 601 may provide the external command E_CMD as a vector write command so that the PIM device 600 may perform an arithmetic operation. The vector write command may be a single external command instructing an operation in which the PIM device 600 reads vector data stored in a data storage region and writes the read vector data to a global buffer. The first to fourth arithmetic devices 610, 620, 630, and 640 may read in parallel the vector data stored in the data storage regions 611, 621, 631, and 641, and may write the read vector data to the global buffers 612, 622, 632, and 642, respectively. Based on the vector write command, the control circuits 614, 624, 634, and 644 of the first to fourth arithmetic devices 610, 620, 630, and 640 may generate control signals, respectively, for transferring and storing the vector data stored in the data storage regions 611, 621, 631, and 641 to and in the global buffers 612, 622, 632, and 642 and enabling the arithmetic circuits 613, 623, 633, and 643 to perform an arithmetic operation. At step S323, the PIM device 600 may read the vector data stored in the data storage regions 611, 621, 631, and 641 and write the read vector data to the global buffers 612, 622, 632, and 642. Therefore, the vector data may be transferred and stored from the data storage regions 611, 621, 631 and 641 of the first to fourth arithmetic devices 610, 620, 630, and 640 to and in the global buffers 612, 622, 632, and 642. The step S323 may be repeatedly performed until the entire vector data is transferred and stored from the data storage regions 611, 621, 631, and 641 of the first to fourth arithmetic devices 610, 620, 630, and 640 to and in the global buffers 612, 622, 632, and 642.

After the vector data read from the data storage regions 611, 621, 631 and 641 is stored in the global buffers 612, 622, 632, and 642, step S324 may be performed. At the step S324, the global buffers 612, 622, 632, and 642 of the first to fourth arithmetic devices 610, 620, 630, and 640 may output the vector data to the arithmetic circuits 613, 623, 633, and 643, respectively, and the data storage regions 611, 621, 631, and 641 may output the weight data to the arithmetic circuits 613, 623, 633, and 643, respectively. The arithmetic circuits 613, 623, 633, and 643 may receive the vector data and the weight data, and may generate a calculation result by respectively performing the arithmetic operation on the received vector data and weight data. The step S324 may be repeatedly performed until the entire vector data is read from the global buffers 612, 622, 632, and 642 and the arithmetic operation on the entire vector data is performed. Before the step S324, the external device 601 may provide the external command E_CMD as a calculation command to the PIM device 600. Based on the calculation command, the control circuits 614, 624, 634, and 644 of the first to fourth arithmetic devices 610, 620, 630 and 640 may generate control signals for reading the vector data from the global buffers 612, 622, 632 and 642, control signals for reading the weight data from the data storage regions 611, 621, 631, and 641 and control signals for performing the arithmetic operation of the arithmetic circuits 613, 623, 633 and 643. In an embodiment, the PIM device 600 might not receive the calculation command from the external device 601. The control signals generated by the calculation command may be generated by the control circuits 614, 624, 634, and 644 after the step S323 is ended based on the vector write command.

After the step S324 is performed, step S325 may be performed. At the step S325, the external device 601 may provide the external command E_CMD as a read command to the PIM device 600. The read command may be a command instructing an operation of reading the calculation result stored in the arithmetic circuits 613, 623, 633 and 643 and outputting the read calculation result to the external device 601. At step S326, based on the read command, the PIM device 600 may read the calculation result from the arithmetic circuits 613, 623, 633, and 643 and output the read calculation result to the external device 601. Based on the read command, the control circuits 614, 624, 634, and 644 may generate control signals for reading the calculation result stored in the arithmetic circuits 613, 623, 633, and 643. At step S327, the external device 601 may provide the external command E_CMD as a write command to the PIM device 600. The write command may be a command instructing an operation of storing the data DA, transmitted from the external device 601, in the data storage regions 611, 621, 631, and 641 of the PIM device 600. At step S328, based on the write command, the PIM device 600 may write the calculation result, received from the external device 601, to the data storage regions 611, 621, 631, and 641. Based on the write command, the control circuits 614, 624, 634, and 644 may generate control signals for writing the calculation result, transmitted from the external device 601, to the data storage regions 611, 621, 631, and 641. When the PIM device 600 performs a matrix calculation, the PIM device 600 may perform a calculation on a plurality of vector data. The plurality of vector data may be stored in different spaces, respectively, of the data storage regions 611, 621, 631, and 641 at the steps S322 and S323. The PIM device 600 may repeatedly perform the steps S324, S325, S326, S327, and S328 until the calculation on the plurality of vector data is performed.

At step S329, it may be determined whether a next arithmetic operation exists. When a next arithmetic operation exists (Yes of the step S329), the calculation result written to the data storage regions 611, 621, 631 and 641 at the step S328 may be used as vector data for the next arithmetic operation. When a next arithmetic operation exists, the steps S322, S323, S324, S325, S326, S327, and S328 may be repeatedly performed. When a next arithmetic operation does not exist at the step S329 (No of the step S329), the operation of the PIM device 600 may be ended.

Figure 34:
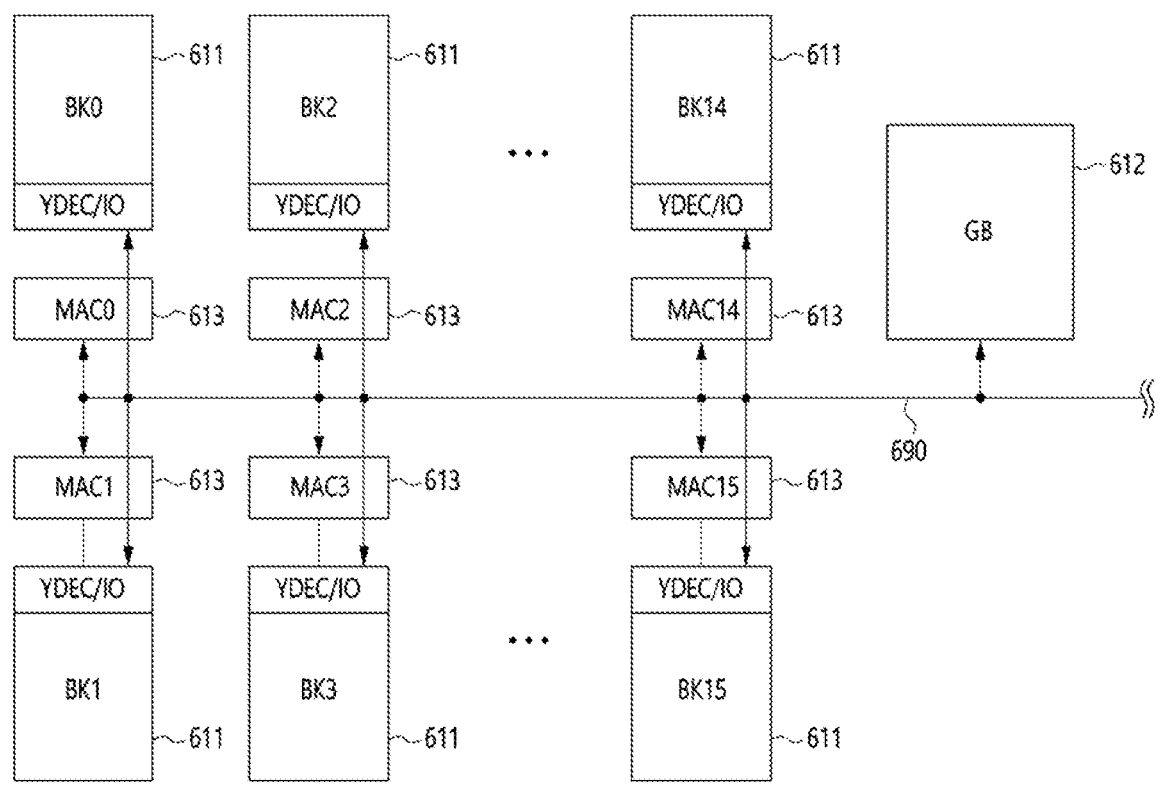
FIG. 34 is a diagram illustrating coupling relationships among a data storage region, a global buffer and an arithmetic circuit of a first arithmetic device illustrated in FIG. 31.

FIG. 34 is a diagram illustrating coupling relationships among the data storage region 611, the global buffer 612 and the arithmetic circuit 613 of the first arithmetic device 610 illustrated in FIG. 31. FIG. 34 illustrates that the data storage region 611 includes 16 memory banks BK0 to BK15 and the arithmetic circuit 613 includes 16 MAC operators MAC0 to MAC15 which are coupled one-to-one to the 16 memory banks BK0 to BK15, but it is not intended to limit the number of memory banks and the number of MAC operators. In an embodiment, one MAC operator may be coupled in common to at least two memory banks instead of being coupled to one memory bank. Each of first to sixteenth memory banks BK0 to BK15 may include a plurality of rows and a plurality of columns, and may include a plurality of memory cells which are coupled to intersections of the plurality of rows and the plurality of columns. Each of the first to sixteenth memory banks BK0 to BK15 may include a core circuit. The core circuit may include an X-decoder (not illustrated) and a Y-decoder/I/O circuit YDEC/IO. The X-decoder may be a row decoder for selecting rows of the first to sixteenth memory banks BK0 to BK15. The Y-decoder/I/O circuit YDEC/IO may include a column decoder for selecting columns of the first to sixteenth memory banks BK0 to BK15. The Y-decoder/I/O circuit YDEC/IO may include an I/O circuit which reads data stored in each of the first to sixteenth memory banks BK0 to BK15 during a read operation for each of the first to sixteenth memory banks BK0 to BK15 and provides data to each of the first to sixteenth memory banks BK0 to BK15 during a write operation for each of the first to sixteenth memory banks BK0 to BK15. The first to sixteenth memory banks BK0 to BK15 may store the vector data, the weight data and the calculation result in a plurality of columns coupled to different rows.

The global buffer 612 may be coupled to each of the first to sixteenth memory banks BK0 to BK15. The global buffer 612 may be coupled to the first to sixteenth memory banks BK0 to BK15 through a global I/O line 690. The global buffer 612 may receive data, read from the first to sixteenth memory banks BK0 to BK15, through the global I/O line 690. The number of global I/O lines 690 may be changed depending on a unit access size of the first arithmetic device 610. A unit access size may mean a size of data which may be processed during one operation. For example, when a size of data read from the first to sixteenth memory banks BK0 to BK15 through one read operation is 256 bits, the number of global I/O lines 690 may be 256. During one read or write operation, each of the first to sixteenth memory banks BK0 to BK15 may output or store data of 16 bits. During one read or write operation, the global buffer 612 may output or store data of 256 bits.

The first to sixteenth MAC operators MAC0 to MAC15 may be coupled one-to-one to the first to sixteenth memory banks BK0 to BK15. The first to sixteenth MAC operators MAC0 to MAC15 may be coupled to the global buffer 612 through the global I/O line 690. The first to sixteenth MAC operators MAC0 to MAC15 may read the vector data from the global buffer 612, and may read the weight data from the first to sixteenth memory banks BK0 to BK15, respectively. For example, during one arithmetic operation, each of the first to sixteenth MAC operators MAC0 to MAC15 may perform a calculation on 16 bits of the vector data and 16 bits of the weight data. Therefore, during one arithmetic operation, a calculation on 256 bits of the vector data may be performed through the first to sixteenth MAC operators MAC0 to MAC15. For example, the vector data may have a size of 1 KB or 2 KB. When the vector data has a size of 1 KB, the first to sixteenth MAC operators MAC0 to MAC15 may repeatedly perform total 32 arithmetic operations to perform a calculation on the entire vector data. A combination of one memory bank and one MAC operator coupled thereto may configure one MAC unit.

Figure 35:
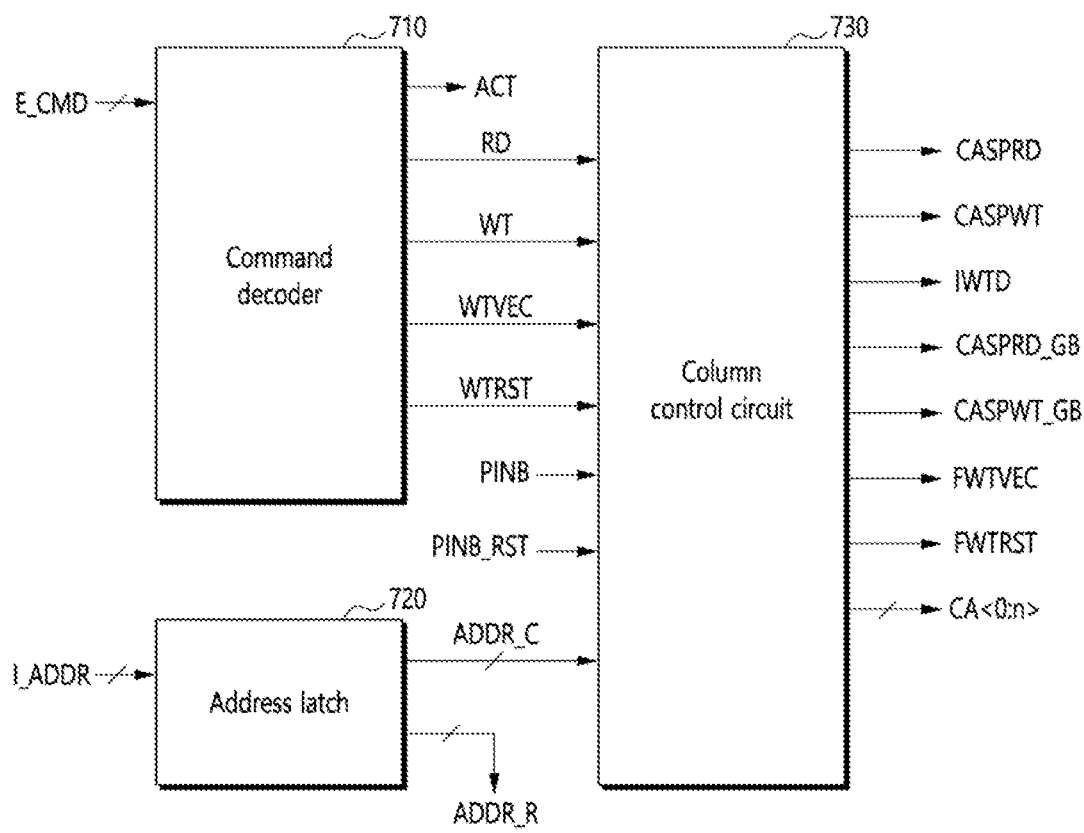
FIG. 35 is a diagram illustrating at least a part of a configuration of a control circuit in accordance with an embodiment of the present disclosure.

FIG. 35 is a diagram illustrating at least a part of a configuration of a control circuit 700 in accordance with an embodiment of the present disclosure. The control circuit 700 may be applied as each of the control circuits 614, 624, 634, and 644 illustrated in FIG. 31. Hereinafter, it will be described as an example that the control circuit 700 is applied as the control circuit 614 of the first arithmetic device 610. Referring to FIGS. 31, 34 and 35, the control circuit 700 may include a command decoder 710, an address latch 720 and a column control circuit 730. The command decoder 710 may receive the external command E_CMD and generate various internal command signals based on the external command E_CMD. The command decoder 710 may generate a plurality of internal command signals by decoding the external command E_CMD. The command decoder 710 may generate an active signal ACT by decoding the external command E_CMD received as an active command. For example, the active signal ACT may be a signal for enabling a specific row of a memory bank selected among the first to sixteenth memory banks BK0 to BK15 of the first arithmetic device 610. The command decoder 710 may generate a read signal RD by decoding the external command E_CMD received as a read command. For example, the read signal RD may include a signal for reading data stored in at least one of the first to sixteenth memory banks BK0 to BK15, a signal for reading data stored in the global buffer 612 and a signal for reading data stored in at least one of the first to sixteenth MAC operators MAC0 to MAC15. The command decoder 710 may generate a write signal WT by decoding the external command E_CMD received as a write command. For example, the write signal WT may be a signal for writing data, transmitted from the external device 601, to at least one of the first to sixteenth memory banks BK0 to BK15. The command decoder 710 may generate a vector write signal WTVEC by decoding the external command E_CMD received as the vector write command. The command decoder 710 may generate a result write signal WTRST by decoding the external command E_CMD received as the result write command.

The address latch 720 may generate a row address signal ADDR_R and a column address signal ADDR_C based on the input address I_ADDR. The row address signal ADDR_R may be an address signal for selecting a specific row of a memory bank selected during an active operation performed by the active signal ACT. The column address signal ADDR_C may be an address signal for selecting a specific column coupled to an enabled row.

The column control circuit 730 may be coupled to the command decoder 710 and receive the plurality of internal command signals output from the command decoder 710. The column control circuit 730 may generate a memory read access control signal CASPRD and a buffer read access control signal CASPRD_GB based on the read signal RD and the vector write signal WTVEC. The column control circuit 730 may generate a memory write access control signal CASPWT and a buffer write access control signal CASPWT_GB based on the write signal WT.

The column control circuit 730 may generate the memory read access control signal CASPRD and a global buffer write signal IWTD based on the vector write signal WTVEC. The column control circuit 730 may generate the global buffer write signal IWTD when a first predetermined time elapses after generating the memory read access control signal CASPRD based on the vector write signal WTVEC. The first predetermined time may be a time till data stored in the first to sixteenth memory banks BK0 to BK15 is output to the global I/O line 690 based on the memory read access control signal CASPRD, or a longer time. In an embodiment, the column control circuit 730 may further receive a memory read timing signal PINB and generate the global buffer write signal IWTD based on the memory read timing signal PIN B. The memory read timing signal PINB may be a signal which is enabled when data stored in the first to sixteenth memory banks BK0 to BK15 is output to the global I/O line 690, and is output from the first to sixteenth memory banks BK0 to BK15. The column control circuit 730 may generate the global buffer write signal IWTD when the memory read timing signal PINB is enabled. The column control circuit 730 may generate a vector write flag FWTVEC based on the vector write signal WTVEC.

The column control circuit 730 may generate the memory read access control signal CASPRD and the memory write access control signal CASPWT based on the result write signal WTRST. The column control circuit 730 may generate the memory write access control signal CASPWT when a second predetermined time elapses after generating the memory read access control signal CASPRD based on the result write signal WTRST. The second predetermined time may be a time till a calculation result stored in the first to sixteenth MAC operators MAC0 to MAC15 is output to the global I/O line 690 based on the memory read access control signal CASPRD, or a longer time. In an embodiment, the column control circuit 730 may further receive a result read timing signal PINB_RST and generate the memory write access control signal CASPWT based on the result read timing signal PINB_RST. The result read timing signal PINB_RST may be a signal which is enabled when the first to sixteenth MAC operators MAC0 to MAC15 output a calculation result to the global I/O line 690, and is output from the first to sixteenth MAC operators MAC0 to MAC15. The column control circuit 730 may generate the memory write access control signal CASPWT when the result read timing signal PINB_RST is enabled. The column control circuit 730 may generate a result write flag FWTRST based on the result write signal WTRST.

The column control circuit 730 may generate an access address signal CA<0:n> (n is an integer equal to or greater than 2) based on the column address signal ADDR_C. The access address signal CA<0:n> may include a plurality of bits, and the number of bits included in the access address signal CA<0:n> may be changed depending on the number of columns to be accessed.

Each of the Y-decoders/I/O circuits YDEC/IO may receive the memory read access control signal CASPRD, the memory write access control signal CASPWT and the access address signal CA<0:n>. Each of the Y-decoders/I/O circuits YDEC/IO may output data from a column selected by the access address signal CA<0:n>, based on the memory read access control signal CASPRD. When outputting the data to the global I/O line 690, each of the Y-decoders/I/O circuits YDEC/IO may enable the memory read timing signal PINB and output the enabled memory read timing signal PINB. Each of the Y-decoders/I/O circuits YDEC/IO may write data, transmitted through the global I/O line 690, to a column selected by the access address signal CA<0:n>, based on the memory write access control signal CASPWT.

The global buffer 612 may receive the global buffer write signal IWTD, the vector write flag FWTVEC, the buffer read access control signal CASPRD_GB, the buffer write access control signal CASPWT_GB and the access address signal CA<0:n>. The global buffer 612 may write vector data, output from the first to sixteenth memory banks BK0 to BK15, to a column selected by the access address signal CA<0:n>, based on the global buffer write signal IWTD and the vector write flag FWTVEC. The global buffer 612 may output data from a column selected by the access address signal CA<0:n>, based on the buffer read access control signal CASPRD_GB. The global buffer 612 may write data, transmitted through the global I/O line 690, to a column selected by the access address signal CA<0:n>, based on the buffer write access control signal CASPWT_GB. Each of the first to sixteenth MAC operators MAC0 to MAC15 may receive the memory read access control signal CASPRD and the result write flag FWTRST. Each of the first to sixteenth MAC operators MAC0 to MAC15 may output a calculation result to the global I/O line 690, based on the memory read access control signal CASPRD or based on the memory read access control signal CASPRD and the result write flag FWTRST. When outputting the calculation result to the global I/O line 690, each of the first to sixteenth MAC operators MAC0 to MAC15 may enable the result read timing signal PINB_RST and output the enabled result read timing signal PINB_RST.

Figure 36A:
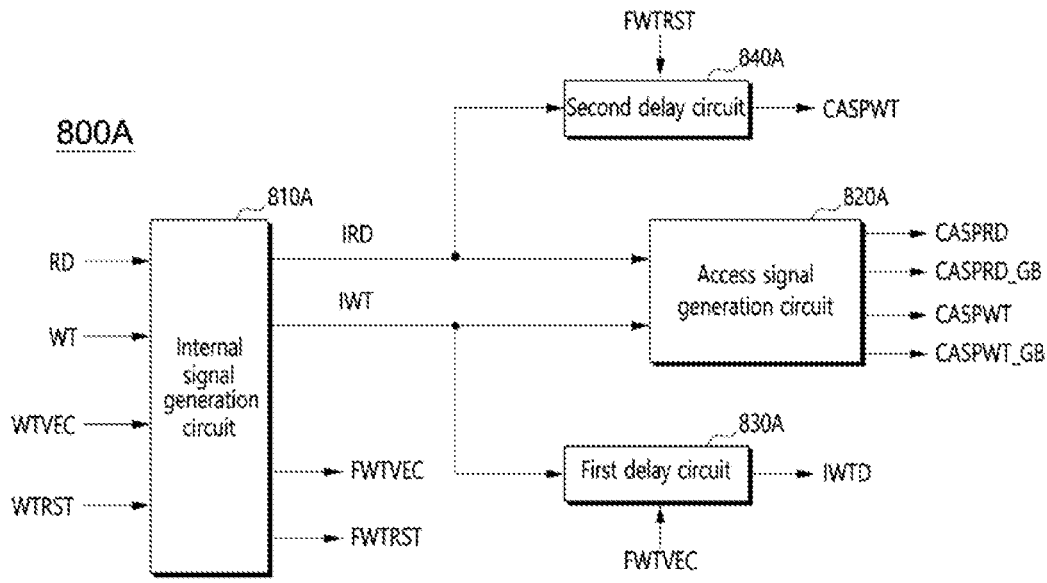
FIG. 36A is a diagram illustrating a configuration of a column control circuit in accordance with an embodiment of the present disclosure.

FIG. 36A is a diagram illustrating a configuration of a column control circuit 800A in accordance with an embodiment of the present disclosure. The column control circuit 800A may be applied as the column control circuit 730 illustrated in FIG. 35. The column control circuit 800A may illustrate a partial configuration of the column control circuit 730. Referring to FIG. 36A, the column control circuit 800A may include an internal signal generation circuit 810A, an access signal generation circuit 820A and a first delay circuit 830A. The internal signal generation circuit 810A may receive various internal command signals generated by the command decoder 710. The internal signal generation circuit 810A may receive the read signal RD, the write signal WT, the vector write signal WTVEC and the result write signal WTRST. The internal signal generation circuit 810A may generate an internal read signal IRD based on the read signal RD. The internal signal generation circuit 810A may generate an internal write signal IWT based on the write signal WT. The internal signal generation circuit 810A may generate the internal read signal IRD and the internal write signal IWT based on the vector write signal WTVEC, and may generate the vector write flag FWTVEC. The internal signal generation circuit 810A generates both the internal read signal IRD and the internal write signal IWT based on the vector write signal WTVEC so that the vector data stored in the first to sixteenth memory banks BK0 to BK15 may be read and the read vector data may be written to the global buffer 612. The internal signal generation circuit 810A may generate the internal read signal IRD and the internal write signal IWT based on the result write signal WTRST, and may generate the result write flag FWTRST. The internal signal generation circuit 810A generates both the internal read signal IRD and the internal write signal IWT based on the result write signal WTRST so that the calculation result stored in the first to sixteenth MAC operators MAC0 to MAC15 may be read and the read calculation result may be written to the first to sixteenth memory banks BK0 to BK15.

The access signal generation circuit 820A may receive the internal read signal IRD and the internal write signal IWT. The access signal generation circuit 820A may generate at least one of the memory read access control signal CASPRD and the buffer read access control signal CASPRD_GB based on the internal read signal IRD. The access signal generation circuit 820A may generate the memory read access control signal CASPRD based on the internal read signal IRD, when the internal read signal IRD is related with a read operation of the first to sixteenth memory banks BK0 to BK15. The access signal generation circuit 820A may generate the buffer read access control signal CASPRD_GB based on the internal read signal IRD, when the internal read signal IRD is related with a read operation of the global buffer 612. The access signal generation circuit 820A may adjust timings at which the memory read access control signal CASPRD and the buffer read access control signal CASPRD_GB are enabled, by delaying the internal read signal IRD according to various read latencies. The access signal generation circuit 820A may generate at least one of the memory write access control signal CASPWT and the buffer write access control signal CASPWT_GB based on the internal write signal IWT. The access signal generation circuit 820A may generate the memory write access control signal CASPWT based on the internal write signal IWT, when the internal write signal IWT is related with a write operation of the first to sixteenth memory banks BK0 to BK15. The access signal generation circuit 820A may generate the buffer write access control signal CASPWT_GB based on the internal write signal IWT, when the internal write signal IWT is related with a write operation of the global buffer 612. The access signal generation circuit 820A may adjust timings at which the memory write access control signal CASPWT and the buffer write access control signal CASPWT_GB are enabled, by delaying the internal write signal IWT according to various write latencies.

The first delay circuit 830A may receive the internal write signal IWT and the vector write flag FWTVEC, and may generate the global buffer write signal IWTD based on the internal write signal IWT and the vector write flag FWTVEC. When the vector write flag FWTVEC is enabled, the first delay circuit 830A may generate the global buffer write signal IWTD by delaying the internal write signal IWT. A delay amount of the first delay circuit 830A may be a time till the memory read access control signal CASPRD is generated and vector data stored in the first to sixteenth memory banks BK0 to BK15 is output to the global I/O line 690, or a longer time. Therefore, after the vector data is output from the first to sixteenth memory banks BK0 to BK15 to the global I/O line 690, the global buffer 612 may store the vector data transmitted through the global I/O line 690.

The column control circuit 800A may further include a second delay circuit 840A. The second delay circuit 840A may receive the internal read signal IRD and the result write flag FWTRST, and may generate the memory write access control signal CASPWT based on the internal read signal IRD and the result write flag FWTRST. When the result write flag FWTRST is enabled, the second delay circuit 840A may generate the memory write access control signal CASPWT by delaying the internal read signal IRD. A delay amount of the second delay circuit 840A may be a time till the memory read access control signal CASPRD is generated and the calculation result is output from the first to sixteenth MAC operators MAC0 to MAC15 to the global I/O line 690, or a longer time. Therefore, after the calculation result is output from the first to sixteenth MAC operators MAC0 to MAC15 to the global I/O line 690, the first to sixteenth memory banks BK0 to BK15 may store the calculation result transmitted through the global I/O line 690.

Figure 36B:
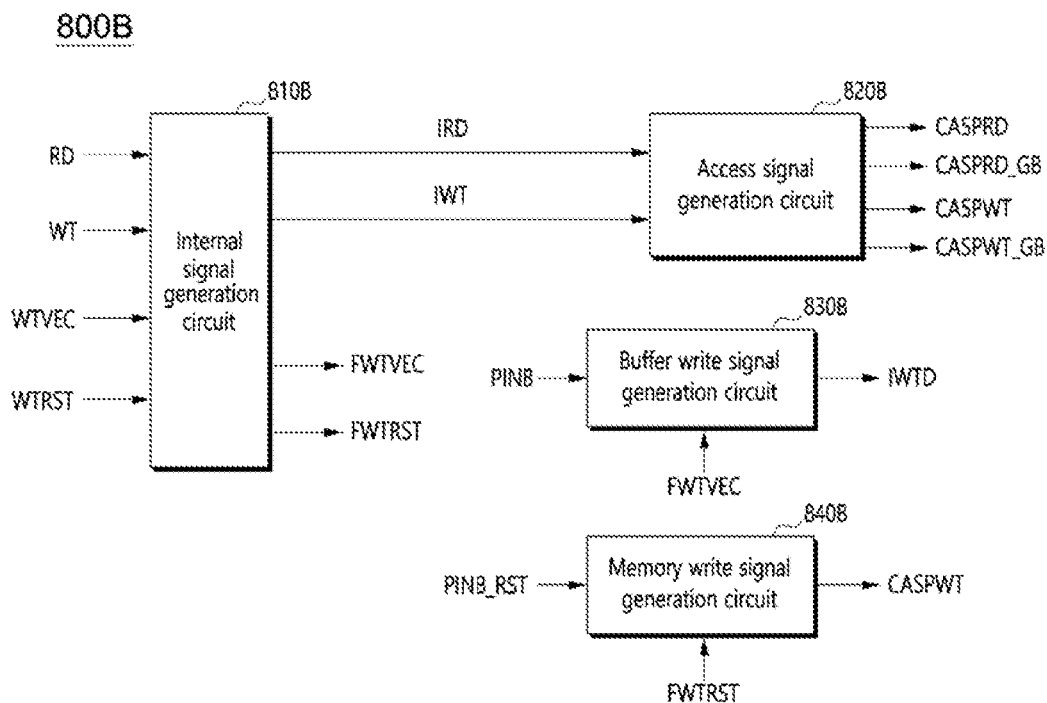
FIG. 36B is a diagram illustrating a configuration of a column control circuit in accordance with another embodiment of the present disclosure.

FIG. 36B is a diagram illustrating a configuration of a column control circuit 800B in accordance with another embodiment of the present disclosure. The column control circuit 800B may be applied as the column control circuit 730 illustrated in FIG. 35. The column control circuit 800B may illustrate a partial configuration of the column control circuit 730. Referring to FIG. 36B, the column control circuit 800B may include an internal signal generation circuit 810B, an access signal generation circuit 820B and a buffer write signal generation circuit 830B. The column control circuit 800B includes the same or similar configuration as or to the column control circuit 800A of FIG. 36A, and repeated description for the same configuration will be omitted herein. While the internal signal generation circuit 810A of the column control circuit 800A generates both the internal read signal IRD and the internal write signal IWT based on the vector write signal WTVEC, the internal signal generation circuit 810B may generate only the internal read signal IRD based on the vector write signal WTVEC and might not generate the internal write signal IWT. While the internal signal generation circuit 810A of the column control circuit 800A generates both the internal read signal IRD and the internal write signal IWT based on the result write signal WTRST, the internal signal generation circuit 810B may generate only the internal read signal IRD based on the result write signal WTRST and might not generate the internal write signal IWT.

The buffer write signal generation circuit 830B may receive the memory read timing signal PINB and the vector write flag FWTVEC, and may generate the global buffer write signal IWTD based on the memory read timing signal PINB and the vector write flag FWTVEC. When the vector write flag FWTVEC and the memory read timing signal PINB are enabled, the buffer write signal generation circuit 830B may generate the global buffer write signal IWTD. The memory read timing signal PINB is a signal which is enabled at a time point when the data stored in the first to sixteenth memory banks BK0 to BK15 is output to the global I/O line 690. Thus, after the vector data is output from the first to sixteenth memory banks BK0 to BK15 to the global I/O line 690, the global buffer 612 may store the vector data transmitted through the global I/O line 690.

The column control circuit 800B may further include a memory write signal generation circuit 840B. The memory write signal generation circuit 840B may receive the result read timing signal PIN B_RST and the result write flag FWTRST, and may generate the memory write access control signal CASPWT based on the result read timing signal PIN B_RST and the result write flag FWTRST. When the result write flag FWTRST and the result read timing signal PINB_RST are enabled, the memory write signal generation circuit 840B may generate the memory write access control signal CASPWT. The result read timing signal PINB_RST is a signal which is enabled in synchronization with a time point when the calculation result generated by the first to sixteenth MAC operators MAC0 to MAC15 is output to the global I/O line 690. Thus, after the calculation result is output from the first to sixteenth MAC operators MAC0 to MAC15 to the global I/O line 690, the first to sixteenth memory banks BK0 to BK15 may store the calculation result transmitted through the global I/O line 690.

Figure 37:
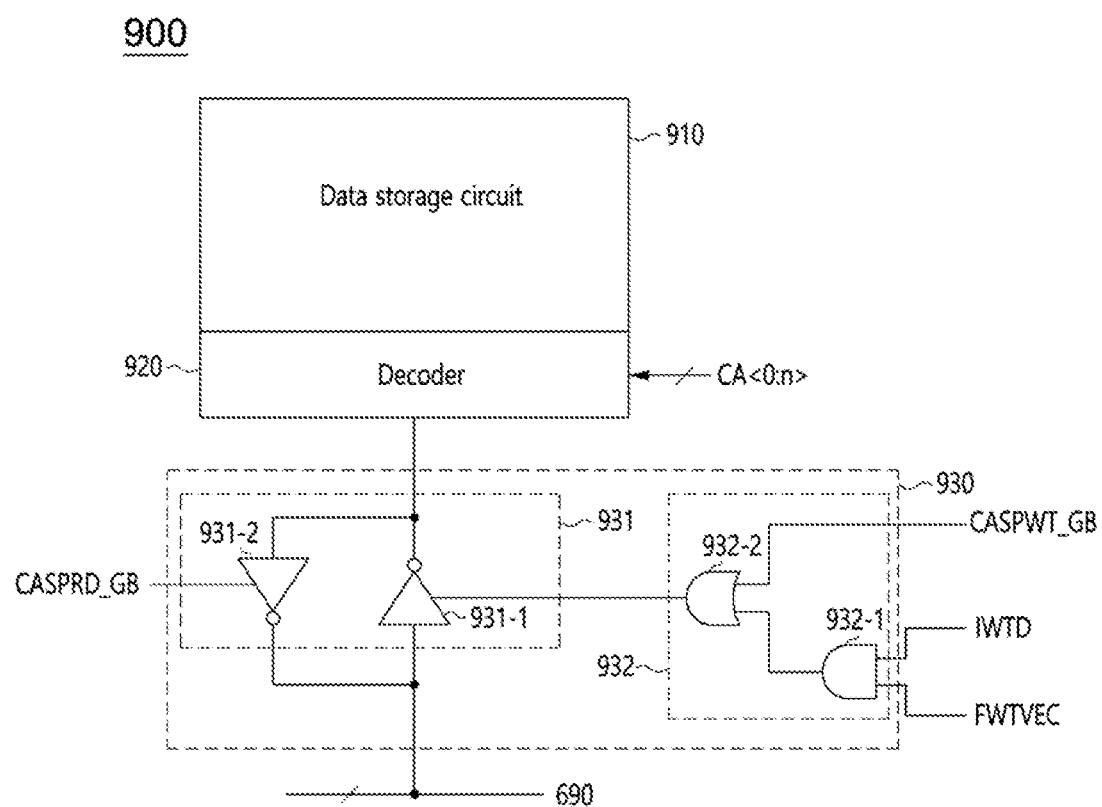
FIG. 37 is a diagram illustrating a configuration of a global buffer in accordance with an embodiment of the present disclosure.

FIG. 37 is a diagram illustrating a configuration of a global buffer 900 in accordance with an embodiment of the present disclosure. The global buffer 900 may be applied as the global buffer 612 illustrated in FIGS. 31 and 34. The global buffer 900 may be coupled to the global I/O line 690, and may include a data storage circuit 910, a decoder 920 and an operation control circuit 930. The data storage circuit 910 may store data transmitted through the global I/O line 690. The data storage circuit 910 may include a plurality of storage spaces which are identified by a plurality of rows and a plurality of columns, and the storage spaces may be latches or memory cells. The decoder 920 may select a specific storage space among the plurality of storage spaces of the data storage circuit 910. The decoder 920 may receive the access address signal CA<0:n> and select a storage space of the data storage circuit 910 based on the access address signal CA<0:n>. The decoder 920 may decode the access address signal CA<0:n>, and may select a column to be accessed among the plurality of columns of the data storage circuit 910, based on a decoded address signal. Although not illustrated, the global buffer 900 may further include a decoder capable of selecting a row to be accessed among the plurality of rows of the data storage circuit 910 based on a row address signal.

The operation control circuit 930 may receive the global buffer write signal IWTD and the vector write flag FWTVEC. When the vector write flag FWTVEC and the global buffer write signal IWTD are enabled, the operation control circuit 930 may drive data transmitted through the global I/O line 690 and write the driven data to the data storage circuit 910. The operation control circuit 930 may further receive the buffer write access control signal CASPWT_GB, may drive data, transmitted through the global I/O line 690, based on the buffer write access control signal CASPWT_GB, and may write the driven data to the data storage circuit 910. The operation control circuit 930 may drive data, output from the data storage circuit 910, based on the buffer read access control signal CASPRD_GB and output the driven data to the global I/O line 690.

The operation control circuit 930 may include a write/read driver 931 and a write control circuit 932. The write/read driver 931 may couple the global I/O line 690 and the data storage circuit 910. The write/read driver 931 may write data, transmitted through the global I/O line 690, to a data storage space selected by the decoder 920, based on the buffer write access control signal CASPWT_GB and the global buffer write signal IWTD. The write/read driver 931 may output data, stored in a data storage space selected by the decoder 920, to the global I/O line 690, based on the buffer read access control signal CASPRD_GB.

The write/read driver 931 may include a first driver 931-1 and a second driver 931-2. The first driver 931-1 may drive data on the global I/O line 690 and provide the driven data to the data storage circuit 910, by being controlled by the write control circuit 932. The second driver 931-2 may drive data stored in the data storage circuit 910 and provide the driven data to the global I/O line 690, based on the buffer read access control signal CASPRD_GB. For example, each of the first and second drivers 931-1 and 931-2 may include an inverter, and the number of inverters included in each of the first and second drivers 931-1 and 931-2 may correspond to the number of the global I/O lines 690.

The write control circuit 932 may activate the write/read driver 931 based on the buffer write access control signal CASPWT_GB or based on the vector write flag FWTVEC and the global buffer write signal IWTD. The write control circuit 932 may include an AND gate 932-1 and an OR gate 932-2. The AND gate 932-1 may receive the global buffer write signal IWTD and the vector write flag FWTVEC. The OR gate 932-2 may receive the buffer write access control signal CASPWT_GB and an output of the AND gate 932-1, and may activate the first driver 931-1 of the write/read driver 931 when the buffer write access control signal CASPWT_GB is enabled to a high logic level or the output of the AND gate 932-1 is enabled to a high logic level.

Figure 38:
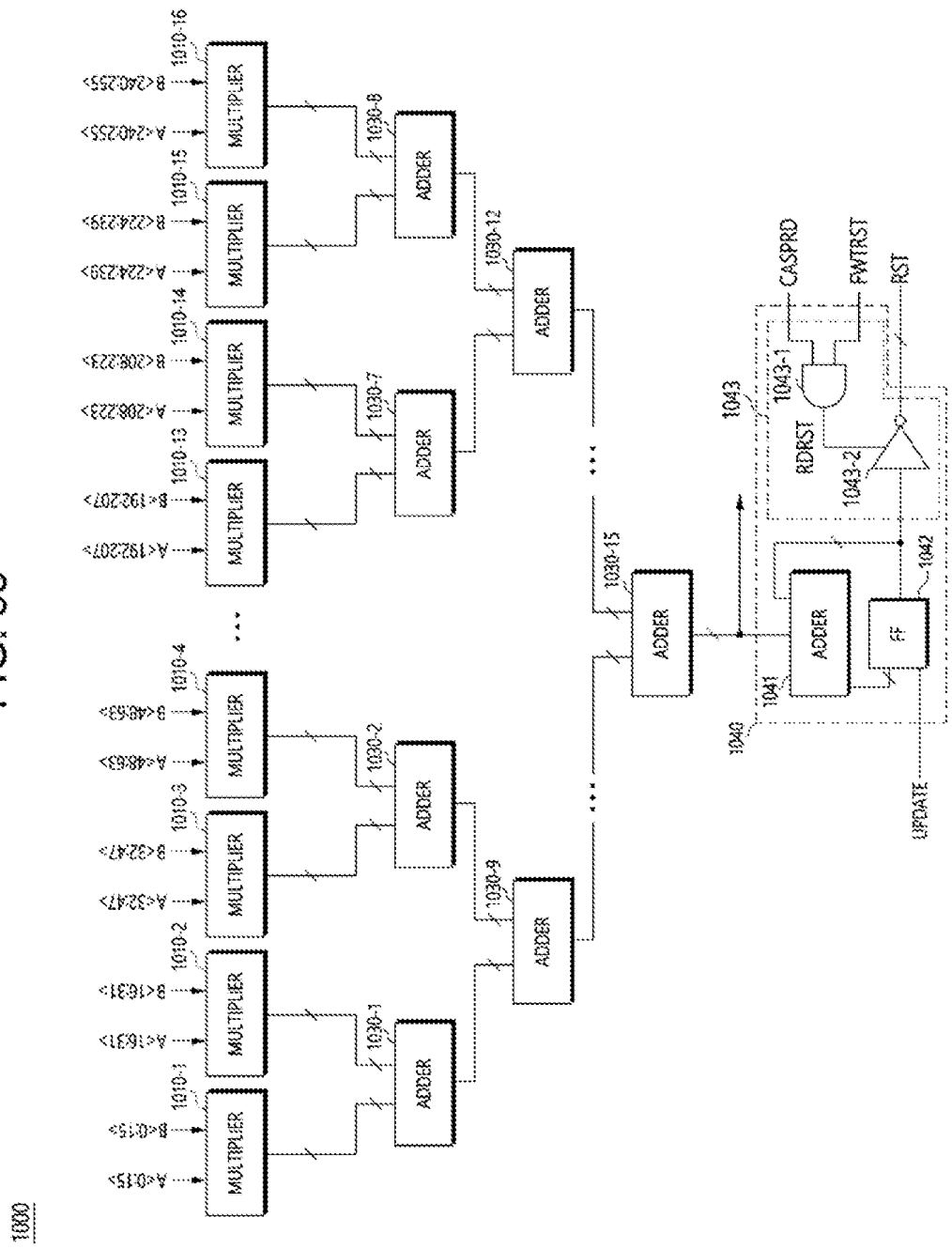
FIG. 38 is a diagram illustrating a configuration of an MAC operator in accordance with an embodiment of the present disclosure.

FIG. 38 is a diagram illustrating a configuration of an MAC operator 1000 in accordance with an embodiment of the present disclosure. The MAC operator 1000 may be applied as each of the MAC operators MAC0 to MAC15 illustrated in FIG. 34. Referring to FIG. 38, the MAC operator 1000 may perform a multiplication-accumulation calculation on input data, and may output a multiplication-accumulation calculation result. The MAC operator 1000 may include a plurality of multipliers, a plurality of adders and an accumulator. Each of the plurality of multipliers may receive data allocated thereto, and the number of the plurality of multipliers may be changed depending on the number of bits of the allocated data. For example, the MAC operator 1000 may include 16 multipliers. When the MAC operator 1000 is applied as the first MAC operator MAC0 which is coupled to the first memory bank BK0, a first multiplier 1010-1 may receive first to sixteenth bit data A<0:15> output from the first memory bank BK0 and first to sixteenth bit data B<0:15> output from the global buffer 612. The first multiplier 1010-1 may multiply the first to sixteenth bit data A<0:15> output from the first memory bank BK0 and the first to sixteenth bit data B<0:15> output from the global buffer 612. A second multiplier 1010-2 may receive seventeenth to 32nd bit data A<16:31> output from the first memory bank BK0 and seventeenth to 32nd bit data B<16:31> output from the global buffer 612, and may multiply the seventeenth to 32nd bit data A<16:31> output from the first memory bank BK0 and the seventeenth to 32nd bit data B<16:31> output from the global buffer 612. A third multiplier 1010-3 may receive 33rd to 48th bit data A<32:47> output from the first memory bank BK0 and 33rd to 48th bit data B<32:47> output from the global buffer 612, and may multiply the 33rd to 48th bit data A<32:47> output from the first memory bank BK0 and the 33rd to 48th bit data B<32:47> output from the global buffer 612. A fourth multiplier 1010-4 may receive 49th to 64th bit data A<48:63> output from the first memory bank BK0 and 49th to 64th bit data B<48:63> output from the global buffer 612, and may multiply the 49th to 64th bit data A<48:63> output from the first memory bank BK0 and the 49th to 64th bit data B<48:63> output from the global buffer 612. A thirteenth multiplier 1010-13 may receive 193rd to 208th bit data A<192:207> output from the first memory bank BK0 and 193rd to 208th bit data B<192:207> output from the global buffer 612, and may multiply the 193rd to 208th bit data A<192:207> output from the first memory bank BK0 and the 193rd to 208th bit data B<192:207> output from the global buffer 612. A fourteenth multiplier 1010-14 may receive 209th to 224th bit data A<208:223> output from the first memory bank BK0 and 209th to 224th bit data B<208:223> output from the global buffer 612, and may multiply the 209th to 224th bit data A<208:223> output from the first memory bank BK0 and the 209thd to 224th bit data B<208:223> output from the global buffer 612. A fifteenth multiplier 1010-15 may receive 225th to 240th bit data A<224:239> output from the first memory bank BK0 and 225th to 240th bit data B<224:239> output from the global buffer 612, and may multiply the 225th to 240th bit data A<224:239> output from the first memory bank BK0 and the 225th to 240th bit data B<224:239> output from the global buffer 612. A sixteenth multiplier 1010-16 may receive 241st to 256th bit data A<240:255> output from the first memory bank BK0 and 241st to 256th bit data B<240:255> output from the global buffer 612, and may multiply the 241st to 256th bit data A<240:255> output from the first memory bank BK0 and the 241st to 256th bit data B<240:255> output from the global buffer 612.

The MAC operator 1000 may include 15 adders. A first adder 1030-1 may receive data output from the first and second multipliers 1010-1 and 1010-2, and may add the data output from the first and second multipliers 1010-1 and 1010-2. A second adder 1030-2 may receive data output from the third and fourth multipliers 1010-3 and 1010-4, and may add the data output from the third and fourth multipliers 1010-3 and 1010-4. A seventh adder 1030-7 may receive data output from the thirteenth and fourteenth multipliers 1010-13 and 1010-14, and may add the data output from the thirteenth and fourteenth multipliers 1010-13 and 1010-14. An eighth adder 1030-8 may receive data output from the fifteenth and sixteenth multipliers 1010-15 and 1010-16, and may add the data output from the fifteenth and sixteenth multipliers 1010-15 and 1010-16. The first to eighth adders 1030-1, 1030-2, . . . , 1030-7, and 1030-8 may be floating point adders. A ninth adder 1030-9 may receive data output from the first and second adders 1030-1 and 1030-2, and may add the data output from the first and second adders 1030-1 and 1030-2. A twelfth adder 1030-12 may receive data output from the seventh and eighth adders 1030-7 and 1030-8, and may add the data output from the seventh and eighth adders 1030-7 and 1030-8. A fifteenth adder 1030-15 may receive data output from thirteenth and fourteenth adders (not illustrated), and may add the data output from the thirteenth and fourteenth adders.

An accumulator 1040 may receive and store data output from the fifteenth adder 1030-15. Each time an update signal UPDATE is enabled, the accumulator 1040 may add data, newly output from the fifteenth adder 1030-15, to a stored data value and may store added data again. The accumulator 1040 may include one adder 1041, an updater 1042 and an output control circuit 1043. The adder 1041 may receive data output from the fifteenth adder 1030-15, and may store the received data. The adder 1041 may output the stored data to the updater 1042. The adder 1041 may receive data output from the updater 1042, and may add the data output from the updater 1042 and the data output from the fifteenth adder 1030-15. The updater 1042 may be implemented by a flip-flop FF. An input terminal of the flip-flop FF may receive an output of the adder 1041, and a clock terminal of the flip-flop FF may receive the update signal UPDATE. An output terminal of the flip-flop FF may be coupled to the adder 1041, and the adder 1041 may receive data output through the output terminal of the flip-flop FF.

The output control circuit 1043 may receive the memory read access control signal CASPRD and the result write flag FWTRST, and may output a calculation result RST, generated by the MAC operator 1000, based on the memory read access control signal CASPRD and the result write flag FWTRST. The output control circuit 1043 may receive the calculation result RST output from the updater 1042, and may output the calculation result RST when both the memory read access control signal CASPRD and the result write flag FWTRST are enabled. The output control circuit 1043 may include an AND gate 1043-1 and a driver 1043-2. The AND gate 1043-1 may receive the memory read access control signal CASPRD and the result write flag FWTRST. The AND gate 1043-1 may enable a result read signal RDRST to a high logic level when both the memory read access control signal CASPRD and the result write flag FWTRST are enabled to high logic levels. The driver 1043-2 may be coupled to the output terminal of the flip-flop FF and receive the result read signal RDRST. The driver 1043-2 may output the calculation result RST, received from the output terminal of the flip-flop FF, when the result read signal RDRST is enabled to a high logic level.

Figure 39:
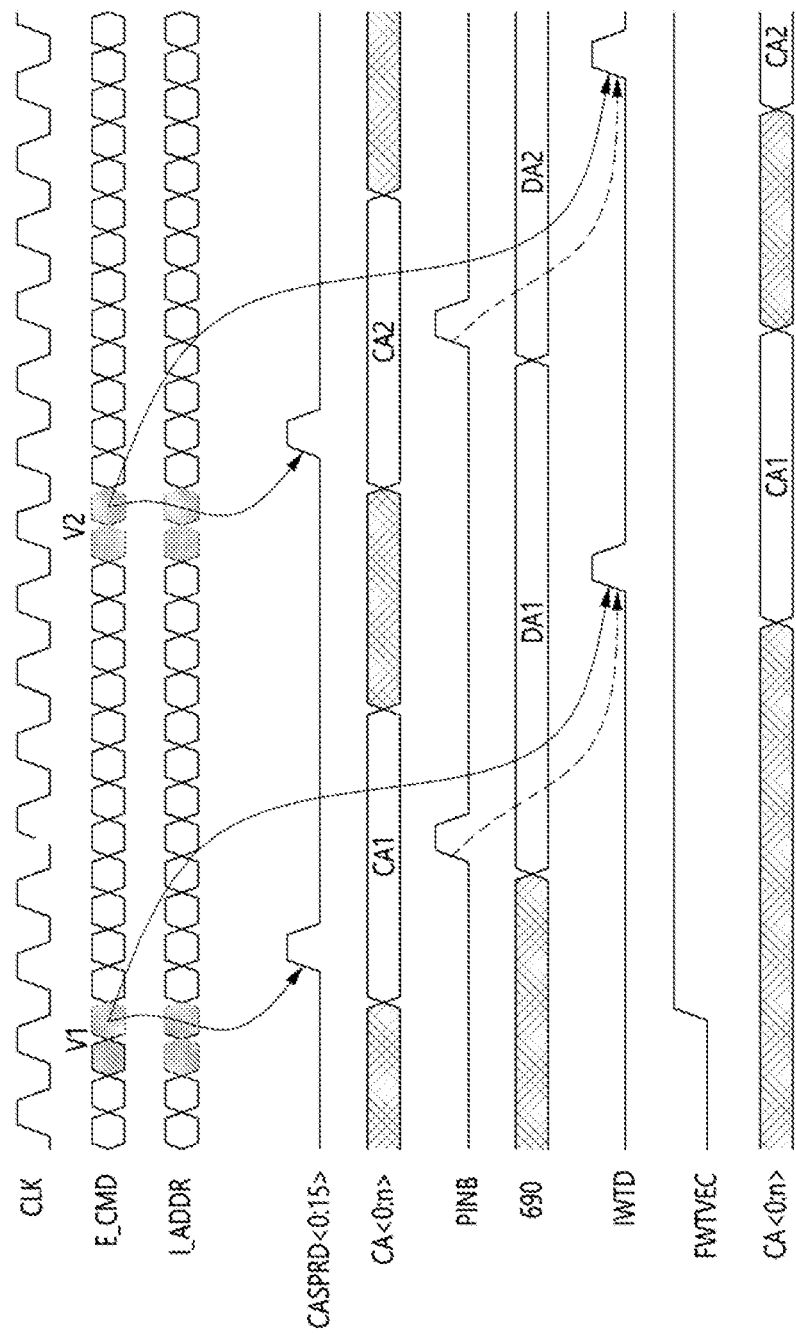
FIG. 39 is a timing diagram illustrating an operation of the PIM device in accordance with the embodiment of the present disclosure.

FIG. 39 is a timing diagram illustrating an operation of the PIM device in accordance with the embodiment of the present disclosure. FIG. 39 may illustrate an operation in which, based on a vector write command, the first arithmetic device 610 of the PIM device 600 illustrated in FIG. 31 reads vector data stored in the data storage region 611 and writes the read vector data to the global buffer 612. The operation of the PIM device in accordance with the embodiment of the present disclosure will be described below with reference to FIGS. 31 and 34 to 39. The external device 601 may provide the external command E_CMD, corresponding to an active command, to the PIM device 600, and the first arithmetic device 610 may enable a specific row of the first to sixteenth memory banks BK0 to BK15 based on the external command E_CMD and the row address signal ADDR_R generated from the input address I_ADDR received together with the external command E_CMD. When the external command E_CMD corresponding to a vector write command V1 is firstly received from the external device 601, the command decoder 710 may generate the vector write signal WTVEC by decoding the external command E_CMD. The column control circuit 730 may enable the memory read access control signal CASPRD<0:15> and the vector write flag FWTVEC based on the vector write signal WTVEC. Bits of the memory read access control signal CASPRD<0: 15> may be allocated to the Y-decoders/I/O circuits YDEC/ IO, respectively, of the first to sixteenth memory banks BK0 to BK15. The column control circuit 730 may generate the access address signal CA<0:n> (CA1) based on the column address signal ADDR_C generated based on the input address I_ADDR received together with the first vector write command V1. When the memory read access control signal CASPRD<0:15> is enabled, first vector data DA1 may be output from a column selected based on the access address signal CA1 in the first to sixteenth memory banks BK0 to BK15. The first vector data DA1 may be transmitted through the global I/O line 690. The first to sixteenth memory banks BK0 to BK15 may enable the memory read timing signal PINB when outputting the first vector data DA1. After the first vector data DA1 is output from the first to sixteenth memory banks BK0 to BK15 to the global I/O line 690, the column control circuit 730 may enable the global buffer write signal IWTD. When the global buffer write signal IWTD is enabled, the global buffer 612 may write the first vector data DA1, transmitted through the global I/O line 690, to the data storage circuit 910. The decoder 920 may select a storage space of the data storage circuit 910 based on the access address signal CA1, and the first driver 931-1 may write the first vector data DA1, transmitted through the global I/O line 690, to the selected storage space.

When a size of the vector data is larger than a unit access size of the PIM device 600, the external command E_CMD corresponding to a vector write command V2 may be secondly input. The second vector write command V2 may be input when a predetermined time elapses after the first vector write command V1 is input. The predetermined time may be variously changed. However, the predetermined time may be a time longer than a time required for the global buffer write signal IWTD to be enabled after the external command E_CMD corresponding to the vector write command is input. The command decoder 710 may generate the vector write signal WTVEC by decoding the external command E_CMD. Based on the vector write signal WTVEC, the column control circuit 730 may enable the memory read access control signal CASPRD and maintain the vector write flag FWTVEC in an enabled state. The column control circuit 730 may generate the column address signal ADDR_C based on the input address I_ADDR received together with the second vector write command V2, and may generate the access address signal CA<0:n> (CA2) based on the column address signal ADDR_C. The access address signal CA2 may be generated based on the input address I_ADDR other from the input address I_ADDR received together with the first vector write command V1. When the memory read access control signal CASPRD is enabled, second vector data DA2 may be output from another column selected based on the access address signal CA2 in the first to sixteenth memory banks BK0 to BK15. The second vector data DA2 may be transmitted through the global I/O line 690. The first to sixteenth memory banks BK0 to BK15 may enable the memory read timing signal PINB when outputting the second vector data DA2. After the second vector data DA2 is output from the first to sixteenth memory banks BK0 to BK15 to the global I/O line 690, the column control circuit 730 may enable the global buffer write signal IWTD. When the global buffer write signal IWTD is enabled, the global buffer 612 may write the second vector data DA2, transmitted through the global I/O line 690, to the data storage circuit 910. The decoder 920 may select a storage space of the data storage circuit 910 based on the access address signal CA2, and the first driver 931-1 may write the second vector data DA2, transmitted through the global I/O line 690, to the selected storage space. The external device 601 may continuously provide the external command E_CMD, corresponding to the vector write command, to the PIM device 600 until entire vector data is transferred and stored from the first to sixteenth memory banks BK0 to BK15 to and in the global buffer 612.

Figure 40:
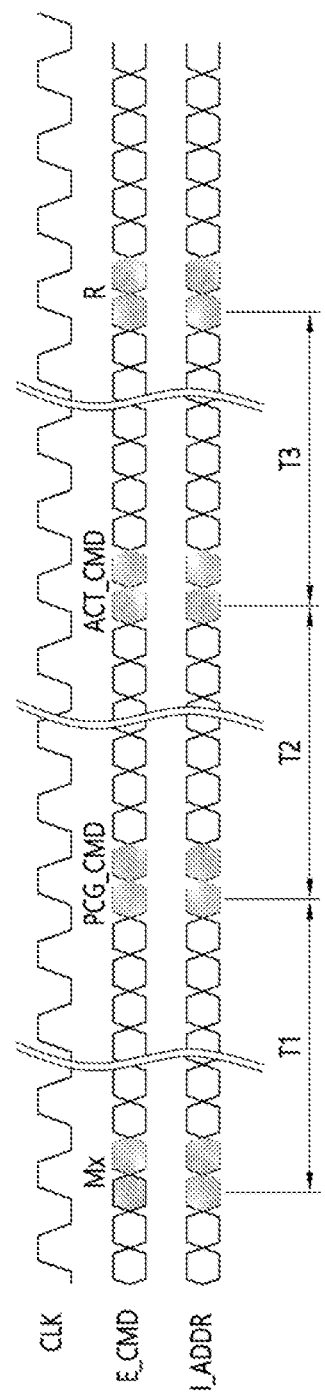
FIG. 40 is a timing diagram illustrating an operation of the PIM device in accordance with the embodiment of the present disclosure.

FIG. 40 is a timing diagram illustrating an operation of the PIM device in accordance with the embodiment of the present disclosure. FIG. 40 may illustrate an operation in which, based on a calculation command, the first arithmetic device 610 of the PIM device 600 reads weight data stored in the data storage region 611 and vector data stored in the global buffer 612 and performs a calculation on the read weight data and vector data. When the vector data is transferred and stored from the first to sixteenth memory banks BK0 to BK15 to and in the global buffer 612, the external device 601 may provide the external command E_CMD, corresponding to a calculation command, to the PIM device 600. Based on the calculation command, the PIM device 600 may read the weight data stored in the first to sixteenth memory banks BK0 to BK15 and read the vector data stored in the global buffer 612. The arithmetic circuit 613 may perform a calculation on the weight data read from the first to sixteenth memory banks BK0 to BK15 and the vector data read from the global buffer 612, and may generate the calculation result RST. The external device 601 may continuously provide the calculation command to the PIM device 600 until a calculation on entire vector data is performed. When a first time T1 elapses after a last calculation command Mx is received, the external device 601 may provide the external command E_CMD as a precharge command PCG_CMD. The first arithmetic device 610 may disable an enabled row based on the precharge command PCG_CMD. The first time T1 may be longer than a time till the PIM device 600 generates the calculation result RST after receiving the calculation command. When a second time T2 elapses after the precharge command PCG_CMD is input, the external device 601 may provide the external command E_CMD as an active command ACT_CMD. Based on the active command ACT_CMD, the first arithmetic device 610 may enable a row other than a row which has been enabled to transfer and store the vector data to and in the global buffer 612. The second time T2 may define a time interval during which the active command ACT_CMD may be input after the precharge command PCG_CMD is input. When a third time T3 elapses after the active command ACT_CMD is input, the external device 601 may provide the external command E_CMD as a result write command R. The third time T3 may define a time interval during which a column command may be input after the active command ACT_CMD is input. The column command may include the result write command R.

Figure 41:
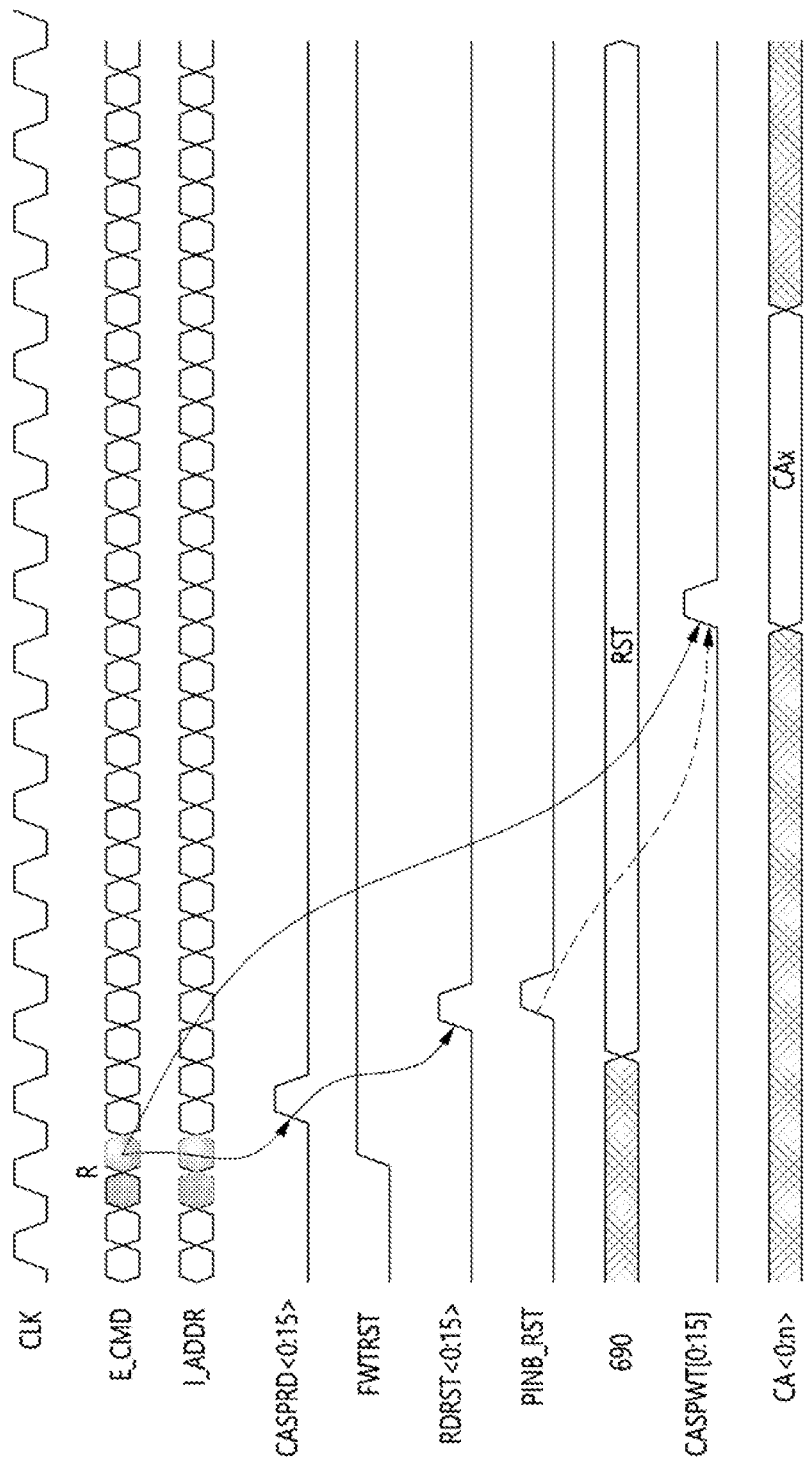
FIG. 41 is a timing diagram illustrating an operation of the PIM device in accordance with the embodiment of the present disclosure.

FIG. 41 is a timing diagram illustrating an operation of the PIM device in accordance with the embodiment of the present disclosure. FIG. 41 may illustrate an operation in which the first arithmetic device 610 of the PIM device 600 writes a calculation result to the data storage region 611 based on the result write command R. As described above with reference to FIG. 40, when a row of the first to sixteenth memory banks BK0 to BK15 for storing the calculation result is selected, the external device 601 may provide the external command E_CMD, corresponding to the result write command R, to the PIM device 600. The command decoder 710 may generate the result write signal WTRST by decoding the external command E_CMD. Based on the result write signal WTRST, the column control circuit 730 may generate the memory read access control signal CASPRD<0:15> and enable the result write flag FWTRST. When the memory read access control signal CASPRD<0:15> and the result write flag FWTRST are enabled, the result read signal RDRST<0:15> of the first to sixteenth MAC operators MAC0 to MAC15 is enabled, and the first to sixteenth MAC operators MAC0 to MAC15 may output the calculation result RST to the global I/O line 690 based on the result read signal RDRST<0:15>. After a time during which the calculation result RST is output from the arithmetic circuit 613 to the global I/O line 690, the column control circuit 730 may generate the memory write access control signal CASPWT<0:15>. A column of the first to sixteenth memory banks BK0 to BK15 may be selected based on the column address signal ADDR_C and the access address signal CA<0:n> (CAx) generated based on the input address I_ADDR received together with the result write command R, and, when the memory write access control signal CASPWT<0:15> is enabled, the calculation result RST of the first to sixteenth MAC operators MAC0 to MAC15 transmitted through the global I/O line 690 may be written to the first to sixteenth memory banks BK0 to BK15.

In an embodiment, when outputting the calculation result RST, the arithmetic circuit 613 may output the result read timing signal PIN B_RST together in synchronization with a timing at which the calculation result RST is output. The column control circuit 730 may be modified to enable the memory write access control signal CASPWT<0:15>, based on the result read timing signal PINB_RST output from the arithmetic circuit 613.

Figure 42:
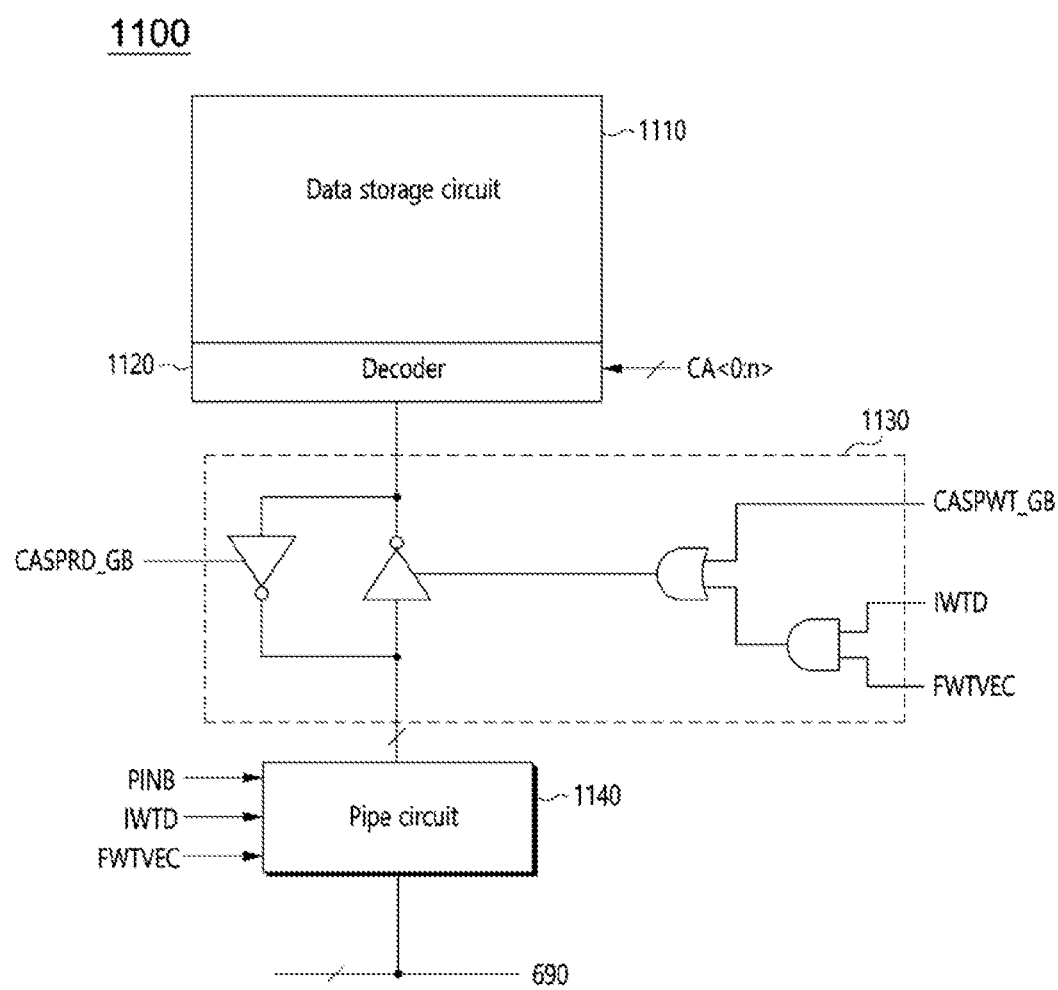
FIG. 42 is a diagram illustrating a configuration of a global buffer in accordance with another embodiment of the present disclosure.

FIG. 42 is a diagram illustrating a configuration of a global buffer 1100 in accordance with another embodiment of the present disclosure. The global buffer 1100 may replace the global buffer 900 illustrated in FIG. 37. A data storage circuit 1110, a decoder 1120 and an operation control circuit 1130 of the global buffer 1100 may be the same as the data storage circuit 910, the decoder 920 and the operation control circuit 930, respectively, of the global buffer 900 illustrated in FIG. 37, and thus, repeated description for the same components will be omitted herein. The global buffer 1100 may further include a pipe circuit 1140. The pipe circuit 1140 may reduce a time interval during which the external command E_CMD corresponding to the vector write command is provided from the external device 601 to the PIM device 600. The pipe circuit 1140 may receive the memory read timing signal PINB, the global buffer write signal IWTD and the vector write flag FWTVEC, may sequentially store data, transmitted through the global I/O line 690, based on the memory read timing signal PINB, the global buffer write signal IWTD and the vector write flag FWTVEC, and then, may sequentially output the sequentially stored data. The pipe circuit 1140 may sequentially store data, transmitted through the global I/O line 690, based on the memory read timing signal PINB and the vector write flag FWTVEC. When the vector write flag FWTVEC is enabled, the pipe circuit 1140 may store data, transmitted through the global I/O line 690, each time the memory read timing signal PINB is enabled. For example, the pipe circuit 1140 may sequentially store four different data, transmitted through the global I/O line 690, in different storage spaces. The pipe circuit 1140 may sequentially output data, stored in the pipe circuit 1140, to the operation control circuit 1130 of the global buffer 1100, based on the global buffer write signal IWTD and the vector write flag FWTVEC. The pipe circuit 1140 may sequentially output, to the operation control circuit 1130, data sequentially stored in the pipe circuit 1140 each time the global buffer write signal IWTD is enabled with the vector write flag FWTVEC enabled.

Figure 43:
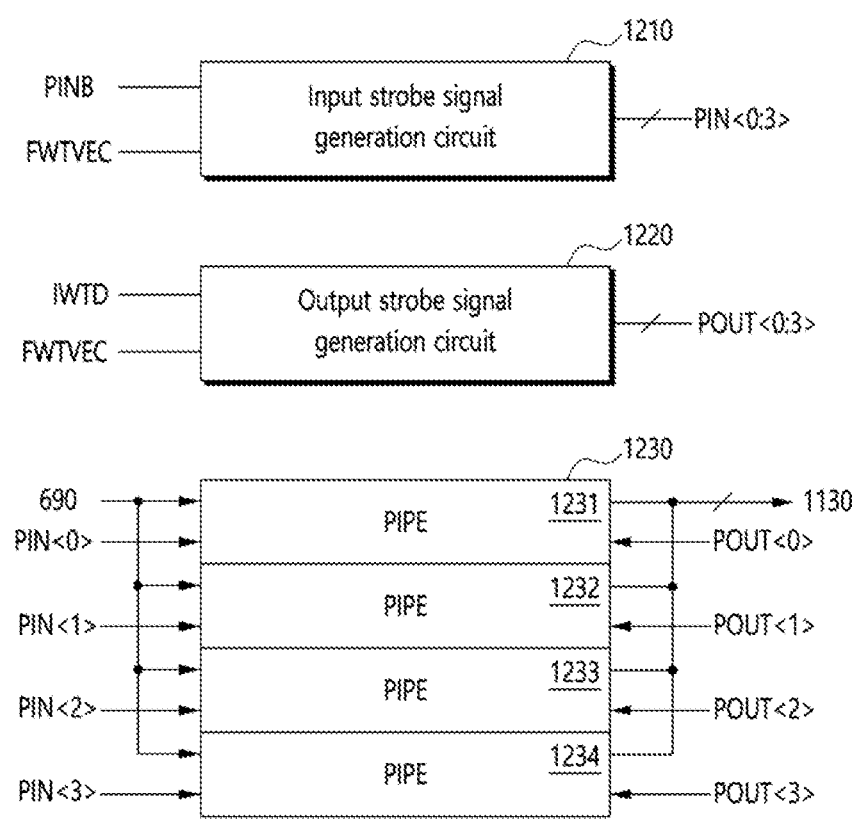
FIG. 43 is a diagram illustrating a configuration of a pipe circuit illustrated in FIG. 42.

FIG. 43 is a diagram illustrating a configuration of the pipe circuit 1140 illustrated in FIG. 42. Referring to FIG. 43, the pipe circuit 1140 may include an input strobe signal generation circuit 1210, an output strobe signal generation circuit 1220 and a plurality of pipes (PIPE) 1231, 1232, 1233 and 1234. In FIG. 43, the pipe circuit 1140 may include four pipes 1231, 1232, 1233 and 1234, but the number of pipes included in the pipe circuit 1140 may be variously changed. The input strobe signal generation circuit 1210 may receive the memory read timing signal PINB and the vector write flag FWTVEC, and may generate a plurality of input strobe signals PIN<0:3> based on the memory read timing signal PINB and the vector write flag FWTVEC. The input strobe signal generation circuit 1210 may sequentially enable the plurality of input strobe signals PIN<0:3> one by one each time the memory read timing signal PINB is enabled with the vector write flag FWTVEC enabled. For example, when the memory read timing signal PINB is enabled for the first time, the input strobe signal generation circuit 1210 may enable the input strobe signal PIN<0>, and may maintain the remaining input strobe signals PIN<1:3> in a disabled state. When the memory read timing signal PINB is enabled for the second time, the input strobe signal generation circuit 1210 may enable the input strobe signal PIN<1>, and may maintain the remaining input strobe signals PIN<0, 2:3> in a disabled state.

The output strobe signal generation circuit 1220 may receive the global buffer write signal IWTD and the vector write flag FWTVEC, and may generate a plurality of output strobe signals POUT<0:3> based on the global buffer write signal IWTD and the vector write flag FWTVEC. The output strobe signal generation circuit 1220 may sequentially enable the plurality of output strobe signals POUT<0:3> one by one each time the global buffer write signal IWTD is enabled with the vector write flag FWTVEC enabled. For example, when the global buffer write signal IWTD is enabled for the first time, the output strobe signal generation circuit 1220 may enable the output strobe signal POUT<0>, and may maintain the remaining output strobe signals POUT<1:3> in a disabled state. When the global buffer write signal IWTD is enabled for the second time, the output strobe signal generation circuit 1220 may enable the output strobe signal POUT<1>, and may maintain the remaining output strobe signals POUT<0, 2:3> in a disabled state.

The four pipes 1231, 1232, 1233 and 1234 may receive the input strobe signals PIN<0:3> allocated thereto and the output strobe signals POUT<0:3> allocated thereto, respectively. The first pipe 1231 may receive the input strobe signal PIN<0> and the output strobe signal POUT<0>, and the second pipe 1232 may receive the input strobe signal PIN<1> and the output strobe signal POUT<1>. The third pipe 1233 may receive the input strobe signal PIN<2> and the output strobe signal POUT<2>, and the fourth pipe 1234 may receive the input strobe signal PIN<3> and the output strobe signal POUT<3>. When the input strobe signal PIN<0> is enabled, the first pipe 1231 may be coupled to the global I/O line 690 and store data transmitted through the global I/O line 690. When the output strobe signal POUT<0> is enabled, the first pipe 1231 may output stored data to the operation control circuit 1130. When the input strobe signal PIN<1> is enabled, the second pipe 1232 may be coupled to the global I/O line 690 and store data transmitted through the global I/O line 690. When the output strobe signal POUT<1> is enabled, the second pipe 1232 may output stored data to the operation control circuit 1130. When the input strobe signal PIN<2> is enabled, the third pipe 1233 may be coupled to the global I/O line 690 and store data transmitted through the global I/O line 690. When the output strobe signal POUT<2> is enabled, the third pipe 1233 may output stored data to the operation control circuit 1130. When the input strobe signal PIN<3> is enabled, the fourth pipe 1234 may be coupled to the global I/O line 690 and store data transmitted through the global I/O line 690. When the output strobe signal POUT<3> is enabled, the fourth pipe 1234 may output stored data to the operation control circuit 1130.

Figure 44:
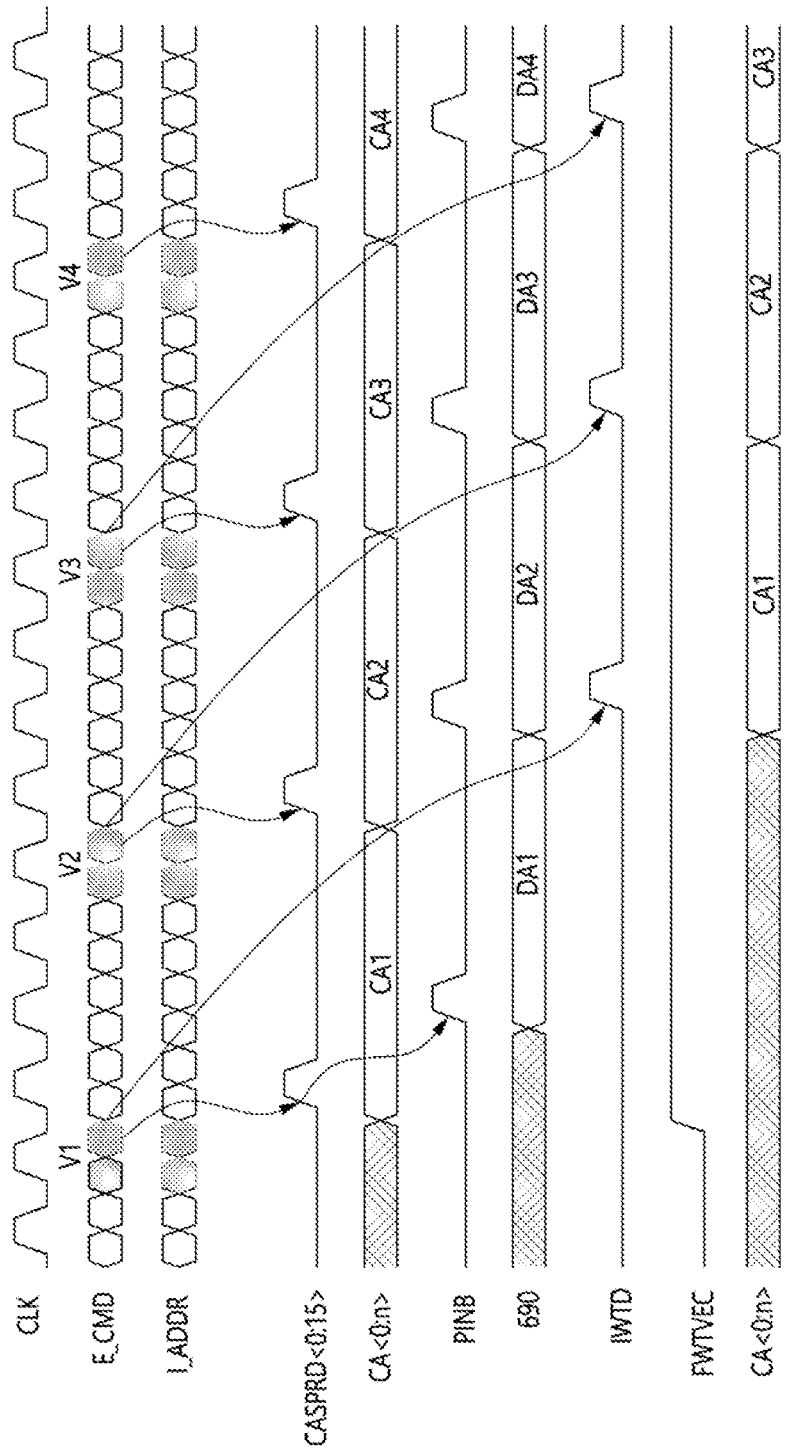
FIG. 44 is a timing diagram illustrating an operation of the PIM device in accordance with the embodiment of the present disclosure.

FIG. 44 is a timing diagram illustrating an operation of the PIM device in accordance with the embodiment of the present disclosure. FIG. 44 may illustrate an operation in which, based on a vector write command, the first arithmetic device 610 of the PIM device 600 including the global buffer 1100 illustrated in FIG. 42 reads vector data stored in the data storage region 611 and writes the read vector data to the global buffer 1100. The external device 601 might not be influenced by a time interval for providing the external command E_CMD, corresponding to the vector write command, to the PIM device 600 as illustrated in FIG. 39. The external device 601 may provide the vector write command at each time interval shorter than the time interval at which the vector write command is received in FIG. 39. Since the external device 601 may provide a plurality of vector write commands to the PIM device 600 at shorter time intervals, the operation speed of the PIM device 600 and a system including the PIM device 600 may be improved. When receiving a first vector write command V1, the control circuit 614 of the first arithmetic device 610 may enable the vector write flag FWTVEC and enable the memory read access control signal CASPRD<0:15>. First vector data DA1 may be read from the first to sixteenth memory banks BK0 to BK15 of the data storage region 611, based on the memory read access control signal CASPRD<0:15> and a first access address signal CA<0:n> (CA1) generated based on the input address I_ADDR received together with the first vector write command V1. The first vector data DA1 read from the first to sixteenth memory banks BK0 to BK15 may be output to the global I/O line 690, and the Y-decoders/I/O circuits YDEC/IO may output the memory read timing signal PINB in synchronization with a timing at which the first vector data DA1 is output. The control circuit 614 may generate the memory read access control signal CASPRD<0:15> each time the vector write command is input (that is, when each of second to fourth vector write commands V2, V3 and V4 is input), and second to fourth vector data DA2, DA3 and DA4 may be read from the first to sixteenth memory banks BK0 to BK15 based on second to fourth access address signals CA2, CA3 and CA4 generated based on the input address I_ADDR input together with the vector write commands V2, V3 and V4. The Y-decoders/I/O circuits YDEC/IO may enable the memory read timing signal PINB each time the vector data is output to the global I/O line 690.

The pipe circuit 1140 of the global buffer 1100 may enable the input strobe signals PIN<0:3> each time the memory read timing signal PINB is enabled. The pipe circuit 1140 may sequentially store data, transmitted through the global I/O line 690, to the pipes 1231, 1232, 1233 and 1234 when the input strobe signals PIN<0:3> are enabled. The pipe circuit 1140 may store the first vector data DA1, transmitted through the global I/O line 690, in the first pipe 1231 when the input strobe signal PIN<0> is enabled, and may store the second vector data DA2, transmitted through the global I/O line 690, in the second pipe 1232 when the input strobe signal PIN<1> is enabled. The pipe circuit 1140 may store the third vector data DA3, transmitted through the global I/O line 690, in the third pipe 1233 when the input strobe signal PIN<2> is enabled, and may store the fourth vector data DA4, transmitted through the global I/O line 690, in the fourth pipe 1234 when the input strobe signal PIN<3> is enabled. When the input strobe signal PIN<0> is enabled again, the pipe circuit 1140 may store fifth vector data, transmitted through the global I/O line 690, in the first pipe 1231 again. The control circuit 614 may enable the global buffer write signal IWTD when a predetermined time elapses after the first memory read access control signal CASPRD<0:15> is enabled. When the global buffer write signal IWTD is enabled, the pipe circuit 1140 may enable the output strobe signals POUT<0:3>. When the output strobe signal POUT<0> is enabled, data stored in the first pipe 1231 may be provided to the operation control circuit 1130, and the data may be written to the data storage circuit 1110 based on the global buffer write signal IWTD and the first access address signal CA1. When the output strobe signal POUT<1> is enabled, data stored in the second pipe 1232 may be provided to the operation control circuit 1130, and the data may be written to the data storage circuit 1110 based on the global buffer write signal IWTD and the second access address signal CA2. When the output strobe signal POUT<2> is enabled, data stored in the third pipe 1233 may be provided to the operation control circuit 1130, and the data may be written to the data storage circuit 1110 based on the global buffer write signal IWTD and the third access address signal CA3. When the output strobe signal POUT<3> is enabled, data stored in the fourth pipe 1234 may be provided to the operation control circuit 1130, and the data may be written to the data storage circuit 1110 based on the global buffer write signal IWTD and the fourth access address signal CA4.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device comprising:
a data storage region configured to store vector data and weight data, and configured to output the vector data based on a first single external command;
a global buffer configured to store the vector data read from the data storage region based on the first single external command; and
an arithmetic circuit configured to receive the vector data from the global buffer, to receive the weight data from the data storage region, and to generate a calculation result by performing a calculation on the vector data from the global buffer and the weight data from the data storage region.

2. The PIM device according to claim 1, wherein a number of global input and output (I/O) lines is changed depending on a size of data which is processed by the PIM device during one operation.

3. The PIM device according to claim 1, wherein the calculation result output from the arithmetic circuit is stored in the data storage region.

4. The PIM device according to claim 3, wherein the calculation result stored in the data storage region is provided as vector data to be used in a next calculation.

5. The PIM device according to claim 1, wherein the data storage region, the global buffer and the arithmetic circuit are coupled through global input and output (I/O) lines.

6. The PIM device according to claim 1, wherein the calculation result is read from the arithmetic circuit and the calculation result read from the arithmetic circuit is written to the data storage region, based on a second single external command.

7. A method for operating a processing-in-memory (PIM) device, comprising:
receiving a vector write command from an external device with the PIM device;
reading vector data stored in a data storage region of the PIM device and writing the vector data to a global buffer of the PIM device, based on the vector write command received by the PIM device;
reading the vector data from the global buffer and reading the weight data from the data storage region; and
generating, with the PIM device, a calculation result by performing an arithmetic operation on the vector data read from the global buffer and the weight data read from the data storage region.

8. The method according to claim 7, further comprising:
before the reception of the vector write command, writing the vector data and the weight data, provided from the external device, to the data storage region of the PIM device.

9. The method according to claim 7, further comprising:
after the generation of the calculation result, reading the calculation result and writing the calculation result to the data storage region of the PIM device.

10. The method according to claim 9, further comprising:
before the reading of the calculation result, receiving with the PIM device a result read command from the external device.

11. The method according to claim 7, further comprising:
after the generation of the calculation result, outputting, with the PIM device, the calculation result to the external device; and
receiving, with the PIM device, the calculation result from the external device, and writing the calculation result to the data storage region of the PIM device.

12. The method according to claim 11, wherein the calculation result written to the data storage region is used as vector data for a next arithmetic operation.

13. The method according to claim 7, wherein, when a unit access size of the data storage region is smaller than a size of the vector data, the reading of the vector data stored in the data storage region and writing of the read vector data to the global buffer is repeatedly performed until the entire vector data is read from the data storage region and is written to the global buffer.

14. A processing-in-memory (PIM) device comprising:
a plurality of memory banks configured to output vector data and weight data based on a memory read access control signal;
a global buffer coupled to the plurality of memory banks, and configured to store the vector data output from the plurality of memory banks, based on a global buffer write signal;
a plurality of multiplication-accumulation (MAC) operators coupled one-to-one to the plurality of memory banks, coupled to the global buffer, and configured to each generate a calculation result by performing an arithmetic operation on vector data received from the global buffer and weight data received from each of the plurality of memory banks; and
a control circuit configured to generate the memory read access control signal and the global buffer write signal based on a vector write command.

15. The PIM device according to claim 14, wherein, after the vector data is output from the plurality of memory banks based on the memory read access control signal, the control circuit generates the global buffer write signal.

16. The PIM device according to claim 14, wherein
the plurality of memory banks generate a memory read timing signal when outputting the vector data based on the memory read access control signal, and
the control circuit generates the global buffer write signal based on the memory read timing signal.

17. The PIM device according to claim 14, wherein
the control circuit further receives a result write command, and further generates the memory read access control signal, a result write flag and a memory write access control signal based on the result write command, and
each of the plurality of MAC operators outputs the calculation result based on the memory read access control signal and the result write flag, and each of the plurality of memory banks stores the calculation result based on the memory write access control signal.

18. The PIM device according to claim 17, wherein the control circuit generates the memory write access control signal after the calculation result is output from each of the plurality of MAC operators based on the memory read access control signal and the result write flag.

19. The PIM device according to claim 18, wherein
each of the MAC operators generates a result read timing signal when outputting the calculation result based on the memory read access control signal and the result write flag, and
the control circuit generates the memory write access control signal based on the result read timing signal.

20. The PIM device according to claim 14, wherein the control circuit comprises:
a command decoder configured to generate a plurality of internal command signals by decoding an external command; and
a column control circuit configured to generate the memory read access control signal, a vector write flag and the global buffer write signal, based on a vector write signal among the plurality of internal command signals.

21. The PIM device according to claim 20, wherein the column control circuit comprises:
an internal signal generation circuit configured to generate an internal read signal, an internal write signal and the vector write flag, based on the vector write signal;
a delay circuit configured to generate the global buffer write signal by delaying the internal write signal based on the vector write flag; and
an access signal generation circuit configured to generate the memory read access control signal based on the internal read signal.

22. The PIM device according to claim 21, wherein the global buffer stores data transmitted through a global input and output (I/O) line when both the global buffer write signal and the vector write flag are enabled.

23. The PIM device according to claim 20, wherein the column control circuit comprises:
an internal signal generation circuit configured to generate an internal read signal and the vector write flag, based on the vector write signal;
a buffer write signal generation circuit configured to generate the global buffer write signal based on the vector write flag and the memory read timing signal; and
an access signal generation circuit configured to generate the memory read access control signal based on the internal read signal.

24. The PIM device according to claim 20, wherein the column control circuit further generates the memory read access control signal, the result write flag and the memory write access control signal based on a result write signal among the plurality of internal command signals.

25. The PIM device according to claim 24, wherein the column control circuit comprises:
an internal signal generation circuit configured to generate an internal read signal, an internal write signal and the vector write flag based on the vector write signal, and generate the internal read signal, the internal write signal and the result write flag based on the result write signal;
a first delay circuit configured to generate the global buffer write signal by delaying the internal write signal based on the vector write flag;
a second delay circuit configured to generate the memory write access control signal by delaying the internal read signal based on the result write flag; and
an access signal generation circuit configured to generate the memory read access control signal based on the internal read signal.

26. The PIM device according to claim 25, wherein
each of the plurality of MAC operators outputs the calculation result based on the memory read access control signal and the result write flag, and
each of the plurality of memory banks stores the calculation result based on the memory write access control signal.

27. The PIM device according to claim 24, wherein the column control circuit comprises:
an internal signal generation circuit configured to generate an internal read signal, an internal write signal and the vector write flag based on the vector write signal, and generate the internal read signal, the internal write signal and the result write flag based on the result write signal;
a buffer write signal generation circuit configured to generate the global buffer write signal based on the vector write flag and the memory read timing signal;
a memory write signal generation circuit configured to generate the memory write access control signal based on the result write flag and the result read timing signal; and
an access signal generation circuit configured to generate the memory read access control signal based on the internal read signal.

* * * * *